US010495966B2

(12) United States Patent
Nozawa et al.

(10) Patent No.: US 10,495,966 B2
(45) Date of Patent: Dec. 3, 2019

(54) MASK BLANK, PHASE-SHIFT MASK, AND METHOD OF MANUFACTURING SEMICONDUCTOR DEVICE

(71) Applicant: HOYA CORPORATION, Tokyo (JP)

(72) Inventors: Osamu Nozawa, Tokyo (JP); Hiroaki Shishido, Tokyo (JP); Kazuya Sakai, Tokyo (JP)

(73) Assignee: HOYA CORPORATION, Tokyo (JP)

(*) Notice: Subject to any disclaimer, the term of this patent is extended or adjusted under 35 U.S.C. 154(b) by 0 days.

(21) Appl. No.: 16/201,344

(22) Filed: Nov. 27, 2018

(65) Prior Publication Data

US 2019/0146327 A1 May 16, 2019

Related U.S. Application Data

(63) Continuation of application No. 15/454,199, filed on Mar. 9, 2017, now Pat. No. 10,180,622, which is a continuation of application No. 14/760,911, filed as application No. PCT/JP2014/050404 on Jan. 14, 2014, now Pat. No. 9,625,806.

(30) Foreign Application Priority Data

Jan. 15, 2013 (JP) .................................. 2013-004370
Mar. 8, 2013 (JP) .................................. 2013-046721
May 29, 2013 (JP) .................................. 2013-112549

(51) Int. Cl.
*G03F 1/32* (2012.01)
*G03F 1/26* (2012.01)
*G03F 7/20* (2006.01)
*H01L 21/027* (2006.01)
*G03F 1/54* (2012.01)

(52) U.S. Cl.
CPC .................. *G03F 1/32* (2013.01); *G03F 1/26* (2013.01); *G03F 7/2006* (2013.01); *H01L 21/0275* (2013.01); *G03F 1/54* (2013.01)

(58) Field of Classification Search
CPC ..... G03F 1/26; G03F 1/32; G03F 1/54; G03F 7/2006; H01L 21/0275
USPC .......................................................... 430/5
See application file for complete search history.

(56) References Cited

U.S. PATENT DOCUMENTS

| 5,477,058 | A | 12/1995 | Sato |
| 6,511,584 | B1 | 1/2003 | Szczyrbowski et al. |
| 7,556,892 | B2 | 7/2009 | Okada et al. |
| 7,771,893 | B2 | 8/2010 | Yoshikawa et al. |
| 8,546,047 | B2 | 10/2013 | Hosoya |
| 9,229,315 | B2 | 1/2016 | Hosoya |
| 2003/0064297 | A1 | 4/2003 | Shiota |
| 2004/0023125 | A1 | 2/2004 | Nozawa et al. |
| 2004/0159538 | A1 | 8/2004 | Becker et al. |
| 2004/0231971 | A1 | 11/2004 | Becker et al. |
| 2005/0244722 | A1 | 11/2005 | Okada et al. |
| 2007/0020534 | A1 | 1/2007 | Yoshikawa et al. |
| 2007/0212893 | A1 | 9/2007 | McTeer |
| 2011/0217633 | A1 | 9/2011 | Hosoya |
| 2012/0064438 | A1 | 3/2012 | Yoshikawa et al. |
| 2014/0011122 | A1 | 1/2014 | Hosoya |

FOREIGN PATENT DOCUMENTS

| JP | 8-211591 A | 8/1996 |
| JP | 8-220731 A | 8/1996 |
| JP | 10-30177 A | 2/1998 |
| JP | 11-15132 A | 1/1999 |
| JP | 2003-322951 A | 11/2003 |
| JP | 2004-62135 A | 2/2004 |
| JP | 2004-246366 A | 9/2004 |
| JP | 2005-284213 A | 10/2005 |
| JP | 2007-33469 A | 2/2007 |
| JP | 2007-94250 A | 4/2007 |
| JP | 2007-224322 A | 9/2007 |

(Continued)

OTHER PUBLICATIONS

International Search Report for PCT/JP2014/050404 dated Mar. 25, 2014.

(Continued)

*Primary Examiner* — Christopher G Young
(74) *Attorney, Agent, or Firm* — Kilpatrick Townsend & Stockton LLP

(57) ABSTRACT

Provided is a mask blank in which uniformity of the composition and optical characteristics of a phase-shift film in the in-plane direction and direction of film thickness is high, uniformity of the composition and optical characteristics of the phase-shift film between a plurality of substrates is also high, and defectivity is low even if a silicon-based material is applied to the material that forms the phase-shift film.

A mask blank is provided in which a phase-shift film is provided on a transparent substrate, the phase-shift film having a function to transmit ArF exposure light therethrough at a predetermined transmittance and generate a predetermined amount of phase shift in the ArF exposure light that is transmitted therethrough, wherein the phase-shift film comprises a structure in which a low transmission layer and a high transmission layer are laminated, the low transmission layer and the high transmission layer are formed from a material consisting of silicon and nitrogen or a material consisting of silicon, nitrogen and one or more elements selected from semi-metallic elements, non-metallic elements and noble gases, and the low transmission layer has a relatively low nitrogen content in comparison with the high transmission layer.

13 Claims, 7 Drawing Sheets

(56) References Cited

FOREIGN PATENT DOCUMENTS

| JP | 2009-529242 A | 8/2009 |
| JP | 2010-217514 A | 9/2010 |
| JP | 2012-58593 A | 3/2012 |
| JP | 2012-181549 A | 9/2012 |
| WO | 2010/074125 A1 | 7/2010 |

OTHER PUBLICATIONS

Communication dated Aug. 15, 2017 from the Japanese Patent Office in counterpart application No. 2016-174229.
Communication dated Nov. 8, 2017 from the Japanese Patent Office in counterpart application No. 2014-044684.

MASK BLANK, PHASE-SHIFT MASK, AND METHOD OF MANUFACTURING SEMICONDUCTOR DEVICE

CROSS REFERENCE TO RELATED APPLICATIONS

This is a Continuation of application Ser. No. 15/454,199 filed Mar. 9, 2017 which is a Continuation of application Ser. No. 14/760,911 filed Jul. 14, 2015, claiming priority based on International Application No. PCT/JP2014/050404 filed Jan. 14, 2014, claiming priority based on Japanese Patent Application Nos. 2013-004370 filed Jan. 15, 2013, 2013-046721 filed Mar. 8, 2013, and 2013-112549 filed May 29, 2013, the contents of all of which are incorporated herein by reference in their entirety.

TECHNICAL FIELD

The present invention relates to a mask blank, a phase-shift mask manufactured using that mask blank, and methods for manufacturing the same.

BACKGROUND ART

In general, the formation of a fine pattern in the manufacturing process of semiconductor devices is carried out using photolithography. In addition, multiple substrates referred to as transfer masks are normally used to form this fine pattern. In miniaturizing the pattern of a semiconductor device, it is necessary to use a short wavelength for the wavelength of the exposure light source used in photolithography in addition to miniaturizing the mask pattern formed on the transfer mask. In recent years, increasingly shorter wavelengths are being used as indicated by the transition from KrF excimer lasers (wavelength: 248 nm) to ArF excimer lasers (wavelength: 193 nm) for use as the exposure light source during the manufacturing of semiconductor devices.

Known types of transfer masks include conventional binary masks, provided with a light shielding pattern composed of a chromium-based material on a transparent substrate, and halftone phase-shift masks. Molybdenum silicide (MoSi)-based materials are widely used for the phase-shift film of halftone phase-shift masks. However, as disclosed in Patent Literature 1, MoSi-based films have recently been determined to exhibit low fastness to exposure light of an ArF excimer laser (so-called ArF light fastness). In Patent Literature 1, ArF light fastness is enhanced by carrying out plasma treatment, UV radiation treatment or heat treatment on an MoSi-based film following pattern formation, for forming a passive film on the surface of the MoSi-based film pattern.

Patent Literature 2 discloses a photo mask blank having a transition metal-silicon-based material film composed of a material containing a transition metal, silicon, oxygen and nitrogen. In this Patent Literature 2 as well, when exposure light of an ArF excimer laser (ArF exposure light) is radiated for a long period of time onto a transition metal-silicon-based material film having a pattern formed thereon, the technical problem arises in which a phenomenon occurs that causes a change in the pattern line width. On the other hand, Patent Literature 3 discloses a phase-shift mask provided with a phase-shift film composed of SiNx.

PRIOR ART LITERATURE

Patent Literature

Patent Literature 1: JP 2010-217514A
Patent Literature 2: JP 2012-58593A
Patent Literature 3: JP H8-220731A

DISCLOSURE OF THE INVENTION

Problems to be Solved by the Invention

The method used to improve ArF light fastness in which a passive film is formed on the surface of a pattern formed with an MoSi-based film in Patent Literature 1 does not change the internal structure of the MoSi-based film. In other words, ArF light fastness can be said to be equivalent to that of the prior art with respect to the interior of the MoSi-based film. Consequently, it is necessary to form a passive film not only on the surface layer of the upper surface of the MoSi-based film pattern, but also on the surface layers of the sidewalls. In Patent Literature 1, after having formed a pattern on the MoSi-based film, a passive film is formed by carrying out plasma treatment, UV radiation treatment or heat treatment. However, the pattern formed on the MoSi-based film has a large difference in in-plane coarseness and fineness and distances between side walls of adjacent patterns frequently differ greatly. Consequently, there was the problem that it is not easy to form passive films of the same thickness on the sidewalls of all patterns.

In the transition metal-silicon-based material film in Patent Literature 2, ArF light fastness is indicated as being able to be improved as a result of making the oxygen content in the film to be not less than 3 at %, making the content of silicon and the content of transition metal to be within a range that satisfies a predetermined relational expression, and employing a configuration in which an oxidized surface layer is provided on the surface layer of this transition metal-silicon-based material film. ArF light fastness can therefore be expected to be improved beyond that of conventional transition metal-silicon-based material films. There is a promising hypothesis that the change (increase) in line width in a pattern composed of a transition metal-silicon-based material film accompanying irradiation with an ArF excimer laser is caused by instability of the transition metal in the film during photoexcitation as a result of being irradiated by an ArF excimer laser. Consequently, the transition metal-silicon-based material film of Patent Literature 2 also had the problem that it is difficult to adequately resolve the problem of ArF light fastness as long as the film contains a transition metal.

In addition, it is essential that the transition metal-silicon-based material film in this Patent Literature 2 contains oxygen. The degree of the increase in transmittance with respect to ArF exposure light accompanying the containing of oxygen in the film is quite large in comparison with nitrogen. Consequently, there is the problem of being unable to avoid an increase in film thickness in comparison with a transition metal-silicon-based material film that does not contain oxygen (such as an MoSiN-based film).

On the other hand, in the case of a film composed of SiNx not containing a transition metal as described in Patent Literature 3, when that having a pattern formed on this SiNx film was attempted to be irradiated with an ArF excimer laser for a long period of time, the change (increase) in pattern width was extremely small in comparison with a transition metal-silicon-based material film, and this film was able to be confirmed to have high ArF light fastness through verification by the inventor of the present invention. However, it is not easy to apply this SiNx film to a halftone phase-shift film suitable for ArF exposure light.

Halftone phase-shift films (to also be simply referred to as "phase-shift films") are required to have a function to transmit ArF exposure light therethrough at a predetermined transmittance and generate a predetermined phase difference between the ArF exposure light that transmits through the phase-shift film and light that transmits through air over the same distance as the thickness of the phase-shift film. In the case of forming a single layer of a phase-shift film, it is required to use a material for which the refractive index n with respect to ArF excimer laser light is somewhat large and the extinction coefficient k is somewhat small. Although silicon is a material having a somewhat large extinction coefficient k with respect to ArF excimer laser light, refractive index n of silicon has a tendency to be quite small. Transition metals are materials that have a tendency for both the extinction coefficient k and the refractive index n to be large with respect to ArF exposure light. In addition, in the case oxygen is contained in a film material, the extinction coefficient k with respect to ArF exposure light decreases considerably and the refractive index n also demonstrates a decreasing trend. In the case of containing nitrogen in a film material, although the extinction coefficient k with respect to ArF exposure light decreases, the refractive index n demonstrates an increasing trend.

As a result of having the optical characteristics of each element as described above, in the case of forming a phase-shift film with a conventional transition metal-silicon-based material, since the phase-shift film contains a transition metal that is a material for which both refractive index n and extinction coefficient k are large, even if oxygen is contained to a certain degree or the content of nitrogen is reduced to a certain degree, a predetermined transmittance and phase difference can be secured. In contrast, in the case of forming a phase-shift film with a silicon-based material that does not contain a transition metal, since silicon is a material for which refractive index n is quite small, a larger amount of nitrogen, which is an element that increases refractive index, must be contained in comparison with a conventional transition metal-silicon-based material. In addition, since increasing the content of nitrogen causes the transmittance of the phase-shift film to change in an increasing direction, it is necessary to reduce the content of oxygen in the phase-shift film to an extremely low level. In this manner, there are more restrictions placed on the formation of a phase-shift film having a single layer structure with a silicon-based material in the manner of SiNx that does not contain a transition metal in comparison with the prior art.

In general, not only phase-shift films, but also thin films for forming a pattern on a mask blank, are formed using a sputtering method. In the case of forming a thin film on a transparent substrate by a sputtering method, conditions are normally selected that allow a film to be deposited comparatively stably. For example, in the case of depositing an SiNx film by sputtering, deposition is carried out by a process in which an Si target is arranged in a film deposition chamber, and Si particles, which have been scattered as a result of continuously circulating a mixed gas of nitrogen and a noble gas such as Ar while colliding the plasmified noble gas with the Si target, incorporate nitrogen at an intermediate point in the process and are deposited on a transparent substrate (this type of sputtering is typically referred to as "reactive sputtering"). The nitrogen content of the SiNx film can be adjusted mainly by increasing or decreasing the mixing ratio of nitrogen in the mixed gas, and as a result thereof, SiNx films having various nitrogen contents can be deposited on a transparent substrate.

However, there are cases in which stable deposition is possible and cases in which stable deposition is difficult depending on the mixing ratio of nitrogen in the mixed gas. For example, in the case of depositing an SiNx film by reactive sputtering, the SiNx film can be deposited comparatively stably in the case the nitrogen gas mixing ratio in the mixed gas is such that a stoichiometrically stable $Si_3N_4$ film, or film having a nitrogen content close thereto, is formed (a region having such deposition conditions is referred to as the "poison mode" or "reaction mode", see FIG. 4). In addition, the SiNx film can also be deposited comparatively stably in the case the nitrogen gas mixing ratio in the mixed gas is such that a film is formed that has a low nitrogen content (and a region having such deposition conditions is referred to as the "metal mode", see FIG. 4). On the other hand, deposition easily becomes unstable and uniformity of the composition and optical characteristics of the SiNx film in the in-plane direction and direction of film thickness decreases, or defects in the formed film occur frequently, in the case the nitrogen gas mixing ratio in the mixed gas is intermediate to this poison mode and metal mode (and a region having such deposition conditions is referred to as the "transition mode", see FIG. 4). In addition, uniformity of the composition and optical characteristics of the SiNx film between substrates also tends to decrease in the case of respectively depositing SiNx films on a plurality of transparent substrates. In the case of forming a phase-shift film to which ArF exposure light is applied with a single layer structure of SiNx, there was the problem that it is frequently necessary to deposit the film by reactive sputtering in a region of the transition mode where deposition easily becomes unstable.

Therefore, in order to solve the problems of the prior art, an object of the present invention is to provide a mask blank provided with a phase-shift film on a transparent substrate, wherein, even in the case of applying a silicon-based material that does not contain a transition metal, which causes a decrease in ArF light fastness, for the material used to form the phase-shift film, uniformity of the composition and optical properties of that phase-shift film in the in-plane direction and direction of film thickness is high, uniformity of the composition and optical characteristics of the phase-shift film between a plurality of substrates is also high, and defectivity is low. In addition, an object of the present invention is to provide a phase-shift mask manufactured using this mask blank. Moreover, an object of the present invention is to provide a method for manufacturing the mask blank and a method for manufacturing the phase-shift mask.

Means for Solving the Problems

The present invention has the configurations indicated below in order to achieve the aforementioned objects.

Configuration 1 of the present invention is a mask blank in which a phase-shift film is provided on a transparent substrate, the phase-shift film having a function to transmit ArF exposure light therethrough at a predetermined transmittance and a function to generate a predetermined amount of phase shift in the ArF exposure light that is transmitted therethrough; wherein, the phase-shift film comprises a structure in which a low transmission layer and a high transmission layer are laminated, the low transmission layer and the high transmission layer are formed from a material consisting of silicon and nitrogen or a material consisting of silicon, nitrogen and one or more elements selected from semi-metallic elements, non-metallic elements and noble gases, and the low transmission layer has a relatively low nitrogen content in comparison with the high transmission layer.

Configuration 2 of the present invention is as follows. Namely, Configuration 2 is the mask blank described in Configuration 1, wherein the low transmission layer and the high transmission layer are composed of the same constituent elements.

Configuration 3 of the present invention is as follows. Namely, Configuration 3 is the mask blank described in Configuration 1 or Configuration 2, wherein the phase-shift film has two or more sets of a laminated structure composed of one layer of the low transmission layer and one layer of the high transmission layer.

Configuration 4 of the present invention is as follows. Namely, Configuration 4 is the mask blank described in any of Configurations 1 to 3, wherein the low transmission layer and the high transmission layer are formed from a material consisting of silicon and nitrogen.

Configuration 5 of the present invention is as follows. Namely, Configuration 5 is the mask blank described in any of Configurations 1 to 4, wherein the low transmission layer is formed from a material having a refractive index n with respect to ArF exposure light of less than 2.5 and an extinction coefficient k with respect to ArF exposure light of not less than 1.0, and the high transmission layer is formed from a material having a refractive index n with respect to ArF exposure light of not less than 2.5 and an extinction coefficient k with respect to ArF exposure light of less than 1.0.

Configuration 6 of the present invention is as follows. Namely, Configuration 6 is the mask blank described in any of Configurations 1 to 5, wherein the thickness of a single layer of each of the low transmission layer and the high transmission layer is not more than 20 nm Configuration 7 of the present invention is as follows. Namely, Configuration 7 is the mask blank described in any of Configurations 1 to 6, wherein the phase-shift film is provided with an uppermost layer formed at a position farthest away from the transparent substrate, and the uppermost layer is formed from a material consisting of silicon, nitrogen and oxygen, or a material consisting of silicon, nitrogen, oxygen and one or more elements selected from semi-metallic elements, non-metallic elements and noble gases.

Configuration 8 of the present invention is as follows. Namely, Configuration 8 is the mask blank described in Configuration 7, wherein the uppermost layer is formed from a material consisting of silicon, nitrogen and oxygen.

Configuration 9 of the present invention is a phase-shift mask in which a transfer pattern is formed on the phase-shift film of the mask blank described in any of Configurations 1 to 8.

Configuration 10 is a method for manufacturing a mask blank provided with a phase-shift film on a transparent substrate, the phase-shift film having a function to transmit ArF exposure light therethrough at a predetermined transmittance and a function to generate a predetermined amount of phase shift in the ArF exposure light that is transmitted therethrough;

wherein the phase-shift film comprises a structure in which a low transmission layer and a high transmission layer are laminated, wherein the method comprises:

a low transmission layer formation step of forming the low transmission layer on or above the transparent substrate by reactive sputtering in a sputtering gas comprising a nitrogen-based gas and a noble gas using a silicon target or a target composed of a material consisting of silicon and one or more elements selected from semi-metallic elements and non-metallic elements, and a high transmission layer formation step of forming the high transmission layer on or above the transparent substrate by reactive sputtering in a sputtering gas comprising a nitrogen-based gas and a noble gas, and the sputtering gas having a higher mixing ratio of nitrogen-based gas than the mixing ratio of nitrogen-based gas in the sputtering gas for the low transmission layer formation step, using a silicon target or a target composed of a material consisting of silicon and one or more elements selected from semi-metallic elements and non-metallic elements.

Configuration 11 of the present invention is as follows. Namely, Configuration 11 is the method for manufacturing a mask blank described in Configuration 10, wherein a mixing ratio of nitrogen-based gas selected for the sputtering gas used in the low transmission layer formation step is lower than the range of nitrogen-based gas mixing ratios at which deposition is in a transition mode in which deposition has a tendency to become unstable, and a mixing ratio of nitrogen-based gas selected for the sputtering gas used in the high transmission layer formation step is higher than the range of nitrogen-based gas mixing ratios at which deposition is in the transition mode.

Configuration 12 of the present invention is as follows. Namely, Configuration 12 is the method for manufacturing a mask blank described in Configuration 10 or Configuration 11, wherein the low transmission layer formation step forms the low transmission layer by reactive sputtering in a sputtering gas consisting of nitrogen gas and a noble gas using a silicon target, and the high transmission layer formation step forms the high transmission layer by reactive sputtering in a sputtering gas consisting of nitrogen and a noble gas using a silicon target.

Configuration 13 of the present invention is as follows. Namely, Configuration 13 is the method for manufacturing a mask blank described in any of Configurations 10 to 12, wherein the low transmission layer is formed from a material having a refractive index n with respect to ArF exposure light of less than 2.5 and an extinction coefficient k with respect to ArF exposure light of not less than 1.0, and the high transmission layer is formed from a material having a refractive index n with respect to ArF exposure light of not less than 2.5 and the extinction coefficient k with respect to ArF exposure light of less than 1.0.

Configuration 14 of the present invention is the method for manufacturing a mask blank described in any of Configurations 10 to 13, further comprising an uppermost layer formation step of forming an uppermost layer, at a position of the phase-shift film farthest away from the transparent substrate, by reactive sputtering in a sputtering gas comprising a noble gas using a silicon target or a target composed of a material consisting of silicon and one or more elements selected from semi-metallic elements and non-metallic elements.

Configuration 15 of the present invention is the method for manufacturing a mask blank described in Configuration 12, further comprises an uppermost layer formation step of forming an uppermost layer, at a position of the phase-shift film farthest away from the transparent substrate, by reactive sputtering in a sputtering gas composed of nitrogen gas and a noble gas using a silicon target, and carrying out treatment in which at least the surface layer of the uppermost layer is oxidized.

Configuration 16 of the present invention is a method for manufacturing a phase-shift mask, comprising: a step of forming a transfer pattern in the phase-shift film of a mask blank manufactured according to the method for manufacturing a mask blank described in any of Configurations 10 to 15.

Effects of the Invention

The mask blank of the present invention is a mask blank provided with a phase-shift film on a transparent substrate, the phase-shift film having a function to transmit ArF exposure light therethrough at a predetermined transmittance and generate a predetermined amount of a phase shift in the ArF exposure light that is transmitted therethrough, wherein the phase-shift film comprises a structure in which a low transmission layer and a high transmission layer are laminated, the low transmission layer and the high transmission layer are formed from a material composed of silicon and nitrogen or a material consisting of silicon, nitrogen and one or more elements selected from semi-metallic elements, non-metallic elements and noble gases, and the low transmission layer has a relatively low nitrogen content in comparison with the high transmission layer. As a result of employing a mask blank having such a structure, a low transmission layer composed of a material having a low nitrogen content can be deposited by reactive sputtering under deposition conditions enabling stable deposition using a mixed gas having a low nitrogen gas mixing ratio for the sputtering gas, while a high transmission layer composed of a material having a high nitrogen content can be deposited by reactive sputtering under deposition conditions enabling stable deposition using a mixed gas having a high nitrogen gas mixing ratio for the sputtering gas. As a result, a mask substrate can be realized in which uniformity of the composition and optical characteristics of the phase-shift film in the in-plane direction and direction of film thickness can be made to be high, uniformity of the composition and optical characteristics of the phase-shift film between a plurality of substrates can also be made to be high, and defectivity can be made to be low.

In addition, the method for manufacturing a mask blank of the present invention is a method for manufacturing a mask blank provided with a phase-shift film on a transparent substrate, the phase-shift film having a function to transmit ArF exposure light therethrough at a predetermined transmittance and generate a predetermined amount of phase shift in the ArF exposure light that is transmitted therethrough, wherein the phase-shift film comprises a structure in which a low transmission layer and a high transmission layer are laminated, and the method comprises: a low transmission layer formation step of forming the low transmission layer on or above the transparent substrate by reactive sputtering in a sputtering gas comprising a nitrogen-based gas and a noble gas using a silicon target or a target composed of a material consisting one or more elements selected from semi-metallic elements and non-metallic elements in silicon, and a high transmission layer formation step of forming the high transmission layer on or above the transparent substrate by reactive sputtering in a sputtering gas comprising a nitrogen-based gas and a noble gas, and the sputtering gas having a higher mixing ratio of nitrogen-based gas than the mixing ratio of nitrogen-based gas in the sputtering gas for the low transmission layer formation step, using a silicon target or a target composed of a material consisting one or more elements selected from semi-metallic elements and non-metallic elements in silicon. As a result of employing this method for manufacturing a mask blank, a low transmission layer composed of a material having a low nitrogen content can be deposited by reactive sputtering under deposition conditions enabling stable deposition using a mixed gas having a low nitrogen-based gas mixing ratio for the sputtering gas, while a high transmission layer composed of a material having a high nitrogen content can be deposited by reactive sputtering under deposition conditions enabling stable deposition using a mixed gas having a high nitrogen-based gas mixing ratio for the sputtering gas. As a result, a mask blank can be manufactured in which uniformity of the composition and optical characteristics of the phase-shift film in the in-plane direction and direction of film thickness can be made to be high, uniformity of the composition and optical characteristics of the phase-shift film between a plurality of substrates can be made to be high, and defectivity can be made to be low.

EMBODIMENTS FOR CARRYING OUT THE INVENTION

First Embodiment

The following provides an explanation of a first embodiment of the present invention.

The inventors of the present invention conducted extensive studies on a means for realizing a film that exhibits high uniformity of composition and optical characteristics in the direction of film thickness and has low defectivity in the case of forming a phase-shift film with a silicon-based material film that contains silicon and nitrogen but does not contain a transition metal. At the present level of film deposition technology, it is necessary to apply a film deposition technology that employs reactive sputtering in order to form a silicon-based material film containing silicon and nitrogen but not containing a transition metal on a substrate in a state in which uniformity of composition and optical characteristics is high. However, typically in the case of depositing a thin film by reactive sputtering, a phenomenon occasionally occurs in which the thin film deposition rate and voltage fluctuate according to the mixing ratio of the reactive gas in the film deposition chamber.

Figure 4:
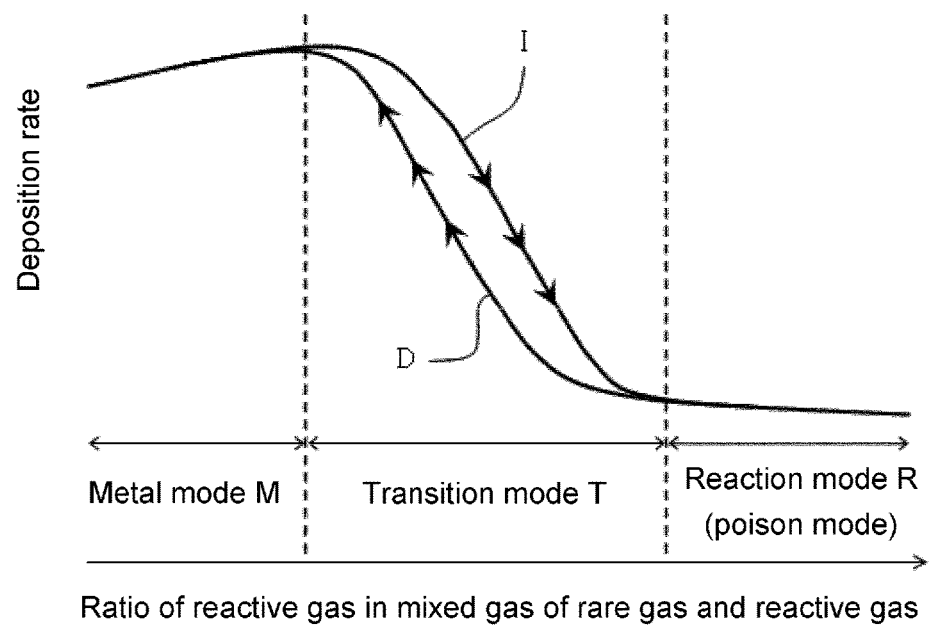
FIG. 4 is a schematic diagram for explaining deposition modes in the case of forming a thin film by reactive sputtering.

FIG. 4 is a graph schematically indicating typical trends with respect to changes in deposition rate that occur when the mixing ratio of a reactive gas in a mixed gas (or flow rate ratio of a reactive gas in a mixed gas) composed of a noble gas and a reactive gas in a deposition chamber has been changed in the case of depositing a thin film by reactive sputtering. FIG. 4 depicts a curve I of the change in film deposition rate in the case the mixing ratio of the reactive gas in the mixed gas has been increased gradually (increase mode), and a curve D of the change in film deposition rate in the case the mixing ratio of the reactive gas in the mixed gas has been decreased gradually (decrease mode). In general, in a region in which the mixing ratio of the reactive gas in the mixed gas is low (region of metal mode M in FIG. 4) and a region in which the mixing ratio of the reactive gas in the mixed gas is high (region of reaction mode R in FIG. 4), the size of the fluctuation in film deposition rate accompanying a change in the reactive gas mixing ratio in the mixed gas is small in both the increase mode and decrease mode. In addition, the difference in film deposition rate between the increase mode and decrease mode for the mixing ratio of the reactive gas in the same mixed gas is also small. Consequently, a thin film can be deposited stably in the region of the metal mode M and the region of the reaction mode R. Namely, the region of the metal mode M and the region of the reaction mode R can be said to be regions that allow the formation of a thin film that has high uniformity of composition and optical characteristics and has low defectivity.

On the other hand, in the region of a transition mode T interposed between the region of the metal mode M and the region of the reaction mode R, the size of the fluctuation in deposition rate accompanying a change in the reactive gas mixing ratio in the mixed gas is large in both the increase mode and decrease mode. In addition, the difference in deposition rate between the increase mode and decrease mode is also large for the reactive gas mixing ratio in the same mixed gas. In the region of the transition mode T, fluctuations in deposition rate attributable to a slight change in reactive gas mixing ratio in the mixed gas in the deposition chamber are large, and fluctuations in deposition rate caused by a shift from the increase mode to the decrease mode also occur due to slight changes in the mixing ratio. Consequently, thin films are formed in a state in which deposition rate is unstable. Fluctuations in deposition rate have an effect on the amounts of components of the reactive gas contained in the thin film. Namely, the region of the transition model T can be said to be a region in which it is difficult to form a thin film having high uniformity of composition and optical characteristics and low defectivity.

In the case of forming a phase-shift film having a single layer structure composed of a silicon-based material film not containing a transition metal by reactive sputtering, it is highly necessary to deposit the film in the region of the transition mode T due to restrictions on the required optical characteristics. There are also methods used to search for a combination of reactive gases for which the difference in deposition rate between the increase mode and decrease mode is small in the transition mode T for a reactive gas mixing ratio in the same mixed gas. However, even if such a combination of reactive gases was to be found, the problem of large fluctuations in deposition rate accompanying changes in the reactive gas mixing ratio in the mixed gas in the transition mode T is not solved.

In the case of forming a silicon-based material film containing silicon and nitrogen but not containing a transition metal by reactive sputtering in the region of the metal mode M, when film thickness is attempted to be secured for obtaining a required phase difference as a phase-shift film, since the extinction coefficient k of this film material formed is high, transmittance with respect to ArF exposure light ends up being lower than the required transmittance. In the case of such a film, it is difficult to generate phase-shift effects and the film is not suitable for a phase-shift film. On the other hand, in the case of forming a silicon-based material film containing silicon but not containing a transition metal by reactive sputtering in the region of the reaction mode, when film thickness is attempted to be secured to obtain a required phase difference as a phase-shift film, since the extinction coefficient k of the film material formed is low, transmittance with respect to ArF exposure light ends up being higher than the required transmittance. Although this type of film allows the obtaining of phase-shift effects, there is the risk of the resist film on the semiconductor wafer being sensitized by light transmitted from a portion of the pattern other than the region where phase-shift effects are generated, and this also makes this film unsuitable for a phase-shift film.

As a result of conducting extensive studies on a means for solving the numerous technical problems that occur in the realizing of a phase-shift film that is suitable for ArF exposure light with a silicon-based material film containing silicon and nitrogen but not containing a transition metal, the conclusion was reached that the aforementioned technical problems can be solved by using a phase-shift film having a structure obtained by laminating a low transmission layer, which is a silicon-based material film formed by reactive sputtering according to the region of the metal mode, and a high transmission layer, which is a silicon-based material film formed by reactive sputtering according to the region of the reaction mode.

Namely, the present invention is a mask blank provided with a phase-shift film on a transparent substrate, the phase-shift film having a function to transmit ArF exposure light therethrough at a predetermined transmittance and generate a predetermined amount of phase shift in the ArF exposure light that is transmitted therethrough. The mask blank of the present invention comprises the following characteristics. Namely, the phase-shift film comprises a structure in which a low transmission layer and a high transmission layer are laminated. In addition, the low transmission layer and the high transmission layer are formed from a material consisting of silicon and nitrogen or a material consisting of silicon, nitrogen and one or more elements selected from semi-metallic elements, non-metallic elements and noble gas. In addition, the low transmission layer has a relatively low nitrogen content in comparison with the high transmission layer.

In addition, the present invention is a method for manufacturing a mask blank provided with a phase-shift film on a transparent substrate, the phase-shift film having a function to transmit ArF exposure light therethrough at a predetermined transmittance and generate a predetermined amount of phase shift in the ArF exposure light that is transmitted therethrough. The aforementioned phase-shift film comprises a structure in which a low transmission layer and high transmission layer are laminated. The method for manufacturing a mask blank of the present invention comprises a low transmission layer formation step and a high transmission layer formation step. In the low transmission layer formation step, the low transmission layer is formed on or above the transparent substrate by reactive sputtering in a sputtering gas comprising a nitrogen-based gas and a noble gas using a silicon target or a target composed of a material consisting one or more elements selected from semi-metallic elements and non-metallic elements in silicon. In the high transmission layer formation step, the high transmission layer is formed on or above the transparent substrate by reactive sputtering in a sputtering gas comprising a nitrogen-based gas and a noble gas, and the sputtering gas having a higher mixing ratio of nitrogen-based gas than the mixing ratio of nitrogen-based gas in the sputtering gas for the low transmission layer formation step, using a silicon target or a target composed of a material consisting of one or more elements selected from semi-metallic elements and non-metallic elements in silicon.

In addition, in this method for manufacturing a mask blank, a nitrogen-based gas mixing ratio is preferably selected for the sputtering gas used in the low transmission layer formation step which is lower than the range of nitrogen-based gas mixing ratios at which deposition is in a transition mode in which deposition has a tendency to become unstable. In addition, a nitrogen-based gas mixing ratio is preferably selected for the sputtering gas used in the high transmission layer formation step which is higher than the range of nitrogen-based gas mixing ratios at which deposition is in the transition mode.

In the mask blank and method for manufacturing a mask blank of the present invention, the phase-shift film has a laminated structure consisting of a low transmission layer and a high transmission layer instead of a single layer structure. As a result of employing this laminated structure, the low transmission layer can be deposited by reactive sputtering according to the region of the metal mode where a film having a low nitrogen content tends to be formed, while the high transmission layer can be deposited by reactive sputtering according to the region of the reaction mode where a film having a high nitrogen content tends to be formed. As a result, both the low transmission layer and the high transmission layer can be deposited by reactive sputtering according to deposition conditions in which fluctuations in deposition rate and voltage during deposition are small, and as a result thereof, a phase-shift film can be formed in which uniformity of composition and optical characteristics is high and defectivity is low.

The low transmission layer and the high transmission layer are formed from a material consisting of silicon and nitrogen or a material consisting of silicon, nitrogen and one or more elements selected from semi-metallic elements, non-metallic elements and noble gas. The low transmission layer and the high transmission layer do not contain a transition metal that can cause a decrease in light fastness with respect to ArF exposure light. In addition, the low transmission layer and the high transmission layer preferably do not contain a metal element other than a transition metal. This is because the potential for metal elements other than transition metals to cause a decrease in light fastness with respect to ArF exposure light cannot be ruled out. The low transmission layer and the high transmission layer may also contain any semi-metallic element in addition to silicon. Among these semi-metallic elements, one or more elements selected from boron, germanium, antimony and tellurium are preferably contained. Electrical conductivity of the sputtering target can be expected to be enhanced by the addition of these elements to the sputtering target.

The low transmission layer and the high transmission layer may also contain any non-metallic element in addition to nitrogen. Among these non-metallic elements, one or more elements selected from carbon, fluorine and hydrogen are preferably contained. The content of oxygen in the low transmission layer and high transmission layer is preferably not more than 10 at %, more preferably not more than 5 at %, and is even more preferably such that as little oxygen is contained as possible (such that the result of RBS, XPS or other composition analyses is below the detection limit). If oxygen is contained in the silicon-based material film, the extinction coefficient k tends to decrease considerably and the overall thickness of the phase-shift film ends up becoming excessively thick. The transparent substrate is typically formed from a material such as synthetic quartz glass having $SiO_2$ as a main component thereof. In the case either the low transmission layer or the high transmission layer are formed in contact with the surface of the transparent substrate, the difference between the composition of the silicon-based material film comprising oxygen and the composition of the glass becomes small if the silicon-based material film comprises oxygen. Consequently, the problem arises in which it becomes difficult to obtain etching selectivity between the silicon-based material film and the transparent substrate during dry etching carried out when forming a pattern on the phase-shift film.

One or more elements selected from boron, germanium, antimony and tellurium are preferably contained as a semi-metallic element in a target composed of a material consisting one or more elements selected from semi-metallic elements and non-metallic elements in silicon. This is because these semi-metallic elements can be expected to enhance electrical conductivity of the target. In the case of forming the low transmission layer and high transmission layer by DC sputtering in particular, electrical conductivity of the target is preferably enhanced by containing these semi-metallic elements in the target.

The low transmission layer and the high transmission layer may also contain a noble gas. A noble gas is an element that is able to increase deposition rate and improve productivity by being present in the deposition chamber when depositing a thin film by reactive sputtering. Target constituent elements are scattered from the target as a result of the noble gas plasmifying and colliding with the target. The scattered target constituent elements incorporate reactive gas during the course of plasmification while being laminated on the transparent substrate to form a thin film. A slight amount of noble gas is incorporated in the deposition chamber during the time from scattering of target constituent elements from the target through adhesion to the transparent substrate. Preferable examples of noble gases required by this reactive sputtering include argon, krypton and xenon. In addition, helium or neon, having a low atomic weight, can be aggressively incorporated into the thin film in order to relax stress in the thin film.

In the low transmission layer formation step of forming the low transmission layer of a phase-shift film and the high transmission layer formation step of forming the high transmission layer, a nitrogen-based gas is contained in the sputtering gas. Any nitrogen-based gas can be applied for this nitrogen-based gas if it contains nitrogen. As was previously described, since it is preferable to reduce the oxygen content in the low transmission layer and high transmission layer to a low level, an oxygen-free nitrogen-based gas is applied preferably, and nitrogen gas ($N_2$ gas) is applied more preferably.

The present invention is a method for manufacturing a mask blank provided with a phase-shift film on a transparent substrate, the phase-shift film having a function to transmit ArF exposure light therethrough at a predetermined transmittance and generate a predetermined amount of phase shift in the ArF exposure light that is transmitted therethrough. The aforementioned phase-shift film comprises a structure in which a low transmission layer and a high transmission layer are laminated. The method for manufacturing a mask blank of the present invention comprises a low transmission layer formation step and a high transmission layer formation step. The low transmission layer formation step comprises the formation of the aforementioned low transmission layer on or above the transparent substrate by reactive sputtering in a sputtering gas comprising a nitrogen-based gas and a noble gas using a silicon target or a target composed of a material consisting one or more elements selected from semi-metallic elements and non-metallic elements in silicon. The high transmission layer formation step comprises the formation of the high transmission layer on or above the transparent substrate by reactive sputtering in a sputtering gas comprising a nitrogen-based gas and a noble gas, and having a higher mixing ratio of nitrogen-based gas than the aforementioned low transmission layer formation step, using a silicon target or a target composed of a material consisting one or more elements selected from semi-metallic elements and non-metallic elements in silicon.

The low transmission layer and the high transmission layer in the phase-shift film preferably have a structure in which they are laminated in mutual direct contact without interposing another film there between. In addition, the mask blank of the present invention preferably has a film structure in which a film composed of a material containing a metal element does not contact the low transmission layer or the high transmission layer. This is because, if heat treatment of irradiation with ArF exposure light is carried out in a state in which a film containing a metal element is in contact with the film containing silicon, the metal element tends to easily diffuse into the film containing silicon.

The low transmission layer and the high transmission layer are preferably composed of the same constituent elements. In the case either the low transmission layer or the high transmission layer comprises a different constituent element, and heat treatment or irradiation with ArF exposure light is carried out in a state in which they are laminated while making contact, there is the risk of the different constituent element migrating to and diffusing into a layer on a side not comprising the constituent element. There is then the risk of optical characteristics of the low transmission layer and high transmission layer varying considerably from those at the time of initial deposition. In addition, in the case the different constituent element is a semi-metallic element in particular, the low transmission layer and the high transmission layer must be deposited using different targets.

In the mask blank of the present invention, examples of the material of the transparent substrate include, in addition to synthetic quartz glass, quartz glass, aluminosilicate glass, soda lime glass and low thermal expansion glass (such as $SiO_2$—$TiO_2$ glass). Synthetic quartz glass demonstrates high transmittance with respect to ArF excimer laser light (wavelength: 193 nm) and is particularly preferable as a material used to form the transparent substrate of the mask blank.

The order in which the low transmission layer and the high transmission layer are laminated from the side of the transparent substrate in the phase-shift film may be any order. In the case of a phase-shift film structure in which the low transmission layer and the high transmission layer are laminated in that order in contact with the transparent substrate, there is the effect of more easily obtaining etching selectivity between the low transmission layer and the transparent substrate formed from a material having $SiO_2$ as the main component thereof since the low transmission layer is a silicon-containing film having a low nitrogen content. In addition, when a pattern is formed on a silicon-containing film by dry etching, although a fluorine-based gas is typically used for the etching gas used in dry etching, a chlorine-based gas can also be applied for the etching gas for a silicon-containing film having a low nitrogen content. Etching selectivity between the low transmission layer and the transparent substrate can be enhanced considerably by using a chlorine-based gas for dry etching the low transmission layer.

On the other hand, in the case of a phase-shift film structure in which the high transmission layer and the low transmission layer are laminated in that order in contact with the transparent substrate, the high transmission layer is a silicon-containing film having a high nitrogen content. Consequently, in the case the high transmission layer is formed in contact with the transparent substrate formed from a material having $SiO_2$ as a main component thereof, there is the effect of easily obtaining high adhesion between the surface of the transparent substrate and the high transmission layer.

The low transmission layer and the high transmission layer in the phase-shift film preferably have a structure in which they are laminated in mutual direct contact without interposing another film there between. This is because a silicon-containing film is preferably not in a state in which it is in contact with a film composed of a material containing metal elements for the reason previously described.

The phase-shift film preferably has two or more sets of a laminated structure composed of one layer of the low transmission layer and one layer of the high transmission layer. In addition, the thickness of a single layer of each of the low transmission layer and the high transmission layer is preferably not more than 20 nm. The difference in nitrogen content between films of the low transmission layer and high transmission layer is large since their respective required optical characteristics are different considerably. Consequently, there is a large difference in etching rates during dry etching with a fluorine-based gas between the low transmission layer and the high transmission layer. In the case the phase-shift film employs a bilayer structure composed of a single low transmission layer and a single high transmission layer, when forming a pattern by dry etching using a fluorine-based gas, level differences easily form in cross-sections of the pattern of the phase-shift film after etching. As a result of the phase-shift film employing a structure having two or more sets of a laminated structure consisting of a single low transmission layer and a single high transmission layer, the thickness of each layer (single layer) of the low transmission layer and the high transmission layer can be reduced in comparison with the case of the aforementioned bilayer structure (containing one set of the laminated structure). Consequently, level differences forming in cross-sections of the pattern of the phase-shift film after etching can be decreased. In addition, as a result of restricting the thickness of each layer (single layer) of the low transmission layer and high transmission layer not to be more than 20 nm, level differences forming in cross-sections of the pattern of the phase-shift film after etching can be further reduced.

In recent years, the correction of opaque defects, which occur during fabrication of transfer masks (phase-shift masks) by forming a transfer pattern on a mask blank thin film (phase-shift film) by dry etching, is increasingly being carried out by defect correction using electron beam radiation (EB defect correction). This EB defect correction is a technology in which thin films at portions containing opaque defects are removed by converting to a volatile fluoride by irradiating portions containing opaque defects with an electron beam while gasifying a substance such as $XeF_2$ in a non-excited state and supplying to those portions containing opaque defects. Since the $XeF_2$ or other fluorine-based gas used in this EB defect correction has conventionally been supplied in a non-excited state, a thin film at those portions not irradiated with the electron beam was thought to be resistant to those effects. However, it has been found that, in the case the thin film of the mask blank is formed with a silicon-based compound and the content of oxygen or nitrogen in the silicon-based compound is low, that thin film ends up being etched by a fluorine gas such as $XeF_2$ in a non-excited state.

The low transmission layer of the phase-shift film in the present invention is a silicon-based material film that has a low nitrogen content and does not include oxygen actively. Consequently, this low transmission layer tends to be easily etched by a fluorine-based gas such as $XeF_2$ in a non-excited state during EB defect correction. In order to avoid etching of the low transmission layer, the low transmission layer is preferably placed in a state that makes it difficult to contact the fluorine-based gas such as $XeF_2$ in a non-excited state. On the other hand, since the high transmission layer is formed with a silicon-based material having a high nitrogen content, it tends to be resistant to the effects of a fluorine-based gas such as $XeF_2$ in a non-excited state. As was previously described, as a result of employing a structure for the phase-shift film that has two or more sets of combinations of a laminated structure consisting of a low transmission layer and a high transmission layer, the low transmission layer is placed in a state in which it is either interposed between two high transmission layers or interposed between the transparent substrate and the high transmission layer. As a result, although there is a possibility of the low transmission layer initially being etched with a fluorine-based gas such as $XeF_2$ in a non-excited state in contact with a sidewall of the low transmission layer, it is subsequently difficult for the fluorine-based gas in a non-excited state to contact the low transmission layer (since it is difficult for gas to enter as a result of the surfaces of sidewalls of the low transmission layer being engaged by the surfaces of the sidewalls of the high transmission layer). Accordingly, as a result of adopting such a laminated structure, the low transmission layer can be inhibited from being etched by a fluorine-based gas such as $XeF_2$ in a non-excited state. In addition, by restricting the thickness of each layer of the low transmission layer and high transmission layer to be not more than 20 nm, the low transmission layer can be further inhibited from being etched by a fluorine-based gas such as $XeF_2$ in a non-excited state. Furthermore, the thickness of the low transmission layer is preferably made to be less than the thickness of the high transmission layer.

The low transmission layer and the high transmission layer are preferably formed from a material consisting of silicon and nitrogen. In the low transmission layer formation step of this method for manufacturing a mask blank, the low transmission layer is preferably formed by reactive sputtering in a sputtering gas composed of nitrogen and a noble gas using a silicon target. In addition, in the high transmission layer formation step, the high transmission layer is preferably formed by reactive sputtering in a sputtering gas composed of nitrogen and a noble gas using a silicon target.

As was previously described, containing a transition metal in the low transmission layer and high transmission layer can cause a decrease in light fastness with respect to ArF exposure light. In the case of containing a metal other than a transition metal or a semi-metallic element other than silicon in the low transmission layer and the high transmission layer, the metal or semi-metallic element contained has the potential to change the optical characteristics of the low transmission layer and the high transmission layer accompanying migration between the low transmission layer and the high transmission layer. In addition, transmittance with respect to ArF exposure light ends up decreasing considerably as a result of containing a non-metallic element in the low transmission layer and high transmission layer and further containing oxygen in the low transmission layer and high transmission layer. In consideration thereof, the low transmission layer and the high transmission layer are preferably formed from a material containing silicon and nitrogen. A noble gas is an element that is difficult to be detected even in the case of carrying out a composition analysis such as RBS or XPS on the thin film. Consequently, a material further containing a noble gas can be considered to be included in the aforementioned material containing silicon and nitrogen.

The low transmission layer is preferably formed from a material having a refractive index n with respect to ArF exposure light of less than 2.5 (preferably not more than 2.4, more preferably not more than 2.2 and even more preferably not more than 2.0) and the extinction coefficient k with respect to ArF exposure light of not less than 1.0 (preferably not less than 1.1, more preferably not less than 1.4 and even more preferably not less than 1.6). In addition, the high transmission layer is preferably formed from a material having a refractive index n with respect to ArF exposure light of not less than 2.5 (preferably not less than 2.6) and the extinction coefficient of less than 1.0 (preferably not more than 0.9, more preferably not more than 0.7 and even more preferably not more than 0.4). In the case of composing a phase-shift film with a laminated structure having two or more layers, the refractive indices n and extinction coefficients k of the low transmission layer and high transmission layer are required to each be within the aforementioned ranges. As a result, a phase-shift film composed with a laminated structure having two or more layers is able to demonstrate characteristics required for use as a phase-shift film, or in other words, demonstrate the characteristics of having a predetermined phase difference and a predetermined transmittance with respect to ArF exposure light.

The refractive index n and extinction coefficient k of a thin film are not only determined by the composition of that thin film. Film density and crystalline state of the thin film are also elements that have an effect on the refractive index n and extinction coefficient k. Consequently, a thin film is deposited so as to have a desired refractive index n and extinction coefficient k by adjusting various conditions when depositing the thin film by reactive sputtering. Although the ratio of a mixed gas of a noble gas and reactive gas can be adjusted when depositing the low transmission layer and the high transmission layer by reactive sputtering in order to make the refractive index n and the extinction coefficient k to be within the aforementioned ranges, adjustment is not limited thereto. There are a diverse range of deposition conditions that have an effect on refractive index n and extinction coefficient k, examples of which include pressure within the deposition chamber when depositing by reactive sputtering, electrical power applied to the target, and the positional relationship between the target and the transparent substrate such as the distance there between. In addition, it is necessary to optimize these deposition conditions corresponding to each individual deposition apparatus and make suitable adjustments so that the thin film formed demonstrates the desired refractive index n and extinction coefficient k.

The phase-shift film is preferably provided with an uppermost layer at a position farthest away from the transparent substrate, and the uppermost layer is formed from a material consisting of silicon, nitrogen and oxygen, or a material consisting of silicon, nitrogen, oxygen and one or more elements selected from semi-metallic elements, non-metallic elements and noble gases. In addition, this method for manufacturing a mask blank preferably has an uppermost layer formation step of forming an uppermost layer at a position of the phase-shift film farthest away from the transparent substrate by sputtering in a sputtering gas comprising a noble gas using a silicon target or a target composed of a material consisting one or more elements selected from semi-metallic elements and non-metallic elements in silicon. Moreover, this method for manufacturing a mask blank more preferably has an uppermost layer formation step of forming an uppermost layer at a position of the aforementioned phase-shift film farthest away from the transparent substrate by reactive sputtering in a sputtering gas composed of nitrogen gas and a noble gas using a silicon target, and carrying out treatment in which at least the surface layer of the aforementioned uppermost layer is oxidized.

Although a silicon-based material containing nitrogen while not containing oxygen actively demonstrates high light fastness with respect to ArF exposure light, chemical resistance tends to be low in comparison with a silicon-based material film containing oxygen actively. In addition, in the case of a mask blank having a configuration in which the uppermost layer is provided on the opposite side of the phase-shift film from the side of the transparent substrate, and a high transmission layer or low transmission layer that contains nitrogen but does not contain oxygen actively is arranged thereon, the surface layer of the phase-shift film is oxidized and it is difficult to avoid oxidation as a result of carrying out mask cleaning on a phase-shift mask fabricated from this mask blank and storing in air. Optical characteristics of a phase-shift film end up varying greatly from optical characteristics at the time of thin film deposition due to oxidation of the surface layer of the phase-shift film. In the case of a configuration in which a low transmission layer is provided as the uppermost layer of a phase-shift film in particular, the amount of the increase in transmittance ends up becoming large due to oxidation of the low transmission layer. Surface oxidation of the low transmission layer and high transmission layer can be inhibited by employing a structure in which the phase-shift film is further provided with an uppermost layer, formed from a material composed of silicon, nitrogen and oxygen or a material containing one or more elements selected from semi-metallic elements, non-metallic elements and noble gases in the material composed of silicon, nitrogen and oxygen, on a laminated structure consisting of a low transmission layer and high transmission layer.

An uppermost layer formed from a material composed of silicon, nitrogen and oxygen or a material containing one or more elements selected from semi-metallic elements, non-metallic elements and noble gases in the material composed of silicon, nitrogen and oxygen can have a configuration in which the composition is nearly the same in the direction of layer thickness or can have a configuration having a composition gradient in the direction of layer thickness (configuration in which the uppermost layer has a composition gradient in which layer oxygen content increases moving away from the transparent substrate). Examples of materials that are preferable for the uppermost layer with a configuration in which the composition is nearly the same in the direction of layer thickness include $SiO_2$ and SiON. The uppermost layer with a configuration in which there is a composition gradient in the direction of layer thickness is preferably that in which SiN is on the side of the transparent substrate, oxygen content increases moving away from the transparent substrate, and the surface layer is $SiO_2$ or SiON.

An uppermost layer formation step can be applied to form the uppermost layer in which the uppermost layer is formed by reactive sputtering in a sputtering gas comprising nitrogen gas, oxygen gas and noble gas using a silicon target or a target composed of a material consisting one or more elements selected from semi-metallic elements and non-metallic elements in silicon. This uppermost layer formation step can be applied to both the formation of an uppermost layer with a configuration in which the composition is nearly the same in the direction of layer thickness and the formation of an uppermost layer with a configuration having a composition gradient. In addition, an uppermost layer formation step can be applied to form an uppermost layer in which the uppermost layer is formed by sputtering in a sputtering gas comprising a noble gas using a silicon dioxide ($SiO_2$) target or a target composed of a material consisting one or more elements selected from semi-metallic elements and non-metallic elements in silicon dioxide ($SiO_2$). This uppermost layer formation step can also be applied to both the formation of an uppermost layer with a configuration in which the composition is nearly the same in the direction of layer thickness and the formation of an uppermost layer with a configuration having a composition gradient.

An uppermost layer formation step can be applied to form the uppermost layer in which the uppermost layer is formed by reactive sputtering in a sputtering gas comprising nitrogen gas and noble gas using a silicon target or a target composed of a material consisting one or more elements selected from semi-metallic elements and non-metallic elements in silicon, and treatment is further carried out in which at least the surface layer of this uppermost layer is oxidized. This uppermost layer formation step can be applied to the formation of the uppermost layer basically having a composition gradient in the direction of layer thickness. Examples of treatment used to oxidize the surface layer of the uppermost layer in this case include heat treatment in a gas such as air that contains oxygen and contacting ozone or oxygen plasma with the uppermost layer.

Although the low transmission layer, high transmission layer and uppermost layer in the phase-shift film are formed by sputtering, any type of sputtering, such as DC sputtering, RF sputtering or ion beam sputtering, can be applied. In the case of using a target having low electrical conductivity (such as a silicon target or silicon compound target that does not contain or only contains a small amount of a semi-metallic element), RF sputtering or ion beam sputtering is applied preferably. In consideration of deposition rate, RF sputtering is applied more preferably in the case of using a target having low electrical conductivity.

In each of the steps for forming the low transmission layer and high transmission layer of the phase-shift film by sputtering, sputtering can be applied both in the case of forming the low transmission layer and high transmission layer in the same deposition chamber and in the case of forming in different deposition chambers. In addition, in the case of forming the low transmission layer and the high transmission layer in the same deposition chamber, although there are cases in which the low transmission layer and high transmission layer are formed with the same target and cases in which they are formed with different targets, sputtering can be applied in either case. Furthermore, in the case of forming the low transmission layer and the high transmission layer in different deposition chambers, a configuration is preferably employed in which each deposition chamber is linked through different vacuum chambers. In this case, a load-lock chamber, through which a transparent substrate exposed to air passes when introduced into the vacuum chamber, is preferably linked to the vacuum chamber. In addition, a transport apparatus (robot hand) for transporting the transparent substrate is preferably provided between the load-lock chamber, vacuum chamber and each deposition chamber.

In order to allow the phase-shift effect thereof to function effectively, transmittance with respect to ArF exposure light of the phase-shift film in the mask blank of the present invention is preferably not less than 1% and more preferably not less than 2%. In addition, transmittance with respect to ArF exposure light of the phase-shift film is preferably adjusted to be not more than 30%, more preferably not more than 20% and even more preferably not more than 18%. In addition, in the phase-shift film, the phase difference generated between ArF exposure light that transmits through the phase-shift film and light that has transmitted through air over the same distance as the thickness of the phase-shift film is preferably adjusted to be within the range of 170 degrees to 190 degrees.

In the mask blank of the present invention, a light shielding film is preferably laminated on the phase-shift film. In general, the outer peripheral region of the region where a transfer pattern is formed in a transfer mask (transfer pattern formation region) is required to secure an optical density (OD) equal to or greater than a predetermined value. This is to prevent a resist film from being affected by exposure light that has transmitted through the outer peripheral region during exposure of the resist film on a semiconductor wafer using an exposure apparatus. This applies similarly in the case of a phase-shift mask. Normally, in the outer peripheral region of a transfer mask comprising a phase-shift mask, the OD thereof is preferably not less than 3.0 and required to be not less than at least 2.8. As was previously described, the phase-shift film has a function to transmit exposure light therethrough at a predetermined transmittance, and it is difficult to secure optical density equal to or greater than a predetermined value with a phase-shift film alone. Consequently, a light shielding film is preferably laminated on the phase-shift film at the stage of manufacturing the mask blank in order to compensate for the deficient optical density. As a result of employing this configuration for the mask blank, a phase-shift mask can be manufactured that secures a predetermined value of optical density for the outer peripheral region if the light shielding film of a region that uses phase-shift effects (basically the transfer pattern formation region) is removed at an intermediate point in the manufacturing of the phase-shift film.

The light shielding film can be applied to a single layer structure or a laminated structure having two layers or more. In addition, each layer of the light shielding film having a single layer structure or light shielding film having a laminated structure of two layers or more may have a configuration in which the composition is nearly the same in the direction of film or layer thickness or may have a configuration in which there is a composition gradient in the direction of layer thickness.

In the case of not interposing another film between the light shielding film and the phase-shift film, a material is required to be applied for the light shielding film that has adequate etching selectivity with respect to the etching gas used when forming a pattern on the phase-shift film. In this case, the light shielding film is preferably formed from a material containing chromium. Examples of materials containing chromium used to form this light shielding film include chromium metal as well as materials containing chromium and one or more elements selected from oxygen, nitrogen, carbon, boron and fluorine. In general, although chromium-based materials are etched with a mixed gas of a chlorine-based gas and oxygen gas, the etching rate of chromium metal with respect to this etching gas is not very high. In consideration of enhancing etching rate with respect to an etching gas consisting of a mixed gas of a chlorine-based gas and oxygen gas, a material containing chromium and one or more elements selected from oxygen, nitrogen, carbon, boron and fluorine is preferably used for the material used to form the light shielding film. In addition, one or more elements among molybdenum, indium and tin may also be contained in the material containing chromium used to form the light shielding film. Etching rate with respect to a mixed gas of a chlorine-based gas and oxygen gas can be further enhanced by containing one or more of the elements of molybdenum, indium and tin.

On the other hand, in the mask blank of the present invention, in the case of employing a configuration in which another film is interposed between the light shielding film and the phase-shift film, a configuration is preferably employed in which the other film (combination of etching stopper and etching mask film) is formed from a material containing the aforementioned chromium and the light shielding film is formed from a material containing silicon. Although materials containing chromium are etched by a mixed gas of a chlorine-based gas and oxygen gas, a resist film formed with an organic material is easily etched by this mixed gas. A material containing silicon is typically etched with a fluorine-based gas or chlorine-based gas. Since these etching gases basically do not contain oxygen, the etched amount of a resist film formed with an organic material can be reduced to a greater degree than in the case of etching with a mixed gas of a chlorine-based gas and oxygen gas. Consequently, film thickness of the resist film can be reduced.

A transition metal may be contained or a metallic element other than a transition metal may be contained in the material containing silicon that is used to form the light shielding film. This is because, in the case of fabricating a phase-shift mask from this mask blank, the cumulative amount irradiated with ArF exposure light is low in comparison with the transfer pattern formation region since the pattern in which the light shielding film is formed is basically a pattern of a light shielding band around the outer periphery, and because it is unlikely for any substantial problems to occur even if fastness to ArF light is low since this light shielding film rarely remains in a fine pattern. In addition, in the case a transition metal is contained in the light shielding film, light shielding performance of the light shielding film is greatly improved in comparison with the case of not containing a transition metal, thereby making it possible to reduce the thickness of the light shielding film. Examples of transition metals contained in the light shielding film include a metal such as molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb) and palladium (Pd), and alloys of these metals.

The light shielding film may be formed from a material that contains tantalum (Ta) and one or more elements selected from hafnium (Hf) and zirconium (Zr), but does not contain oxygen with the exception of the surface layer thereof. The light shielding film in this case can be dry etched with an etching gas that contains a chlorine-based gas but does not contain oxygen gas, and has etching selectivity with the material that forms the phase-shift film with respect to dry etching with an etching gas containing a fluorine-based gas.

When considering the aforementioned etching characteristics, the light shielding film is more preferably formed with a tantalum-hafnium alloy, tantalum-zirconium alloy, tantalum-hafnium-zirconium alloy or compound containing these alloys along with an element other than oxygen. Examples of elements other than oxygen contained in the light shielding film in this case include nitrogen (N), carbon (C), hydrogen (H), boron (B) and the like. In addition, the material of the light shielding film in this case may also comprise an inert gas such as helium (He), argon (Ar), krypton (Kr) or xenon (Xe). Furthermore, the material of the light shielding film in this case is a material that can be dry-etched with an etching gas that contains a chlorine-based gas but does not contain oxygen gas, and it is difficult for this etching gas to etch the phase-shift film.

In a mask blank provided with a light shielding film by laminating onto the aforementioned phase-shift film, a configuration is more preferably employed in which an etching mask film, which is formed from a material having etching selectivity with respect to the etching gas used when etching the light shielding film, is further laminated on the light shielding film. Since the light shielding film is required to have a function that secures a predetermined optical density, there are limitations on the degree to which the thickness thereof can be reduced. The etching mask film is only required to have a film thickness that enables it to function as an etching mask until completion of dry etching for forming a pattern in the light shielding film directly there below, and is basically not subject to any optical restrictions. Consequently, the thickness of the etching mask film can be greatly reduced in comparison with the thickness of the light shielding film. Since a resist film of an organic material is only required to have a film thickness that allows the resist film to function as an etching mask until completion of dry etching for forming a pattern in this etching mask film, the thickness of the resist film can also be greatly reduced in comparison with the prior art.

In the case the light shielding film is formed from a material containing chromium, the etching mask film is preferably formed with the aforementioned material containing silicon. Furthermore, since the etching mask film in this case tends to have low adhesion with the resist film of an organic material, surface adhesion is preferably improved by treating the surface of the etching mask film with hexamethyldisilazane (HMDS). Furthermore, the etching mask film in this case is preferably formed with, for example, $SiO_2$, SiN, SiON or the like. In addition to the previously described materials, a material containing tantalum can be applied for the material of the etching mask film in the case the light shielding film is formed from a material containing chromium. Examples of materials containing tantalum in this case include tantalum metal as well as materials containing tantalum and one or more elements selected from nitrogen, oxygen, boron and carbon. Examples of those materials include Ta, TaN, TaON, TaBN, TaBON, TaCN, TaCON, TaBCN and TaBOCN. On the other hand, in the case the light shielding film is formed from a material containing silicon, this etching mask film is preferably formed with the aforementioned materials containing chromium.

In the mask blank of the present invention, an etching stopper film composed of material having etching selectivity for both the transparent substrate and the phase shift-film (such as the aforementioned materials containing chromium, examples of which include Cr, CrN, CrC, CrO, CrON and CrC) may be formed between the transparent substrate and the phase-shift film.

In the mask blank of the present invention, a resist film of an organic material is preferably formed in contact with the surface of the aforementioned etching mask film at a film thickness of not more than 100 nm. In the case of a fine pattern corresponding to the DRAM hp32 nm generation, a sub-resolution assist feature (SRAF) having a line width of 40 nm may be provided on the transfer pattern (phase-shift pattern) to be formed on the etching mask film. However, in this case as well, since the cross-sectional aspect ratio of the resist pattern can be made to be low at 1:2.5, destruction or desorption of the resist pattern can be inhibited when developing or rinsing the resist film. Furthermore, the film thickness of the resist film is more preferably not more than 80 nm.

The phase-shift mask of the present invention is characterized in that a transfer pattern is formed on a phase-shift film of the aforementioned mask blank. In addition, the method for manufacturing a phase-shift mask of the present invention is characterized in that it has a step of forming a transfer pattern on a phase-shift film of a mask blank manufactured according to the aforementioned manufacturing method. The phase-shift mask of the present invention makes it possible to omit treatment for improving ArF light fastness after having formed a pattern on the phase-shift film since the material per se that composes the phase-shift film is a material having high light fastness with respect to ArF exposure light.

Figure 1:
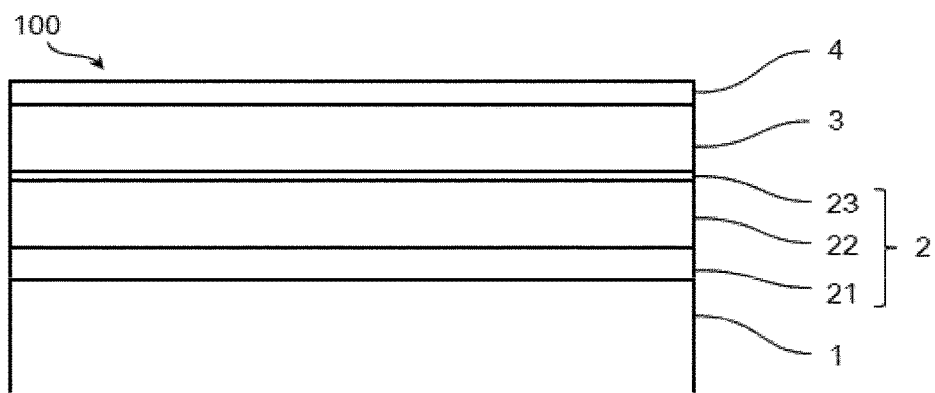
FIG. 1 is a cross-sectional view showing the configuration of a mask blank in a first and second embodiment.
Figure 2:
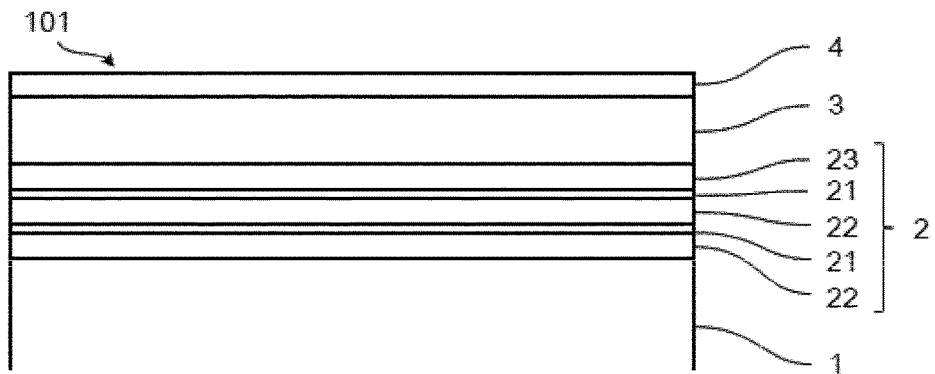
FIG. 2 is a cross-sectional view showing another configuration of a mask blank in a first and second embodiment.
Figure 3:
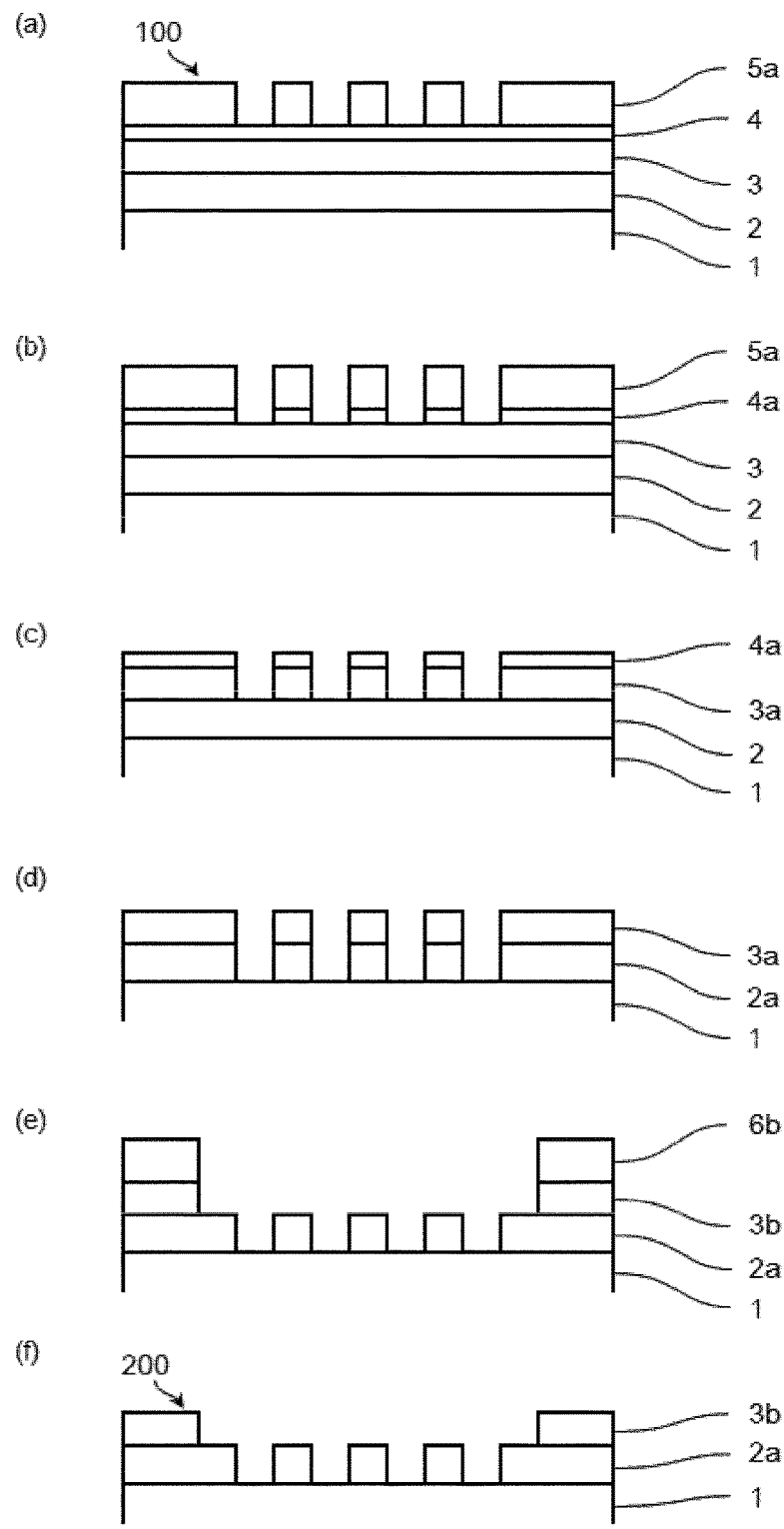
FIG. 3 is a cross-sectional view showing a process for manufacturing a transfer mask in a first embodiment and second embodiment.

FIG. 1 is a cross-sectional view showing the configuration of one embodiment of the present invention in the form of a mask blank 100. This mask blank 100 employs a configuration in which a phase-shift film 2, obtained by laminating a low transmission layer 21, a high transmission layer 22 and an uppermost layer 23 in that order, a light shielding film 3 and an etching mask film 4 are laminated on a transparent substrate 1. On the other hand, FIG. 2 is a cross-sectional view showing the configuration of another embodiment of the present invention in the form of a mask blank 101. This mask blank 101 employs a configuration in which a phase-shift film 2, obtained by laminating a high transmission layer 22, a low transmission layer 21, the high transmission layer 22, the low transmission layer 21 and an uppermost layer 23 in that order, a light shielding film 3 and an etching mask 4 are laminated on the transparent substrate 1. Details regarding each configuration of the mask blank 100 and the mask blank 101 are as previously described. The following provides an explanation of one example of the method for manufacturing a phase-shift mask of the present invention in accordance with the manufacturing process shown in FIG. 3. Furthermore, in this example, a material containing chromium is applied for the light shielding film, and a material containing silicon is applied for the etching mask film.

First, a resist film was formed in contact with the etching mask film 4 in the mask blank 100 by spin coating. Next, a transfer pattern to be formed on a phase-shift film (phase-shift pattern) in the form of a first pattern was exposed and drawn on the resist film followed by further carrying out a predetermined treatment such as development treatment to form a first resist pattern 5a having a phase-shift pattern (see FIG. 3(a)). Continuing, dry etching using a fluorine-based gas was carried out using the first resist pattern 5a as a mask to form a first pattern on the etching mask film 4 (etching mask pattern 4a) (see FIG. 3(b)).

Next, after removing the resist pattern 5a, dry etching using a mixed gas of a chlorine-based gas and oxygen gas was carried out using the etching mask pattern 4a as a mask to form the first pattern on the light shielding film 3 (light shielding film pattern 3a) (see FIG. 3(c)). Continuing, dry etching using a fluorine-based gas was carried out using the light shielding pattern 3a as a mask to form the first pattern on the phase-shift film 2 (phase-shift pattern 2a) while simultaneously removing the etching mask pattern 4a (see FIG. 3(d)).

Next, a resist film was formed on the mask blank 100 by spin coating. Next, a pattern to be formed on the light shielding film (light shielding pattern) in the form of a second pattern was exposed and developed on the resist film followed by further carrying out a predetermined treatment such as development treatment to form a second resist pattern 6b having a light shielding pattern. Continuing, dry etching using a mixed gas of a chlorine-based gas and oxygen gas was carried out using the second resist pattern 6b as a mask to form the second pattern on the light shielding film 3 (light shielding pattern 3b) (see FIG. 3(e)). Moreover, a phase-shift mask 200 was obtained by removing the second resist pattern 6b and going through predetermined treatment such as cleaning (see FIG. 3(f)).

There are no particular limitations on the aforementioned chlorine-based gas used in the dry etching if it comprises Cl. Examples of chlorine-based gases include $Cl_2$, $SiCl_2$, $CHCl_3$, $CH_2Cl_2$, $CCl_4$, $BCl_3$ and the like. In addition, there are no particular limitations on the aforementioned fluorine-based gas used in the dry etching if it comprises F. Examples of fluorine-based gases include $CHF_3$, $CF_4$, $C_2F_6$, $C_4F_8$, $SF_6$ and the like. Since fluorine-based gases not comprising C in particular have a comparatively low etching rate with respect to glass substrates, the damage to glass substrates can be further decreased.

The phase-shift mask of the present invention is able to suppress changes in CD (thickness) of a phase-shift pattern to within a small range even after having been cumulatively irradiated with exposure light of an ArF excimer laser. Consequently, even if this phase-shift mask after cumulative irradiation is placed on the mask stage of an exposure apparatus using an ArF excimer laser for exposure light, and a phase-shift pattern is exposed and transferred to a resist film on a semiconductor device, a pattern can be transferred to the resist film on the semiconductor device at a level of precision that adequately satisfies design specifications.

Moreover, the method for manufacturing a semiconductor device of the present invention is characterized in that a pattern is exposed and transferred to a resist film on a semiconductor substrate using the aforementioned phase-shift mask or a phase-shift mask manufactured using the aforementioned mask blank. Since the phase-shift mask and mask blank of the present invention have the previously described effects, even if the phase-shift mask of the present invention is placed on the mask stage of an exposure apparatus using an ArF excimer laser for exposure light after having been cumulatively irradiated with exposure light of an ArF excimer laser, and a phase-shift pattern is exposed and transferred to a resist film on a semiconductor device, a pattern can be transferred to the resist film on the semiconductor device at a level of precision that adequately satisfies design specifications. Consequently, in the case of forming a circuit pattern by dry etching a lower layer film using the pattern of this resist film as a mask, a highly precise circuit pattern can be formed that is free of wiring short-circuits and disconnections attributable to inadequate precision.

Second Embodiment

The following provides an explanation of a second embodiment of the present invention.

As was previously described, in the case of forming a thin film by reactive sputtering, two stable sputtering modes appear corresponding to the flow rate of the reactive gas. These two modes consist of a metal mode, in which the target surface is sputtered in the state of the target material, and a poison mode, in which the target surface is sputtered in a state in which it has reacted with the reactive gas. In comparison with the metal mode, the poison mode has a higher cathode voltage applied to the target and a slower deposition rate. Consequently, when the flow rate of reactive gas in the sputtering gas is increased or decreased, the cathode applied voltage and deposition rate change rapidly at a certain flow rate and an unstable transition occurs between the metal mode and the poison mode. Moreover, the value of the flow rate of the reactive gas when this transition occurs differs between when the flow rate increases (I in FIG. 4) and when it decreases (D in FIG. 4), and hysteresis (phenomenon in which the curve of flow rate when it is increasing does not coincide with the curve when it is decreasing) occurs when the relationship between reactive gas concentration and deposition rate are represented graphically (FIG. 4). If a film is deposited at a reactive gas flow rate that corresponds to the range of hysteresis, the voltage applied to the target and deposition rate become unstable, thereby preventing the formation of a film having stable physical properties.

As described in Patent Literature 3, in the case of depositing a film of a silicon compound on a substrate by reactive sputtering using a silicon target having silicon as the target material thereof, a film having a high ratio of silicon comprising the film composition is deposited when in the metal mode, and a film of a silicon compound in which the amount of silicon is close to the stoichiometric ratio is deposited when in the poison mode. For example, in the formation of a phase-shift film of a halftone phase-shift mask for use with an ArF excimer laser (wavelength $\lambda=193$ nm), in the case of depositing silicon nitride on a mask blank substrate, if the silicon nitride is deposited in the metal mode having a low flow rate of nitrogen gas for the reactive gas, a film is formed that has a large extinction coefficient (k). Consequently, a phase-shift film deposited in the metal mode substantially prevents the obtaining of interference effects and the like based on a phase difference since transmittance ends up being excessively low.

On the other hand, when a film is deposited in the poison mode having a high flow rate of nitrogen gas for the reactive gas, a film is formed on the substrate that has a low extinction coefficient (k). Consequently, a phase-shift film deposited in the poison mode is unable to obtain the required light fastness due to transmittance being excessively high. In order to obtain the function of a phase-shift mask, the phase-shift film is required to have an extinction coefficient (k) that is intermediate to that of a film deposited in the poison mode and a film deposited in the metal mode.

However, there is the problem or having to deposit the film at a gas flow rate in an unstable transition state in order to obtain such a film having an intermediate extinction coefficient (k).

In this second embodiment, an object is to provide a method for manufacturing a mask blank that is able to solve the aforementioned problem as well as problems to be subsequently described that occur in relation thereto. In addition, in this second embodiment, an object is to provide a method for manufacturing a mask blank that demonstrates high uniformity of composition and optical characteristics of a phase-shift film in the in-plane direction and direction of thickness, demonstrates high uniformity of composition and optical characteristics of the phase-shift film between a plurality of substrates, and has low defectivity in a mask blank provided with a phase-shift film on a transparent substrate even in the case of applying a silicon-based material not containing a transition metal for the phase-shift film. In addition, an object is to provide a method for manufacturing a phase-shift mask manufactured using a mask blank obtained according to this manufacturing method.

This invention of the second embodiment has the following configurations in order to achieve the aforementioned objects.

(Configuration 1A)

A method for manufacturing a mask blank having a step of forming a phase-shift film having a laminated structure on a transparent substrate by sputtering by introducing an inert gas and a reactive gas into a vacuum chamber, wherein the aforementioned step of forming a phase-shift film has:

a step of arranging two or more targets at least comprising silicon in the vacuum chamber and forming a low transmission layer by sputtering one of the aforementioned targets in a metal mode, and a step of forming a high transmission layer by sputtering the other of the aforementioned targets in a poison mode; and comprises a step of forming a phase-shift film having a laminated structure in which the low transmission layer and high transmission layer are laminated in any order by these steps.

(Configuration 2A)

The method for manufacturing a mask blank described in Configuration 1A, wherein the reactive gas is a gas in which the reactive gas introduced during formation of the low transmission layer and the reactive gas introduced during formation of the high transmission layer are the same type of gas.

(Configuration 3A)

The method for manufacturing a mask blank described in Configuration 1A or Configuration 2A, wherein the target material is silicon.

(Configuration 4A)

The method for manufacturing a mask blank described in any of Configurations 1A to 3A, wherein the reactive gas is nitrogen gas.

(Configuration 5A)

The method for manufacturing a mask blank described in any of Configurations 1A to 4A, wherein the low transmission layer is formed as a layer having a refractive index n with respect to exposure light of an ArF excimer laser of less than 2.4 and has an extinction coefficient k of not less than 1.0, and the high transmission layer is formed as a layer having a refractive index n with respect to exposure light of an ArF excimer laser of not less than 2.4 and has an extinction coefficient k of less than 1.0.

(Configuration 6A)

The method for manufacturing a mask blank described in any of Configurations 1A to 5A, wherein the laminated structure in which the low transmission layer and the high transmission layer are laminated in any order is formed by alternately laminating three or more layers of the low transmission layer and the high transmission layer.

(Configuration 7A)

The method for manufacturing a mask blank described in any of Configurations 1A to 6A, wherein the method for manufacturing a mask blank of the present invention comprises forming an oxidized layer on the surface of the phase-shift film having a laminated structure in which the low transmission layer and the high transmission layer are laminated in any order.

(Configuration 8A)

A method for manufacturing a phase-shift mask, comprising forming a transfer pattern in the phase-shift film of a mask blank manufactured using the method for manufacturing a mask blank of any of Configurations 1A to 7A.

According to the method for manufacturing a mask blank according to each of configuration of the aforementioned second embodiment, a mask blank can be manufactured in which uniformity of the composition and optical properties of a phase-shift film in the in-plane direction and direction of film thickness can be made to be high, uniformity of the composition and optical characteristics of the phase-shift film between a plurality of substrates can also be made to be high, and defectivity can be made to be low. In addition, a phase-shift mask having superior transferability can be obtained by manufacturing a phase-shift mask using a mask blank manufactured according to the method for manufacturing a mask blank in each configuration of the aforementioned second embodiment.

In each configuration of the aforementioned second embodiment, the "target material" is that which comprises silicon and there are no limitations on the presence or absence of other components. A material comprising silicone can be suitably selected and used for the target material used to deposit the phase-shift film of a halftone phase-shift mask. Examples of targets used for the phase-shift film include a silicon target and mixed targets comprising silicon. Examples of "mixed targets comprising silicon" as referred to here include mixed targets composed of silicon and a transition metal (such as silicon and molybdenum). Examples of transition metals present in mixed targets composed of silicon and a transition metal include molybdenum, tantalum, tungsten, titanium, hafnium, nickel, vanadium, zirconium, niobium, palladium, ruthenium, rhodium and chromium. A target that is preferably applied in the second embodiment is a silicon target or a mixed target comprising silicon, and a target that is more preferably applied is a silicon target.

Furthermore, in this second embodiment, "silicon" of the target material refers to that substantially composed of silicon. A silicon target in which the surface has undergone natural oxidation, a silicon target comprising impurity elements introduced during manufacturing of the target, and a silicon target comprising components such as elements added for the purpose of stabilization or improving sputtering efficiency and the like are included in the concept of a target containing "silicon" as a material thereof as referred to here. In addition, examples of elements added for the purpose of improving sputtering efficiency include boron, germanium, antimony and tellurium. Since a silicon target to which these elements have been added maintains a high level of electrical conductivity of the target surface during sputtering, they are used preferably in the case of depositing a film by DC sputtering.

In each configuration of the aforementioned second embodiment, the "two targets" may both contain silicon or may be targets in which the contents of silicon and the contents of other elements contained other than silicon may be different from each other. For example, a mixed target of a metal and silicon may be used for the target used in the metal mode, a silicon target may be used for the target used in the poison mode, and the targets may be arranged in a chamber. In addition, in the case of using silicon targets for the two targets, a substance that imparts electrical conductivity may be added only to the silicon target used in the poison mode.

In a film formed by sputtering these target materials, optical characteristics in the form of the extinction coefficient and refractive index of the film deposited in the metal mode and the film deposited in the poison mode are mutually different. For example, by preparing a plurality of targets composed of the same material, using the targets separately for the poison mode and the metal mode, and laminating films deposited in each mode in any order, a thin film having a laminated structure can be deposited that has desired optical characteristics.

In each configuration of the aforementioned second embodiment, the "reactive gas" may be a reactive gas typically used in reactive sputtering for depositing a film composed of a reaction product by reacting with a target material, and there are no limitations on the specific type of gas. Specific examples of reactive gases include nitrogen, oxygen, nitrogen oxide, methane and carbon dioxide.

In each configuration of the aforementioned second embodiment, examples of gases able to be used as an "inert gas" include noble gases such as helium, argon, krypton or xenon. Constituent elements are scattered from the target and react with the reactive gas by plasmifying the inert gas and causing it to collide with the target. The reaction product of the reactive gas and target constituent elements is deposited on a transparent substrate in the form of a thin film.

In each configuration of the aforementioned second embodiment, examples of the "transparent substrate" include, in addition to synthetic quartz glass, quartz glass, aluminosilicate glass, soda lime glass and low thermal expansion glass (such as $SiO_2$—$TiO_2$ glass). Synthetic quartz glass is particularly preferably as a material that forms the transparent substrate of a mask blank due to its high transmittance with respect to an ArF excimer laser (wavelength: 193 nm).

In each configuration of the aforementioned second embodiment, DC sputtering or RF sputtering can be applied for the "sputtering" method. In the case of using a silicon target or mixed target comprising silicon having low electrical conductivity, RF sputtering is applied preferably. RF sputtering is also applied preferably in the case of considering deposition rate.

The lamination order of the low transmission layer and high transmission layer of the phase-shift film from the side of the transparent substrate in each configuration of the aforementioned second embodiment is such that the layer that is more preferable based on correlation characteristics between the transparent substrate and the layer in contact therewith is formed as the layer on the side of the transparent substrate, and either layer may be formed first. For example, when the low transmission layer allows the obtaining of etching selectivity with a substrate to a greater degree than the high transmission layer, the low transmission layer is selected for use as the layer that contacts the substrate. In addition, in the case the high transmission layer demonstrates superior adhesion with the substrate in comparison with the low transmission layer, the high transmission layer can be selected for use as the layer that contacts the substrate.

One characteristic of each configuration of the aforementioned second embodiment is that at least two or more targets containing silicon are arranged in a row, and the targets are used separately as a target deposited with a film in the metal mode and a target deposited with a film in the poison mode. Accordingly, regardless of which of the low transmission layer and high transmission layer is deposited, sputtering occurs on only one of the targets. When voltage is applied to one of the targets, voltage is not applied to the other target.

In the case of using deposition in the metal mode and deposition in the poison mode with the same target, it is necessary to carefully condition the target prior to changing the physical properties (mode) of the target surface. However, target conditioning is a process that causes the generation of contaminants in the vacuum chamber. Contaminants are a cause of film defects. Specific examples of these contaminants include contaminants that precipitate on the target surface when the mode changes, and contaminants generated by mechanical operation of a shutter and the like that is used during conditioning. In consideration of these contaminants, the number of times the target is subjected to conditioning is preferably as low as possible in order to manufacture a mask blank having low defectivity.

According to each configuration of the aforementioned second embodiment, since a target deposited with a film in the metal mode and a target deposited with a film in the poison mode are used separately, frequent conditioning of the targets is not required accompanying a change in the mode. According to the second embodiment, the generation of contaminants as in the previously described example during formation of a phase-shift film can be effectively inhibited. Thus, a mask blank having low defectivity can be manufactured in which the number of defects attributable to contaminants is low.

In addition, one characteristic of the manufacturing method in each configuration of the aforementioned second embodiment is that the low transmission layer is deposited in the metal mode and the high transmission layer is deposited in the poison mode. Since reactive sputtering can be carried out stably when the target is in the poison mode and when the target is in the metal mode, uniformity of composition and optical characteristics in the in-plane direction and direction of thickness of the phase-shift film can be made to be high, and uniformity of composition and optical characteristics of the phase-shift film between a plurality of substrates can also be made to be high. Moreover, there is also the effect of increasing the degree of freedom of optical design of the phase-shift film by combining the layer deposited in the poison mode and the layer deposited in the metal mode and adjusting the thickness of each layer.

In the method for manufacturing a mask blank according to the aforementioned second embodiment, the aforementioned reactive gas is such that the reactive gas introduced during formation of the low transmission layer and the reactive gas introduced during formation of the high transmission layer are preferably the same type of gas. Namely, the aforementioned reactive gas is preferably the same type of gas when forming the low transmission layer and when forming the high transmission layer.

In the case the type of reactive gas is the same in the case of depositing a film in the poison mode and the case of depositing a film in the metal mode, constituent elements of the high transmission layer obtained in the poison mode and constituent elements of the low transmission layer obtained in the metal mode are the same. Thus, side reactions such as exchange reactions occurring at the interface between the high transmission layer and low transmission layer do not become complex. Consequently, even in the case of a film having a laminated structure, the overall composition of the film is kept uniform and unexpected changes in phase-shift function are unlikely to occur. Furthermore, in the present configuration, only the reactive gas introduced when forming the low transmission layer in the metal mode and the reactive gas introduced when forming the high transmission layer in the poison mode are required to be the same type of gas, while the flow rates and partial pressures of the reactive gases introduced as well as the pressure inside the vacuum chamber may not be the same.

In the method for manufacturing a mask blank according to the aforementioned second embodiment, a configuration is preferably employed in which the material of the aforementioned target is silicon. Namely, the aforementioned target is preferably a silicon target. According to the present configuration, the resulting phase-shift film having a laminated structure is composed of a reaction product of silicon and the reactive gas and does not comprise a transition metal and the like. A phase-shift portion obtained from a phase-shift film deposited in such a configuration is resistant to changes in pattern dimensions even if irradiated for a long period of time with exposure light of a short wavelength, and more specifically, exposure light of an ArF excimer laser having a wavelength of 193 nm.

In the method for manufacturing a mask blank according to the aforementioned second embodiment, the aforementioned reactive gas is preferably nitrogen gas. "Nitrogen gas" as referred to here refers to a gas that enables a layer substantially in the form of a nitride to be formed by reactive sputtering. More specifically, the "nitrogen gas" referred to here is preferably a gas in which the content of nitrogen ($N_2$) that comprises the reactive gas is not less than 90 vol %, and preferably not less than 99 vol %.

An oxide, nitride or oxynitride and the like is selected in the case of forming a phase-shift film having optical semi-transparency with respect to exposure light of an ArF excimer laser. Although an oxide, nitride or oxynitride and the like is also selected in the case of a silicon-based phase-shift film, refractive index (n) tends to become low when an oxide or oxynitride is selected. Consequently, in the case oxygen comprises the composition of a silicon-based phase-shift film, it becomes necessary to increase thickness when forming the phase-shift film. In addition, in the case of having deposited a silicon-based phase-shift film comprised of oxygen on a transparent substrate composed of synthetic quartz glass, there is the problem of it being difficult to obtain etching selectivity between the silicon-based phase-shift film and the substrate during dry etching carried out when forming a mask pattern. According to the present configuration, a mask blank can be manufactured that is provided with a phase-shift film that has superior optical characteristics as well as superior etching selectivity with a transparent substrate composed of quartz glass.

In the method for manufacturing a mask blank according to the aforementioned second embodiment, the aforementioned low transmission layer is preferably deposited in a layer having the refractive index (n) with respect to exposure light of an ArF excimer laser of less than 2.4 and the extinction coefficient (k) of not less than 1.0, while the high transmission layer is preferably formed (deposited) in a layer having the refractive index (n) with respect to exposure light of an ArF excimer laser of not less than 2.4 and the extinction coefficient (k) with respect to exposure light of an ArF excimer laser of less than 1.0. A phase-shift film having desired optical characteristics can be deposited by laminating layers in which the refractive index (n) and extinction coefficient (k) of the low transmission layer and high transmission layer are adjusted to within the aforementioned ranges.

The refractive index (n) of the low transmission layer is preferably not more than 2.3, more preferably not more than 2.2 and even more preferably not more than 2.0. The extinction coefficient (k) of the low transmission layer is preferably not less than 1.1, more preferably not less than 1.4 and even more preferably not less than 1.6. In addition, the refractive index (n) of the high transmission layer is preferably not less than 2.5. The extinction coefficient (k) of the high transmission layer is preferably not more than 0.9, more preferably not more than 0.7 and even more preferably not more than 0.4. Furthermore, the refractive index (n) and extinction coefficient (k) of a thin film are not determined by the composition of the thin film alone, but rather vary according to the film density and crystalline state thereof. Consequently, a thin film is preferably deposited by adjusting the various conditions when depositing the thin film by reactive sputtering so that the thin film has a desired refractive index (n) and extinction coefficient (k).

In the method for manufacturing a mask blank according to the aforementioned second embodiment, the aforementioned laminated structure in which the low transmission layer and high transmission layer are laminated in any order is preferably a structure in which three or more layers of the low transmission layer and high transmission layer are alternately laminated. Even if the elements that compose each layer of the low transmission layer and high transmission layer are the same, the composition ratios thereof are different from each other. Even if films are deposited with the same elements, if the composition ratios are different from each other, the etching rates during dry etching are different from each other. For example, in the case of forming a pattern by dry etching with a fluorine-based gas, a level difference occurs in the wall surfaces of the pattern when layers having different etching rates are laminated. Reducing the thickness of the laminated layers is effective for inhibiting this phenomenon. According to the present configuration, since the film thickness of layers composing a phase-shift film can be decreased (to, for example, not more than 20 nm), the aforementioned level difference attributable to differences in the etching rate or each layer can be reduced.

In the method for manufacturing a mask blank according to the aforementioned second embodiment, an oxidized layer is preferably formed on the surface of a phase-shift film having a laminated structure in which the aforementioned low transmission layer and the aforementioned high transmission layer are laminated in any order. The formation of an oxidized layer as referred to here refers to, for example, a configuration in which an oxidized layer is formed by carrying out oxidation treatment after having deposited the phase-shift film having a laminated structure, in which the low transmission layer and the high transmission layer are laminated in any order by sputtering, and a configuration in which a thin film of silicon oxide, for example, is separately formed on the surface of the phase-shift film having a laminated structure in which the low transmission layer and the high transmission layer are laminated in any order. Examples of methods used to carry out oxidation treatment on the surface include a method in which the surface of the phase-shift film is heated in air or an oxygen atmosphere, and a method in which ozone or oxygen plasma is contacted with the surface of the phase-shift film. An example of a method used to separately form an oxidized layer on the surface of the aforementioned phase-shift film having a laminated structure is sputtering deposition using silicon dioxide for the target.

In a substrate on which the surface of a thin film that has not been oxidized is exposed, the surface layer is easily oxidized by cleaning and storing in air. In the case of a phase-shift film, optical characteristics of the thin film during deposition end up changing greatly due to oxidization of the surface. In the case of a configuration in which the low transmission layer is provided for the uppermost layer of a phase-shift film in particular, the amount of the increase in transmittance caused by oxidization of the low transmission layer is thought to become large. Oxidization of the surface of the low transmission layer and high transmission layer can be inhibited by forming an oxide layer, which does not have an effect on optical characteristics of the phase-shift film, on (the surface of) a laminated structure of the low transmission layer and high transmission layer (laminated in any order).

The following provides a list of preferred modes of the method for manufacturing a mask blank and the method for manufacturing a phase-shift mask described in examples according to the aforementioned second embodiment.

(Mode 1)

The mask blank is provided with a phase-shift film having a function that causes a predetermined amount of phase shift to be generated with respect to exposure light of an ArF excimer laser. In addition, the transparent substrate is a synthetic quartz glass substrate.

(Mode 2)

The layer of the phase-shift film that contacts the transparent substrate is a silicon nitride layer (low transmission layer) sputtered in the metal mode. Although the synthetic quartz glass substrate is dry-etched with the same etching gas as that of the silicon nitride layer, since the silicon nitride layer deposited in the metal mode and having a low silicon content has different etching characteristics from those of synthetic quartz glass, it has excellent etching selectivity.

(Mode 3)

The layer of the phase-shift film that contacts the transparent substrate is a high transmission layer composed of silicon nitride sputtered in the poison mode. In the case of forming a nitride film or oxide film on a synthetic quartz substrate by reactive sputtering, a film having a high degree of nitridization or high degree of oxidation has the characteristic of superior adhesion. Adhesion between the phase-shift film and transparent substrate improves as a result of using a silicon nitride layer (high transmission layer), having a high degree of nitridization and deposited in the poison mode, for the layer that contacts the substrate.

(Mode 4)

Silicon nitride films having different degrees of nitridization for each target are formed for the low transmission layer and high transmission layer. The degree of nitridization of the silicon nitride layer (high transmission layer) is relatively larger than the degree of nitridization of the silicon nitride layer (low transmission layer). The degree of nitridization of (high transmission layer) silicon nitride layer includes the case in which the nitrogen content is greater than 50 at % and the remainder is silicon. The degree of nitridization of the silicon nitride (low transmission layer) layer includes the case in which the nitrogen content is less than 50 at % and the remainder is silicon.

(Mode 5)

The sputtering apparatus used when forming the phase-shift film is an RF sputtering apparatus. In the case of DC sputtering, although varying according to the type of target, when reactive sputtering is carried out in the poison mode, electrical conductivity of the target surface portion becomes poor and it becomes difficult to apply a voltage. Consequently, discharge becomes unstable and the high transmission layer is not formed stably. In addition, ion beam sputtering has the problem of a slow deposition rate. According to RF sputtering, the phase-shift film can be deposited stably at a comparatively rapid deposition rate even in the case of a silicon target in which there is a significant decrease in electrical conductivity of the target surface in the case of depositing in the poison mode.

(Mode 6)

The conditions of the sputtering gas when depositing in the metal mode and poison mode are such that flow rate ratio and other deposition conditions are selected that enable stable deposition in both the metal mode and poison mode by preliminarily verifying the relationship between deposition rate and the flow rate ratio between the inert gas and reactive gas in the sputtering gas with the single-wafer RF sputtering apparatus used.

(Mode 7)

Transmittance of the phase-shift film of the phase-shift mask blank with respect to exposure light of an ArF excimer laser is adjusted to be within the range of 1% to 30%. In addition, in the phase-shift film, the phase difference generated between exposure light of an ArF excimer laser that has transmitted through the phase-shift film and light that has transmitted through air over the same distance as the thickness of the phase-shift film is adjusted to be within the range of 170 degrees to 190 degrees. A phase-shift mask having superior transfer precision can be manufactured by manufacturing a mask blank in which transmittance and phase difference of the phase-shift film have been adjusted so as to be within the aforementioned ranges.

(Mode 8)

The phase-shift film has two or more sets of a laminated structure consisting of a low transmission layer and a high transmission layer. The thickness of each layer is not more than 30 nm. As was previously described, the composition ratios of elements composing the low transmission layer and high transmission layer are different from each other and the difference in etching rates during dry etching is large. Consequently, when a mask pattern is formed by carrying out isotropic dry etching with a fluorine-based gas and the like, a level difference is formed in the pattern sidewalls. As a result of limiting the thickness of each layer of the low transmission layer and high transmission layer to not more than 30 nm, and preferably not more than 20 nm, level differences occurring in the sidewalls of the pattern of the phase-shift film after etching can be more effectively inhibited.

(Mode 9)

A light shielding film is formed on the phase-shift film during manufacturing of a mask blank. In a transfer mask, an optical density (OD) of a predetermined value or higher is required to be secured for the outer peripheral region of the region where the transfer pattern is formed (transfer pattern formation region). This is to prevent the resist film from being affected by exposure light that has transmitted through the outer peripheral region when exposing and transferring to the resist film on a semiconductor wafer using an exposure apparatus. This applies similarly to the case of a phase-shift mask. Normally, in the outer peripheral region of a transfer mask comprising a phase-shift mask, the OD thereof is preferably not less than 3.0 and required to be not less than at least 2.8. As was previously described, the phase-shift film has a function to transmit exposure light therethrough at a predetermined transmittance, and it is difficult to secure optical density of a predetermined value with a phase-shift film alone. Consequently, a light shielding film is preferably laminated on the phase-shift film at the stage of manufacturing the mask blank in order to compensate for the deficient optical density. As a result of employing this configuration for the mask blank, a phase-shift mask can be manufactured that secures a predetermined value of optical density for the outer peripheral region if the light shielding film of a region that uses phase-shift effects (basically the transfer pattern formation region) is removed at an intermediate point in the manufacturing of the phase-shift film. Furthermore, a single layer structure or a laminated structure having two or more layers can be applied for the light shielding film.

(Mode 10)

The light shielding film is formed from a material containing chromium that has selectivity with respect to the etching gas used when forming a pattern in the phase-shift film. Examples of materials containing chromium that form this light shielding film include, in addition to chromium metal, materials containing chromium and one or more elements selected from oxygen, nitrogen, carbon, boron and fluorine. In general, although chromium-based materials are etched with a mixed gas of a chlorine-based gas and oxygen gas, the etching rate of chromium metal with respect to this etching gas is not very high. When considering enhancing the etching rate with respect to a mixed gas of a chlorine-based gas and oxygen gas, a material containing chromium and one or more elements selected from oxygen, nitrogen, carbon, boron and fluorine is preferable for the material that forms the light shielding film. In addition, the material containing chromium that forms the light shielding film may also contain one or more elements selected from tin, indium and molybdenum.

(Mode 11)

In the manufacturing of a mask blank, an etching mask is formed on the light shielding film. Here, an "etching mask" refers to a thin film formed from a material having etching selectivity with respect to the etching gas used when etching the light shielding film. Since the light shielding film is required to have a function that secures a predetermined optical density, there are limitations on the degree to which the thickness thereof can be reduced. The etching mask film is only required to have a film thickness that enables it to function as an etching mask until completion of dry etching for forming a pattern in the light shielding film directly there below, and is basically not subject to any restrictions on optical characteristics. Consequently, the thickness of the etching mask film can be greatly reduced in comparison with the thickness of the light shielding film. Since a resist film of an organic material to be subsequently described is only required to have a film thickness that allows it to function as an etching mask until completion of dry etching for forming a pattern in this etching mask film, the thickness of the resist film can also be greatly reduced in comparison with the prior art.

An example of the material of the etching mask in the case of forming the light shielding film with a material containing chromium is a silicon-based material. An explanation of the silicon-based material will be subsequently provided. Furthermore, in the case the light shielding film is formed from a material containing chromium, a material containing tantalum can also be applied. Examples of materials containing tantalum in this case include tantalum metal and materials containing tantalum and one or more elements selected from nitrogen, oxygen, boron, silicon and carbon. Examples thereof include Ta, TaN, TaON, TaBN, TaBON, TaCN, TaCON, TaBCN, TaBOCN, TaSi, TaSiN and TaSiON. In addition, in the case the light shielding film is formed from a material containing silicon, the etching mask film is preferably formed from a material containing chromium. Furthermore, other matters relating to the light shielding film (including matters relating to a laminated structure with the phase-shift film) are the same as those of the light shielding film according to the previously described first embodiment.

(Mode 12)

Other matters relating to the etching mask film are the same as those of the etching mask film according to the previously described first embodiment.

(Mode 13)

A resist film of an organic material is formed on the surface of the aforementioned etching mask. Other matters relating to the resist film are the same as those of the resist film according to the previously described first embodiment.

Third Embodiment

The following provides an explanation of a third embodiment of the present invention.

During typical manufacturing of a mask blank, a thin film in the manner of a phase-shift film is deposited on a main surface of a transparent substrate by a single-wafer sputtering apparatus. In a mask blank and phase-shift mask having a phase-shift film on a transparent substrate in particular, it is important that uniformity of the transmittance and amount of phase shift of the phase-shift film is maintained within the plane of the transparent substrate. Consequently, as disclosed in JP 2002-90978A, in the deposition of a phase-shift film on a main surface of a transparent substrate, deposition is carried out by applying oblique incidence rotary sputtering in which the sputtered surface of a sputtering target is inclined and arranged in opposition to a main surface of a rotated transparent substrate.

However, when manufacturing the aforementioned mask blank, even if microscopic scratches (defects) are present on a main surface of the transparent substrate, if the position of a defective portion significantly impairs formation of a transfer pattern, there are cases in which the transparent substrate may be judged to be usable and a mask blank may be fabricated by depositing a thin film. This is because, if information relating to the planar coordinates and type of defect (convex defect or concave defect) in the transparent substrate are transferred attached to a corresponding mask blank, the thin film can be adjusted to a position where the defective portion does not have an effect on exposure and transfer when forming a transfer pattern on the thin film.

However, in the deposition of a phase-shift film by applying the previously described oblique incidence rotary sputtering, if a microscopic concave defect is present on a main surface of the transparent substrate, a low-density region having a lower density than the surrounding portions of the transparent substrate was determined to be partially formed in a phase-shift film deposited on this concave defect. This is presumed to be due to the occurrence of variations in the approach angle and speed of particles arriving at the transparent substrate during deposition by oblique incidence rotary sputtering since sputter particles that have been scattered from the sputtering target approach from a direction at an angle from the direction perpendicular to a main surface of the transparent substrate and the shape of the cross-section of the concave defect is frequently rounded.

This type of low-density region becomes a region that has higher transmittance and different optical characteristics from surrounding regions. In the case of manufacturing a phase-shift mask from such a mask blank in which concave defects are present on a transparent substrate, it appears at a glance that a pattern can be designed in which concave defects do not have an effect on exposure and transfer of a fine pattern by covering the concave defects with a phase-shift film having a large area that does not utilize the aforementioned phase difference. However, since it is difficult to lower transmittance at the portion of a concave defect to the same degree as transmittance at the surrounding portion where the transfer pattern is present, in the case of carrying out pattern exposure and transfer on a transfer target (such as a resist film on a semiconductor substrate) using the completed phase-shift mask, there are cases in which defective transfer occurs in which that portion ends up being exposed to the transfer target due to the high transmittance of the phase-shift film on the concave defect, thereby resulting in a problem.

In this third embodiment, an object is to provide a mask blank and phase-shift mask that do not have clear defects where transmittance is higher than surrounding portions even in the case a transparent substrate has microscopic concave defects, and are able to reduce the occurrence of defective transfer as a result thereof, a method for manufacturing this mask blank, a method for manufacturing a phase-shift mask, and a method for manufacturing a semiconductor device.

This third embodiment has the configurations indicated below as means for solving the aforementioned problems.

(Configuration 1B)

A mask blank provided with a phase-shift film on a main surface of a transparent substrate, wherein the transparent substrate has a concave defect on the main surface on the side where the phase-shift film is formed, the phase-shift film comprises a structure in which a high transmission layer and a low transmission layer, having lower optical transmittance than the high transmission layer, are laminated in that order from the side of the transparent substrate, an internal region of the high transmission layer of the portion formed on the concave defect has a low-density region, and the density in the low-density region is relatively lower than the density in the internal region of the high transmission layer of a portion formed on the main surface where the concave defect is absent.

(Configuration 2B)

The mask blank of Configuration 1B, wherein the high transmission layer and the low transmission layer are formed from a material containing silicon and nitrogen, and the high transmission layer has a relatively higher nitrogen content in comparison with the low transmission layer.

(Configuration 3B)

The mask blank described in Configuration 1B or Configuration 2B, wherein the high transmission layer and the low transmission layer are formed from a material consisting of silicon and nitrogen or a material consisting of silicon, nitrogen and one or more elements selected from semi-metallic elements, non-metallic elements and noble gases.

(Configuration 4B)

The mask blank described in any of Configurations 1B to 3B, wherein the high transmission layer and the low transmission layer are composed of the same constituent elements.

(Configuration 5B)

The mask blank described in any of Configurations 1B to 4B, wherein the phase-shift film has two or more sets of combinations of a laminated structure consisting of the low transmission layer and the high transmission layer.

(Configuration 6B)

The mask blank described in any of Configurations 1B to 5B, wherein the high transmission layer and the low transmission layer are formed from a material consisting of silicon and nitrogen.

(Configuration 7B)

The mask blank described in any of Configurations 1B to 6B, wherein the high transmission layer has a larger film thickness than the low transmission layer.

(Configuration 8B)

The mask blank described in any of Configurations 1B to 7B, wherein the phase-shift film is provided with an uppermost layer formed from a material containing silicon and oxygen at a position farthest away from the transparent substrate.

(Configuration 9B)

The mask blank described in any of Configurations 1B to 8B, wherein the phase-shift film is provided with an uppermost layer at a position farthest away from the transparent substrate, and the uppermost layer formed from a material consisting of silicon and oxygen, a material consisting of silicon, nitrogen and oxygen, or a material containing one or more elements selected from semi-metallic elements, non-metallic elements and noble gases in those materials.

(Configuration 10B)

The mask blank described in Configuration 8B or Configuration 9B, wherein the phase-shift film formed on the concave defect remains even after carrying out hot water cleaning for not less than 5 minutes on the phase-shift film.

(Configuration 11B)

A phase-shift mask comprising a transfer pattern formed on the phase-shift film of the mask blank described in any of Configurations 1B to 10B.

(Configuration 12B)

A method for manufacturing a mask blank provided with a phase-shift film on a main surface of a transparent substrate, provided with:

a step of depositing the phase-shift film on a main surface of the transparent substrate having a concave defect by a sputtering method that comprises rotating the transparent substrate about an axis of rotation that passes through the center of the main surface and arranging the sputtered surface of the sputtering target at an angle in opposition to the main surface of the transparent substrate having a concave defect; wherein, the step of forming the phase-shift film comprises a high transmission layer formation step of forming a high transmission layer on the main surface of the transparent substrate having a concave defect, and a low transmission layer formation step of forming a low transmission layer, having optical transmittance that is lower than that of the high transmission layer, on the high transmission layer, and in the high transmission layer formed in the high transmission layer formation step, an internal region of the portion of the high transmission layer formed on the concave defect has a low-density region, and the density in the low-density region is relatively lower than the density in the internal region of the portion of the high transmission layer formed on a main surface where the concave defect is absent.

(Configuration 13B)

The method for manufacturing a mask blank described in Configuration 12B, wherein the high transmission layer formation step forms the high transmission layer by reactive sputtering in a sputtering gas that comprises a nitrogen-based gas and a noble gas using the sputtering target composed of a material containing silicon, and the low transmission layer formation step forms the low transmission layer by reactive sputtering in a sputtering gas that comprises a nitrogen-based gas and a noble gas, in which the mixing ratio of nitrogen-based gas is lower than during the high transmission layer formation step, using the sputtering target composed of a material containing silicon.

(Configuration 14B)

The method for manufacturing a mask blank described in Configuration 12B or Configuration 13B, wherein the high transmission layer formation step forms the high transmission layer by reactive sputtering in a sputtering gas that comprises a nitrogen-based gas and a noble gas using the sputtering target composed of material containing silicon or containing one or more elements selected from semi-metallic elements and non-metallic elements in silicon, and the low transmission layer formation step forms the low transmission layer by reactive sputtering in a sputtering gas that comprises a nitrogen-based gas and a noble gas, in which the mixing ratio of nitrogen-based gas is lower than during the high transmission layer formation step, using the sputtering target composed of material containing silicon or containing one or more elements selected from semi-metallic elements and non-metallic elements in silicon.

(Configuration 15B)

The method for manufacturing a mask blank described in any of Configurations 12B to 14B, wherein the high transmission layer formation step forms the high transmission layer by reactive sputtering in a sputtering gas composed of nitrogen gas and a noble gas using the sputtering target composed of silicon, and the low transmission layer formation step forms the low transmission layer by reactive sputtering in a sputtering gas composed of nitrogen gas and a noble gas, and in which the mixing ratio of nitrogen-based gas is lower than during the high transmission layer formation step, using the sputtering target composed of silicon.

(Configuration 16B)

The method for manufacturing a mask blank described in any of Configurations 12B to 15B, wherein the high transmission layer formation step forms the high transmission layer by reactive sputtering in a poison mode, and the low transmission layer formation step forms the low transmission layer by reactive sputtering in a metal mode.

(Configuration 17B)

The method for manufacturing a mask blank described in any of Configurations 12B to 16B, having an uppermost layer formation step of forming an uppermost layer composed of a material containing silicon and oxygen at a position of the phase-shift film farthest away from the transparent substrate.

(Configuration 18B)

The method for manufacturing a mask blank described in any of Configurations 12B to 17B, having an uppermost layer formation step of forming an uppermost layer with a material composed of silicon and oxygen, a material composed of silicon, nitrogen and oxygen, or a material containing one or more elements selected from semi-metallic elements, non-metallic elements and noble gases in those materials, at a position of the phase-shift film farthest away from the transparent substrate.

(Configuration 19B)

A method for manufacturing a phase-shift mask having a step of forming a transfer pattern on the phase-shift film of the mask blank manufactured according to the method for manufacturing a mask blank described in any of Configurations 12B to 18B.

(Configuration 20B)

A method for manufacturing a semiconductor device, provided with a step of exposing and transferring the transfer pattern of the phase-shift mask to a resist film on a substrate using the phase-shift mask described in Configuration 11B.

(Configuration 21B)

A method for manufacturing a semiconductor device, provided with a step of exposing and transferring the transfer pattern of the phase-shift mask to a resist film on a substrate using a phase-shift mask manufactured according to the method for manufacturing a phase-shift mask described in Configuration 19B.

According to each configuration of the aforementioned third embodiment, as a result of adopting a configuration in which a low-density region is formed on a concave defect in a high transmission layer provided on the side of a transparent substrate, transmittance of a phase-shift film can mainly be controlled by a low transmission layer not comprising a low-density region. Consequently, in-plane uniformity of transmittance of the phase-shift film on the transparent substrate having a concave defect can be improved, and as a result thereof, the formation of clear defects in a mask blank and phase-shift mask can be inhibited, thereby making it possible to prevent the occurrence of defective transfer using the phase-shift mask.

In the manufacturing of a mask blank, when depositing a thin film on a main surface of a transparent substrate, film deposition is carried out by applying oblique incidence rotary sputtering in which the sputtered surface of a sputtering target is inclined and arranged in opposition to a main surface of a rotated transparent substrate.

However, in a mask blank obtained by depositing a thin film of a transition metal silicide-based material represented by an MoSi-based material by applying this type of oblique incidence rotary sputtering, there have been determined to be cases in which microscopic pinhole defects (measuring about 100 nm) are formed in a main surface of the thin film during the process for fabricating a transfer mask using this mask blank. In addition, even though defects are not detected in a mask defect inspection carried out immediately after fabricating the transfer mask, when a mask defect inspection is carried out after mask cleaning that is carried out after using for a predetermined number of times with placing the transfer mask in an exposure apparatus, microscopic pinhole defects were determined to be similarly formed on a main surface of the thin film. In either of these cases, such pinhole defects were not detected when a defect inspection was carried out on a mask blank obtained by depositing a thin film.

The inventors of the present invention conducted extensive research on the cause of this formation of pinhole defects. As a result, scratches (concave defects) of a microscopic depth (not more than 40 nm) were determined to be present on a main surface of the transparent substrate directly below the pinhole defect in all of the mask blanks in which pinhole defects had formed as previously described. Next, transmission electron micrographs (TEM) of concave defects were observed in a mask blank manufactured with a transparent substrate in which microscopic concave defects are present. As a result, uneven deposition was able to be confirmed to have occurred in a thin film on the concave defects.

As a result of conducting additional research on this portion of uneven deposition, this portion of uneven deposition was determined to have a lower density in comparison with other portions of the thin film. Moreover, the region of low density where this uneven deposition occurred (low-density region) exhibited a shape in which it extended from the side of the transparent substrate towards the surface side of the thin film in a cross-sectional view thereof, and was able to be confirmed to be extending from near the outer periphery of the concave defects towards the center in an overhead view thereof.

The cause of the formation of this low-density region as described above is presumed to be due to the occurrence of variations in the approach angle and speed of particles arriving at the transparent substrate during deposition of the thin film by oblique incidence rotary sputtering since sputter particles that have been scattered from the sputtering target approach from a direction at an angle from the direction perpendicular to a main surface of the transparent substrate and the shape of the cross-section of the concave defect is frequently rounded.

The problem here is that a low-density region in a thin film as described above is a region of high transmittance in comparison with surrounding portions of the thin film. Consequently, even if a thin film on a transparent substrate is composed with a material for which there is no concern over the formation of pinhole defects, for example, if this thin film is a phase-shift film, it is difficult to hold transmittance at a concave defect to a low level similar to the transmittance of the surrounding portions of the thin film while maintaining a predetermined amount of phase shift. Thus, even if a pattern is designed for a phase-shift mask in which concave defects are present in a transparent substrate that covers the concave defects with a phase-shift film having a large area that does not utilize a phase difference, it is difficult to hold the transmittance at a concave defect to a low level similar to the transmittance of surrounding portions where a transfer pattern is present, thereby resulting in the risk of the occurrence of clear defects.

Therefore, in each mask blank according to the third embodiment, a phase-shift film on a main surface of a transparent substrate has a configuration in which a high transmission layer and a low transmission layer are laminated from the side of the transparent substrate. Since the high transmission layer is inherently a layer that has high transmittance, even if a low-density region is partially formed in this high transmission layer, the degree of increase in transmittance throughout the entire phase-shift film in the direction of film thickness attributable thereto is low, and even if a phase-shift mask is fabricated using a mask blank having such a phase-shift film, the effect of the low-density region on pattern exposure and transfer can be held to a low level.

In addition, when fabricating a phase-shift mask from a mask blank, a pattern is typically arranged so that the phase-shift film on a concave defect of the transparent substrate does not become a region that forms a fine transfer pattern. Consequently, there are substantially no problems with respect to the amount of phase shift of the phase-shift film on the concave defect even if it is not within a predetermined range. Thus, even if a low-density region is partially formed in the high transmission layer mainly used to adjust the amount of phase shift of the phase-shift film, this does not present a problem when fabricating a phase-shift mask.

The following provides an explanation of detailed configurations of the present invention as previously described, based on the drawings. Furthermore, the same reference symbols are used to explain the same constituent members in each of the drawings.

<<Mask Blank>>

Figure 7:
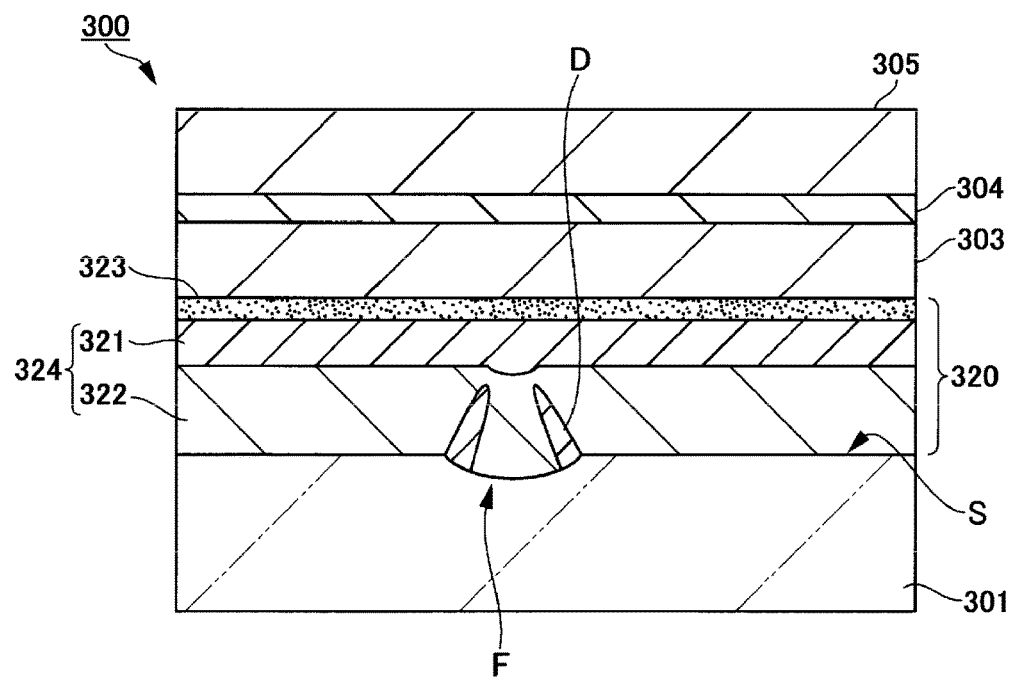
FIG. 7 is a cross-sectional view showing the configuration of a mask blank in a third embodiment.

FIG. 7 is a cross-sectional view of the essential portions of a mask blank 300 indicating one example of the configuration of the third embodiment. As shown in the drawing, the mask blank 300 has a configuration in which a halftone phase-shift film (to be referred to as a phase-shift film) 320 is provided on a main surface S on one side of a transparent substrate 301. The phase-shift film 320 has a laminated structure 324, in which a high transmission layer 322 and a low transmission layer 321, having lower transmittance than the high transmission layer 322, are laminated in that order from the side of the transparent substrate 301. In addition, the phase-shift film 320 may also be provided with an uppermost layer 323 at a position farthest from the transparent substrate 301. In this type of phase-shift film 320, each layer is deposited by oblique incidence rotary sputtering to be subsequently described in detail. In addition, the mask blank 300 may also employ a configuration in which a light shielding film 303, an etching mask film 304 and a resist film 305 are laminated in that order as necessary on the upper portion of the phase-shift film 320. The following provides a detailed explanation of essential constituent members of the mask blank 300.

<Transparent Substrate 301>

The transparent substrate 301 has a scratch of a microscopic depth in the form of a concave defect F on the main surface S on the side provided with the phase-shift film 320. The depth of the concave defect F is, for example, not more than 40 nm.

This type of transparent substrate 301 is composed of a material having favorable transparency with respect to exposure light used in a lithography exposure step. In the case of using ArF excimer laser light (wavelength: about 193 nm) for the exposure light, the transparent substrate 301 is composed with a material having favorable transparency with respect thereto. Although synthetic quartz glass is used for such a material, aluminosilicate glass, soda lime glass, low thermal expansion glass (such as $SiO_2$—$TiO_2$ glass) or various other types of glass substrates can also be used. Since quartz substrates in particular have high transparency with respect to ArF excimer laser light or light of a region having a shorter wavelength than that light, it can be used preferably in the mask blank of the aforementioned third embodiment.

Furthermore, the lithography exposure step here refers to a lithography exposure step using a phase-shift mask fabricated using this mask blank 1, and exposure light hereinafter refers to the exposure light used in this exposure step. Although ArF excimer laser light (wavelength: 193 nm), KrF excimer laser light (wavelength: 248 nm) or i-line light (wavelength: 365 nm) can be applied for this exposure light, from the viewpoint of miniaturization of a transfer pattern in the exposure step, ArF excimer laser light is preferably applied for the exposure light. Consequently, the following embodiments are explained for the case of using ArF excimer laser light for the exposure light.

<High Transmission Layer 322, Low Transmission Layer 321>

Among the high transmission layer 322 and the low transmission layer 321 composing the phase-shift film 320, the high transmission layer 322 provided on the side of the transparent substrate 301 is a layer that is mainly used to adjust the amount of phase shift in the phase-shift film 320. In this high transmission layer 322, an internal region of a portion formed on the concave defect F of the transparent substrate 301 has a low-density region D. The low-density region D in the high transmission layer 322 has a relatively lower density than the density in an internal region of the portion of the high transmission layer 322 formed on the main surface S where there is no concave defect F in the transparent substrate 301.

In addition, the low transmission layer 321 is a layer provided on the side of the main surface S of the transparent substrate 301 with the high transmission layer 322 interposed there between, and the transmittance thereof is lower than that of the high transmission layer 322. This type of low transmission layer 321 is a layer that is mainly used to adjust transmittance in the phase-shift film 320. In addition, the low-density region D formed on the concave defect F does not reach this low transmission layer 321.

The high transmission layer 322 and the low transmission layer 321 as described above are formed from a material containing silicon and nitrogen, and the nitrogen content of the high transmission layer 322 is relatively high in comparison with the low transmission layer 321. The high transmission layer 322 and the low transmission layer 321 may be formed with (1) a material consisting of silicon and nitrogen or (2) a material containing one or more elements selected from semi-metallic elements, non-metallic elements and noble gases in the material (1).

Although a semi-metallic element contained in the high transmission layer 322 and the low transmission layer 321 may be, in addition to silicon, any semi-metallic element, it is particularly one or more elements selected from boron, germanium, antimony and tellurium. These elements are elements that are contained in the high transmission layer 322 and the low transmission layer 321 due to the deposition process of the phase-shift film 320 carried out by sputtering to be subsequently explained, and are elements that are introduced in order to enhance electrical conductivity of a sputtering target that uses silicon.

A non-metallic element contained in the high transmission layer 322 and the low transmission layer 321 may be, in addition to nitrogen, any non-metallic element. Among these, one or more elements selected from carbon, fluorine and hydrogen is preferably contained in the high transmission layer 322 and the low transmission layer 321. On the other hand, the oxygen content of the high transmission layer 322 and the low transmission layer 321 is preferably held to not more than 10 at %, the oxygen content is preferably not more than 5 at %, and even more preferably, not containing oxygen actively (such that the result of RBS, XPS or other composition analyses is below the detection limit). In this manner, as a result of reducing oxygen content to a low level in silicon-based material films in the form of the high transmission layer 322 and the low transmission layer 321, the value of extinction coefficient k can be maintained to a certain degree and the overall thickness of the phase-shift film 320 can be reduced.

In addition, in the case the transparent substrate 301 is formed from a material having a synthetic quartz glass such as $SiO_2$ as the main component thereof, as a result of holding the oxygen content in the high transmission layer 322 provided in contact with the transparent substrate 301 to a low level, a composition difference can be secured between the transparent substrate 301 and the high transmission layer 322. As a result, etching selectivity between the phase-shift film 320 and the transparent substrate 301 can be made to be large during etching when forming a phase-shift mask by patterning the phase-shift film 320.

A noble gas contained in the high transmission layer 322 and the low transmission layer 321 is an element that is contained in the high transmission layer 322 and the low transmission layer 321 due to the deposition process of the phase-shift film 320 carried out by sputtering to be subsequently explained. The noble gas is an element that makes it possible to increase deposition rate and improve productivity as a result of being present in the deposition chamber when depositing the phase-shift film 320 by reactive sputtering. During film deposition by reactive sputtering, as a result of this noble gas being plasmified and colliding with a target, constituent elements of the target are scattered from the target and a thin film is formed by being laminated on a transparent substrate while incorporating reactive gas at an intermediated point. A small amount of noble gas in the deposition chamber is incorporated during the time until the target constituent elements are scattered from the target and adhere to the transparent substrate. Preferable examples of noble gases required by this reactive sputtering include argon, krypton and xenon. In addition, helium and/or neon, having a low atomic weight, can be aggressively incorporated into the thin film in order to relax stress in the deposited phase-shift film 320 comprising the high transmission layer 322 and the low transmission layer 321.

The high transmission layer 322 and the low transmission layer 321 as described above preferably employ a structure in which they are laminated in direct mutual contact without having another film interposed there between. In addition, the mask blank 300 of the present invention preferably employs a film structure in which a film composed of a material containing a metal element does not contact either of the high transmission layer 322 and the low transmission layer 321. As a result of employing this configuration, in the case of having carried out heat treatment or irradiation with ArF exposure light in a state in which a film containing a metal element contacts a film containing silicon, the metal element is not diffused in the film containing silicon, and changes over time in the compositions of the high transmission layer 322 and the low transmission layer 321 can be held to a low level.

In addition, the high transmission layer 322 and the low transmission layer 321 are preferably composed of the same constituent elements. In the case either of the high transmission layer 322 and the low transmission layer 321 contain different constituent elements and heat treatment or irradiation with ArF exposure light has been carried out in a state in which they are laminated in contact, there is the risk of those different constituent elements migrating to and diffusing into a layer on a side not containing those constituent elements. There is also the risk of the optical characteristics of the high transmission layer 322 and the low transmission layer 321 ending up changing considerably from those at the time of initial deposition. However, as a result of the high transmission layer 322 and the low transmission layer 321 being composed with the same constituent elements, such changes can be held to a low level. In addition, although the high transmission layer 322 and the low transmission layer 321 must be deposited using different targets in the case one of the different constituent elements is a semi-metallic element in particular, this is also not necessary.

In addition, among the high transmission layer 322 and the low transmission layer 321, the low transmission layer 321 may contain a transition metal for the purpose of adjusting transmittance of the phase-shift film 320. However, since transition metals can cause light fastness to ArF exposure light to decrease, a transition metal can be contained in the low transmission layer 321 if this decrease in light fastness does not present a problem. The low transmission layer 321 may also be composed with a material that contains a transition metal but does not contain silicon. Examples of transition metals contained in the low transmission layer 321 include materials containing one or more elements selected from titanium (Ti), tantalum (Ta), aluminum (Al), zirconium (Zr) and chromium (Cr). The low transmission layer 321 containing a transition metal is more preferably any of titanium nitride (TiN), tantalum nitride (TaN), aluminum nitride (AlN), zirconium nitride (ZrN) and chromium nitride (CrN).

In addition, the high transmission layer 322 and the low transmission layer 321 are preferably formed from a material consisting of silicon and nitrogen. As a result, a decrease in light fastness attributable to containing a transition metal in the high transmission layer 322 and the low transmission layer 321 can be prevented, and a change in optical characteristics accompanying migration of metal or semi-metallic elements between the high transmission layer 322 and the low transmission layer 321, which is attributable to containing a metal other than a transition metal and a semi-metallic element other than silicon in the high transmission layer 322 and the low transmission layer 321, can be prevented. In addition, if a non-metallic element is contained and oxygen, for example, is contained in the high transmission layer 322 and the low transmission layer 321, transmittance with respect to ArF exposure light increases considerably. In consideration thereof, the high transmission layer 322 and the low transmission layer 321 are more preferably formed from a material consisting of silicon and nitrogen. A noble gas is an element that is difficult to be detected even in the case of carrying out a composition analysis such as RBS or XPS on the thin film. Consequently, a material containing a noble gas can be considered to be included in the aforementioned material consisting of silicon and nitrogen.

In addition, in the phase-shift film 320 having the high transmission layer 322 and the low transmission layer 321 of each of the materials as previously described, two or more sets of the laminated structure 324, composed of a single layer of the high transmission layer 322 and a single layer of the low transmission layer 321, may be laminated while maintaining the lamination order of the high transmission layer 322 and the low transmission layer 321. In this case, the thickness of any one layer of the high transmission layer 322 and the low transmission layer 321 is preferably not more than 20 nm. Since required optical characteristics are greatly different between the high transmission layer 322 and the low transmission layer 321, there is a large difference in film nitrogen content between the two. Consequently, there is a large difference in etching rates between the high transmission layer 322 and the low transmission layer 321 in the case of carrying out dry etching with a fluorine-based gas when patterning these layers. In the case the phase-shift film has only one set of the laminated structure 324, when forming a transfer pattern on the phase-shift film 320 by dry etching with a fluorine-based gas, a level difference easily occurs in a cross-section of the pattern of the phase-shift film 320 after etching. As a result of the phase-shift film 320 employing a structure that has two or more sets of the laminated structure 324, since the thickness of each layer (one layer) of the high transmission layer 322 and the low transmission layer 321 is small in comparison with the case of having only one set of the laminated structure 324, the level difference that occurs in a cross-section of the pattern of the phase-shift film 320 after etching can be made to be small. In addition, as a result of restricting the thickness of each layer (one layer) of the high transmission layer 322 and the low transmission layer 321 to not more than 20 nm, the level difference that occurs in a cross-section of the pattern of the phase-shift film 320 after etching can be further reduced.

However, the high transmission layer 322 arranged closest to the transparent substrate 301 preferably has a film thickness that fills in the concave defect F of the transparent substrate 301 while also covering the low-density region D formed on this concave defect F.

Furthermore, as a variation of the mask blank 300, a mask blank configuration may be employed in which a phase-shift film, laminated on the side of the low transmission layer 321 in the laminated structure 324 composed of a single layer of the high transmission layer 322 and a single layer of the low transmission layer 321 and further provided with a single layer of the high transmission layer 322, is provided on the transparent substrate 301. Similar to that previously explained, two or more sets of the laminated structure 324 may be laminated, and in this case, a configuration results in which a single layer of the high transmission layer 322 is provided laminated on the low transmission layer 321 provided at a position farthest away from the transparent substrate 301. As a result, the mask blank has a phase-shift film having a configuration in which a single layer of the high transmission layer 322 is interposed between the laminated structure 324 and the uppermost layer 323 to be subsequently explained.

In the high transmission layer 322 and the low transmission layer 321 as previously described, refractive index n and extinction coefficient k are respectively set to be within a predetermined range so that the phase-shift film 320 composed thereof satisfies a predetermined phase difference and a predetermined transmittance with respect to an exposure light (such as ArF excimer laser light).

The high transmission layer 322 is a layer mainly used to adjust the amount of phase shift in the phase-shift film 320. This type of high transmission layer 322 is preferably formed from a material having, for example, the refractive index n with respect to ArF excimer laser light of not less than 2.5 (and preferably not less than 2.6) and the extinction coefficient k of less than 1.0 (and preferably not more than 0.9, more preferably not more than 0.7 and even more preferably not more than 0.4).

In addition, the low transmission layer 321 is a layer mainly used to adjust transmittance of the phase-shift film 320. This type of low transmission layer 321 is preferably formed from a material having, for example, the refractive index n with respect to ArF excimer laser light of less than 2.5 (and preferably not more than 2.4, more preferably not more than 2.2 and even more preferably not more than 2.0) and the extinction coefficient k with respect to ArF exposure light of not less than 1.0 (and preferably not less than 1.1, more preferably not less than 1.4 and even more preferably not less than 1.6).

Here, the refractive index n and extinction coefficient k of a thin film are not only determined by the composition of that thin film. Factors such as the film density or crystalline state of that thin film are also elements that have an effect on the refractive index n and extinction coefficient k. Consequently, each of these layers is made to have a desired refractive index n and extinction coefficient k by film deposition in which various conditions are adjusted when depositing the high transmission layer 322 and the low transmission layer 321 that compose the phase-shift film 320.

In addition, in the high transmission layer 322 and the low transmission layer 321 for which refractive index n and extinction coefficient k have been set as described above, the film thickness of the high transmission layer 322 is greater than the film thickness of the low transmission layer 321. Furthermore, in the case of employing a configuration in which a plurality of sets of the laminated structures 324, composed of a single layer of the high transmission layer 322 and a single layer of the low transmission layer 321, are laminated, the total film thickness of the plurality of high transmission layers 322 is greater than the total film thickness of the plurality of low transmission layers 321. Moreover, even in a configuration in which a single layer of the high transmission layer 322 is laminated for a single or plurality of the laminated structure 324, the total film thickness of the plurality of high transmission layers 322 is greater than the total film thickness of the plurality of the low transmission layers 321.

<Uppermost Layer 323>

The phase-shift film 320 is preferably provided with the uppermost layer 323, formed from a material containing silicon and oxygen, at a position farthest away from the transparent substrate 301. This uppermost layer 323 is formed from (3) a material composed of silicon and oxygen, (4) a material composed of silicon, nitrogen and oxygen, or (5) a material containing one or more elements selected from semi-metallic elements, non-metallic elements and noble gases in the material (3) or the material (4).

The semi-metallic elements, non-metallic elements and noble gases contained in the uppermost layer 323 are the same as the semi-metallic elements, non-metallic elements and noble gases contained in the high transmission layer 322 and the low transmission layer 321.

In addition to including a configuration in which the composition is nearly the same in the direction of layer thickness, the uppermost layer 323 composed with these materials also comprises a configuration having a composition gradient in the direction of layer thickness. The composition gradient in the uppermost layer 323 is such that the layer oxygen content increases moving away from the transparent substrate. Among the uppermost layers 323 having such configurations, examples of materials preferable for a configuration in which the composition is nearly the same in the direction of layer thickness include $SiO_2$ and SiON. In addition, a preferable example of a configuration having a composition gradient in the direction of layer thickness is preferably a configuration in which SiN is present on the side of the transparent substrate 301, the oxygen content increases moving away from the transparent substrate 301, and the surface layer is $SiO_2$ or SiON. Furthermore, in this case of this configuration, a layer with a composition gradient by oxidizing the surface layer of the high transmission layer 322 or the low transmission layer 321 may also be used for the uppermost layer 323.

As a result of having the phase-shift film 320 having this uppermost layer 323, chemical resistance is able to be secured for the phase-shift film 320. Namely, the high transmission layer 322 and the low transmission layer 321 are formed from a material containing silicon and nitrogen and the oxygen content thereof is held to a low level. In this manner, although a silicon-based material film containing nitrogen but not containing oxygen actively demonstrates high light fastness with respect to ArF excimer laser light, chemical resistance tends to be low in comparison with a silicon-based material film containing oxygen actively. Thus, as a result of the phase-shift film 320 having the uppermost layer 323 formed from a material containing silicon and oxygen, chemical resistance of the phase-shift film 320 can be improved.

As a result of providing this uppermost layer 323, the phase-shift film 320 remains on the concave defect F in this mask blank 300 without pinhole defects being formed in the phase-shift film 320 on the concave defect F even after having carried out hot water cleaning on the phase-shift film 320 for not less than 5 minutes.

In order for the phase-shift film 320, in which each layer is composed in the manner described above (including variations of the phase-shift film and to apply similarly hereinafter), to allow phase-shift effects to function effectively, transmittance with respect to ArF excimer laser light is preferably not less than 1% and more preferably not less than 2%. In addition, the phase-shift film 320 is preferably adjusted so that transmittance with respect to ArF excimer laser light is not more than 30%, more preferably not more than 20% and even more preferably not more than 10%. In addition, in the phase-shift film 320, a phase difference generated between ArF excimer laser light that transmits therethrough and light that transmits through air over the same distance as the thickness of the phase-shift film 320 is preferably adjusted to be within the range of 170 degrees to 190 degrees.

<Light Shielding Film 303>

The mask blank 300 according to the aforementioned third embodiment (including variations of the mask blank, and to apply similarly hereinafter) preferably has the light shielding film 303 laminated on the phase-shift film 320. Other matters relating to the light shielding film 303 (including matters relating to a laminated structure with the phase-shift film) are the same as those of the light shielding film 3 according to the previously described first embodiment.

<Etching Mask Film 304>

A configuration is more preferably employed in which, in the mask blank 300 provided with the light shielding film 303 by laminating on the phase-shift film 320, the etching mask film 304, formed from a material having etching selectivity with respect to the etching gas used when etching the light shielding film 303, is laminated on the light shielding film 303. Other matters relating to the etching mask film 304 are the same as those of the etching mask film 4 according to the aforementioned first embodiment.

<Resist Film 305>

In the mask blank 300 according to the aforementioned third embodiment, the resist film 305 of an organic material is preferably formed in contact with the surface of the etching mask film 304 at a film thickness of not more than 100 nm. Other matters relating to the resist film 305 are the same as those of the resist film according to the aforementioned first embodiment.

<<Method for Manufacturing Mask Blank>>

The following provides an explanation of the method for manufacturing a mask blank according to the aforementioned third embodiment.

<Deposition Apparatus 500>

Figure 8:
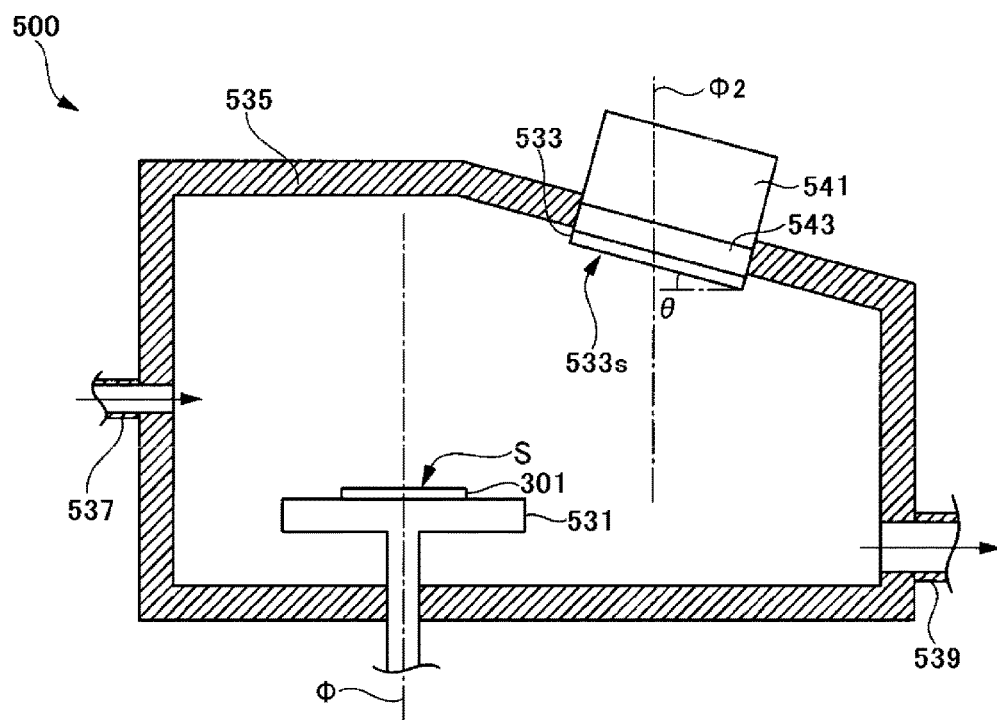
FIG. 8 is a schematic diagram showing one example of a deposition apparatus used in a method for manufacturing a mask blank in a third embodiment.

FIG. 8 shows a schematic diagram of one example of a deposition apparatus 500 used in the method for forming the mask blank 300 according to the third embodiment. The deposition apparatus 500 shown in this drawing is a sputtering deposition apparatus in which film deposition is carried out by oblique incidence rotary sputtering. This deposition apparatus 500 is a deposition apparatus that is provided with a rotating stage 531 on which the transparent substrate 301 is placed and a sputtering target 533 arranged in a predetermined state with respect to this rotating stage 531, and is able to form a thin film by sputtering on the main surface S of the transparent substrate 301. In the deposition apparatus 500 able to be used in the manufacturing method of the present invention, the transparent substrate 301 placed on the rotating stage 531 and the sputtering target 533 are in a predetermined positional relationship.

Namely, the deposition apparatus 500 is characterized in that a sputtered surface 533s of the sputtering target 533 is arranged in opposition to the main surface S of the transparent substrate 301 on the rotating stage 531 and above the transparent substrate 301 on an angle. This deposition apparatus 500 is provided with a deposition chamber 535 in which the rotating stage 531 and the sputtering target 533 are housed, and employs a configuration in which a thin film is sputtered and deposited on the transparent substrate 301 within this deposition chamber 535. The deposition chamber 535 has a gas inlet port 537 and an exhaust port 539, and functions as a vacuum chamber that carries out film deposition.

Figure 9:
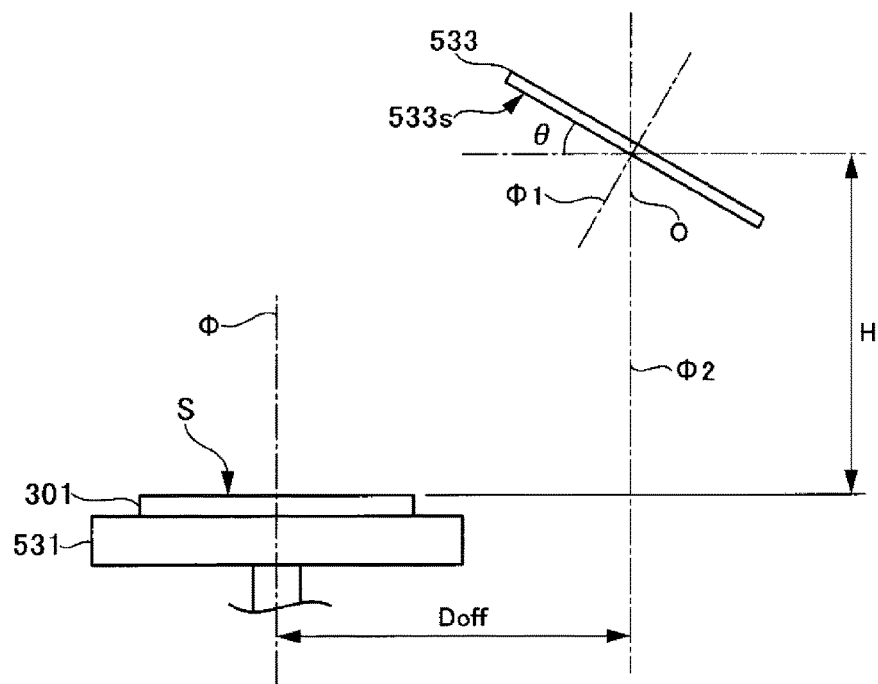
FIG. 9 is a schematic diagram showing the positional relationship between a substrate and a sputtering target in a deposition apparatus used in a method for manufacturing a mask blank in a third embodiment.

FIG. 9 is a schematic diagram showing the positional relationship between the transparent substrate 301 and the sputtering target 533. As a result of rotating the rotating stage 531, the transparent substrate 301 rotates about an axis of rotation φ that passes through the center of the main surface S and is perpendicular to the main surface S.

The sputtering target 533 is arranged so as to have a predetermined angle of inclination θ (target angle of inclination θ) relative to the main surface S of the transparent substrate 301. In other words, a central axis φ1, which passes through the center O of the sputtering target 533 and is perpendicular to the sputtered surface 533s of the sputtering target 533, is inclined relative to the axis of rotation φ of the transparent substrate 301.

In addition, the sputtering target 533 is arranged so that the axis of rotation φ of the transparent substrate 301 and a straight line φ2, which passes through the center O of the sputtered surface 533s and is parallel to the axis of rotation φ of the transparent substrate 301, are positioned separated by a predetermined offset distance Doff.

Here, in order to improve in-plane uniformity of the film thickness of a thin film deposited on the main surface S of the transparent substrate 301, it is necessary that a suitable positional relationship be maintained between the transparent substrate 301 and the sputtering target 533. Consequently, the following provides an additional explanation of the positional relationship between the transparent substrate 301 and the sputtering target 533 in the deposition apparatus 500 of the present invention.

As shown in FIGS. 8 and 9, in the deposition apparatus 500 used in the present invention, the target angle of inclination θ of the sputtered surface 533s of the sputtering target 533 with respect to the main surface S of the transparent substrate 301 not only has an effect on in-plane uniformity of film thickness in a thin film deposited on the main surface S of the transparent substrate 301, but also has an effect on deposition rate. More specifically, in order to obtain favorable in-plane uniformity of the film thickness of a thin film and in order to obtain a large deposition rate, the target angle of inclination θ is suitably 0 degrees to 45 degrees. In addition, a preferable target angle of inclination θ is 10 degrees to 30 degrees, and as a result thereof, in-plane uniformity of the film thickness of a thin film deposited on the main surface S of the transparent substrate can be improved.

The offset distance Doff in the deposition apparatus 500 can be adjusted according to the area for which in-plane uniformity is to be secured for film thickness in a thin film deposited on the main surface S of the transparent substrate 301. In general, in the case of a large area for which favorable in-plane uniformity is to be secured, the required offset distance Doff becomes large. For example, in the case the transparent substrate 301 with 152 mm on a side, the region where a transfer pattern is formed on a thin film is normally an inside region with 132 mm on a side based on the center of the transparent substrate 301. In order to realize film thickness distribution of a thin film at a precision level of within ±1 nm in this inside region with 132 cm on a side, the offset distance Doff is required to be about 240 mm to 400 mm, and the preferable offset distance Doff is 300 mm to 380 mm.

In addition, as a result of providing the offset distance Doff in this manner, dropping of particles from the sputtered surface 533s of the sputtering target 533 onto the main surface S of the transparent substrate 301 can be prevented during sputtering and deposition. As a result, particles can be prevented from contaminating the thin film deposited on the main surface S of the transparent substrate 301 and causing defects, thereby making it possible to hold the incidence of defects during deposition to a low level.

The optimum range of a vertical distance H between the sputtering target 533 and the transparent substrate 301 in the deposition apparatus 500 varies according to the offset distance Doff. This vertical distance H is the distance from the height position of the transparent substrate 301 to the height position of the center O of the sputtering target 533. For example, in order to secure favorable in-plane uniformity in the transparent substrate 301 with 152 mm on a side, this vertical distance H is required to be about 200 mm to 380 mm, and the preferable vertical distance H is 210 mm to 300 mm.

For example, in the case this deposition apparatus 500 is a magnetron sputtering apparatus, the sputtering target 533 is in a state in which it is attached through a backing plate 543 to a magnetron electrode 541. Furthermore, although deposition of a phase-shift film is carried out by oblique incidence rotary sputtering in the method for manufacturing a mask blank according to the aforementioned third embodiment, there are no limitations on the magnetron sputtering apparatus provided oblique incidence rotary sputtering is applied for the sputtering method, and it may be an ion beam sputtering apparatus. In addition, in the case of magnetron sputtering, the magnetron power supply suitably uses a direct current (DC) power supply or radio frequency (RF) power supply depending on the material of the sputtering target 533. For example, in the case of using a target 533 having low electrical conductivity (such as a silicon target or silicon compound target that does not contain or only contains a small amount of a semi-metallic element), RF sputtering or ion beam sputtering is preferably applied. In the case of using a target 533 having low electrical conductivity, RF sputtering is applied more preferably in consideration of deposition rate.

<Mask Blank Manufacturing Procedure>

The method for manufacturing a mask blank according to the aforementioned third embodiment is a method for manufacturing the mask blank 300 of the present invention (including variations of the mask blank and to apply similarly hereinafter) previously explained using FIGS. 7 to 9.

Namely, the method for manufacturing a mask blank of the present invention is a method for manufacturing the mask blank 300 having the phase-shift film 320 provided on the main surface S of the transparent substrate 301 having the concave defect F. In a step of depositing the phase-shift film 320, deposition is carried out by so-called oblique incidence rotary sputtering that comprises rotating the transparent substrate 301 about a rotary axis that passes through the center of the main surface S and arranging the sputtered surface of the sputtering target 533 on an angle in opposition to the main surface S having the concave defect F of the transparent substrate 301.

In this step of depositing the phase-shift film 320, a high transmission layer formation step, in which the high transmission layer 322 is deposited on the main surface S having the concave defect F of the transparent substrate 301, and a low transmission layer formation step, in which the low transmission layer 321, which has lower transmittance than the high transmission layer 322, is formed on the high transmission layer 322, are carried out by the oblique incidence rotary sputtering. In the high transmission layer 322 formed in the high transmission layer formation step, an internal region of a portion of the high transmission layer 322 formed on the concave defect F has the low-density region D, and the density in the low-density region D is relatively lower than the density in an internal region of a portion of the high transmission layer 322 formed on the main surface S where the concave defect is absent.

<High Transmission Layer Formation Step and Low Transmission Layer Formation Step>

In the high transmission layer formation step and low transmission layer formation step, reactive sputtering is carried out in a sputtering gas comprising a nitrogen-based gas and a noble gas using the sputtering target 533 composed of a material containing silicon. Here, the mixing ratio of the nitrogen-based gas in the sputtering gas in the low transmission layer formation step in particular is characterized as being lower than that of the high transmission layer formation step. As a result, in the low transmission layer formation step, the nitrogen content is relatively lower than in the high transmission layer 332 deposited in the high transmission layer formation step, and as a result thereof, the low transmission layer 321 is deposited having lower optical transmittance than the high transmission layer 322.

Any nitrogen-based gas can be applied for the nitrogen-based gas used as sputtering gas in the aforementioned high transmission layer formation step and low transmission layer formation step if it is a gas that contains nitrogen. As was explained in the configuration of the mask blank 300, the oxygen contents of the high transmission layer 322 and the low transmission layer 321 are preferably held to a low level. Consequently, in order to deposit the high transmission layer 322 and the low transmission layer 321, a nitrogen-based gas that does not contain oxygen is applied preferably, and nitrogen gas ($N_2$ gas) is applied more preferably.

In addition, a silicon target composed of silicon may be used for the sputtering target 533 containing silicon that is used in the high transmission layer formation step and low transmission layer formation step. In addition, in another example, a silicon target containing silicon and one or more elements selected from semi-metallic elements and non-metallic elements may be used. As a result, the high transmission layer 322 and the low transmission layer 321 are deposited containing silicon, nitrogen and one or more elements selected from semi-metallic elements and non-metallic elements. In this case, one or more elements selected from boron, germanium, antimony and tellurium are preferably contained as semi-metallic elements. These semi-metallic elements can be expected to enhance electrical conductivity of the target 533. Consequently, in the case of forming the high transmission layer 322 and the low transmission layer 321 by DC sputtering in particular, these semi-metallic elements are preferably contained in the target 533. One or more elements selected from carbon, fluorine and hydrogen may also be contained as non-metallic elements.

In the high transmission layer formation step and low transmission layer formation step as previously described, the same sputtering target 533 may be used or sputtering targets 533 having different compositions may be used. However, different sputtering targets 533 are preferably used to form the low transmission layer 322 and the low transmission layer 321 in the high transmission layer formation step and low transmission layer formation step. The nitrogen contents are different considerably between the low transmission layer 321 and the high transmission layer 322, and the mixing ratios of nitrogen-based gas in the sputtering gas during sputtering and deposition also are different considerably. Consequently, the surface state of the sputtering target 533 during sputtering and deposition of the low transmission layer 321 and the surface state of the sputtering target 533 during sputtering and deposition of the high transmission layer 322 are different considerably. When the low transmission layer 321 is attempted to be deposited by forming the high transmission layer 322 followed by using the sputtering target 533 while in the surface state at that time and changing the mixing ratio of nitrogen-based gas in the sputtering gas, a large amount of contaminants are generated from the sputtering target 533 and the like, thereby resulting in the risk of a large number of defects being formed in the resulting low transmission layer 321. The use of different targets 533 to form the low transmission layer 321 and the high transmission layer 322 eliminates any concern over this and enables the defect quality of the formed film to be enhanced.

In the case of using two different sputtering targets 533 to form the low transmission layer 321 and the high transmission layer 322, a sputtering apparatus configuration can be applied in which two sputtering targets 533 are arranged in a single deposition chamber, or a deposition apparatus configuration can be applied in which two deposition chambers are provided and one sputtering target 533 is arranged in each deposition chamber. In the case of carrying out the high transmission layer formation step and the low transmission layer formation step in different deposition chambers, a configuration is preferably employed in which each deposition chamber is linked through, for example, a deposition apparatus transfer chamber. As a result, the high transmission layer formation step and low transmission layer formation step can be carried out in different deposition chambers without exposing the transparent substrate to air.

On the other hand, in the case of forming both the high transmission layer 322 and the low transmission layer 321 using a deposition apparatus in which a single sputtering target 533 is arranged in a single deposition chamber, deposition is carried out on a dummy substrate after having adjusted the sputtering gas for forming a second layer in order optimize the surface state of the sputtering target 533 after forming a first layer, and the second layer is then preferably formed on the first layer. This type of process makes it possible to enhance defect quality of the second layer.

Furthermore, a sputtering target containing silicon and a transition element may also be used for the sputtering target 533 containing silicon used particularly in the low transmission layer formation step among the high transmission layer formation step and low transmission layer formation step. As a result, a low transmission layer 321 is deposited that contains silicon, nitrogen and a transition metal.

Moreover, a silicon target is preferably used in each step of the sputtering target 533 that contains silicon used in the high transmission layer formation step and low transmission layer formation step. As a result, the high transmission layer 322 and the low transmission layer 321 composed of silicon and nitrogen are deposited, and the high transmission layer 322 and the low transmission layer 321 have favorable light fastness with respect to exposure light of an ArF excimer laser and prevent deterioration of optical characteristics over time.

In addition, in depositing the high transmission layer 322 having a higher nitrogen content than the low transmission layer 321 in the high transmission layer formation step in particular, deposition is preferably carried out by reactive sputtering in the poison mode. In the case of deposition according to the poison mode, deposition is carried out by reactive sputtering in which the mixing ratio of nitrogen-based gas is set to a higher ratio than the range of mixing ratios of nitrogen-based gas in the transition mode, in which deposition has a tendency to be unstable. On the other hand, in depositing the low transmission layer 321 having a lower nitrogen content than the high transmission layer 322 in the low transmission layer formation step, deposition is preferably carried out by reactive sputtering in the metal mode. In the case of deposition according to the metal mode, deposition is carried out by reactive sputtering in which the mixing ratio of nitrogen-based gas is set to a lower ratio than the range of mixing ratios of nitrogen-based gas in the transition mode, in which deposition has a tendency to be unstable.

As a result, both the high transmission layer 322 and the low transmission layer 321 can be deposited by reactive sputtering according to deposition conditions for which there are small fluctuations in deposition rate and voltage during deposition. As a result, the phase-shift film 320 can be formed in which uniformity of composition and optical characteristics is high and defectivity is low.

Furthermore, in the case of laminating a plurality of the laminated structures 324 composed of a single layer of the high transmission layer 322 and a single layer of the low transmission layer 321 on the transparent substrate 301, the high transmission layer formation step and low transmission layer formation step as previously described are repeatedly carried out in that order. In addition, in the case of fabricating a variation of the mask blank 30 as previously described, after having repeated formation of the high transmission layer 322 according to the high transmission layer formation step and formation of the low transmission layer 321 according to the low transmission layer formation step on the main surface S of the transparent substrate 2 the required plurality of times, formation of the high transmission layer 322 is carried out according to the high transmission layer formation step.

In addition, in the high transmission layer formation step and low transmission layer formation step as previously described, it is necessary to form the high transmission layer 322 and the low transmission layer 321 for which the respective refractive indices n and extinction coefficients k are set to predetermined ranges so that the phase-shift film 320 obtained according to these steps satisfies a predetermined phase difference and a predetermined transmittance with respect to the exposure light (such as ArF excimer laser light). Consequently, the ratio of a mixed gas of a nitrogen-based gas and a noble gas is adjusted in the high transmission layer formation step and low transmission layer formation step. In addition, although the pressure of the deposition atmosphere, electrical power applied to the sputtering target 533 and positional relationship such as the distance between the sputtering target 533 and the transparent substrate 301 are also adjusted, since these deposition conditions are inherent to the deposition apparatus 500, the high transmission layer 322 and the low transmission layer 321 formed are suitably adjusted so as to have a desired refractive index n and extinction coefficient k.

<Uppermost Layer Formation Step>

In the case the phase-shift film is provided with the uppermost layer 323 formed from a material containing silicon and oxygen at a position farthest away from the transparent substrate 301, an uppermost layer formation step is carried out after completion of the high transmission layer formation step and low transmission layer formation step. In this uppermost layer formation step, deposition of the uppermost layer 323 is carried out by oblique incidence rotary sputtering in continuation from the high transmission layer formation step and low transmission layer formation step.

In the uppermost layer formation step, the uppermost layer 323 is formed by reactive sputtering in a sputtering gas comprising nitrogen gas, oxygen gas and a noble gas using the silicon target 533 or a sputtering target 533 composed of a material containing one or more elements selected from semi-metallic elements and non-metallic elements in silicon. This uppermost layer formation step can be applied to formation of the uppermost layer 323 having both configurations, a configuration in which the composition is nearly the same in the direction of layer thickness and a configuration having a composition gradient. In addition, in the uppermost layer formation step, the uppermost layer 323 may also be formed by reactive sputtering in a sputtering gas comprising a noble gas and a nitrogen-based gas as necessary using the silicon dioxide ($SiO_2$) target 533 or the target 533 composed of a material containing one or more elements selected from semi-metallic elements and non-metallic elements in silicon dioxide ($SiO_2$). This uppermost layer formation step can also be applied to the formation of the uppermost layer 323 having a configuration in which the composition is nearly the same in the direction of layer thickness or a configuration having a composition gradient.

In the case of forming the uppermost layer 323 having a composition gradient, after having formed a material layer containing silicon and nitrogen by the previously described reactive sputtering, treatment consisting of oxidizing at least the surface layer of this material layer is additionally carried out. As a result, the uppermost layer 323 is formed having a composition gradient in the direction of layer thickness. Examples of treatment used to oxidize the surface layer of the material layer in this case include heat treatment in a gas containing oxygen such as air and treatment in which the uppermost layer is contacted with ozone or oxygen plasma. As a result thereof, the uppermost layer 323 is obtained having a composition gradient in which the oxygen content in the layer increases moving away from the transparent substrate 301. Furthermore, the aforementioned material layer containing silicon and nitrogen may also be formed by reactive sputtering under the same deposition conditions as those of the high transmission layer 322 or the low transmission layer 321.

In addition, as another example of the uppermost layer formation step used to form the uppermost layer 323 in which the configuration thereof has a composition gradient, reactive sputtering may be applied in which the mixing ratio of each gas component comprising the sputtering gas is changed in the aforementioned uppermost layer formation step. As a result, the uppermost layer 323 can be formed having a composition gradient in the direction of layer thickness. In this case, for example, the mixing ratio of oxygen in the sputtering gas increases as deposition progresses. As a result, the uppermost layer 323 is obtained that has a composition gradient such that oxygen content in the layer increases moving away from the transparent substrate 301.

In the case the mask blank 300 according to the aforementioned third embodiment employs a configuration in which a light shielding film 303 is laminated on the phase-shift film 320, a light shielding film formation step is carried out after having formed the phase-shift film 320. In addition, in the case the mask blank 300 has a configuration in which the etching mask film 304 is laminated on the light shielding film 303, an etching mask film formation step is carried out after the light shielding film formation step. There are no limitations on the respective deposition methods used in the light shielding film formation step and etching mask film formation step, and a sputtering method, for example, is applied. Moreover, in the case the mask blank 300 has a configuration in which the resist film 305 is laminated on the etching mask film 304, a resist film formation step is carried out after the etching mask film formation step. A spin coating method, for example, is applied for the resist film formation step.

<<Phase-Shift Mask>>

Figure 10:
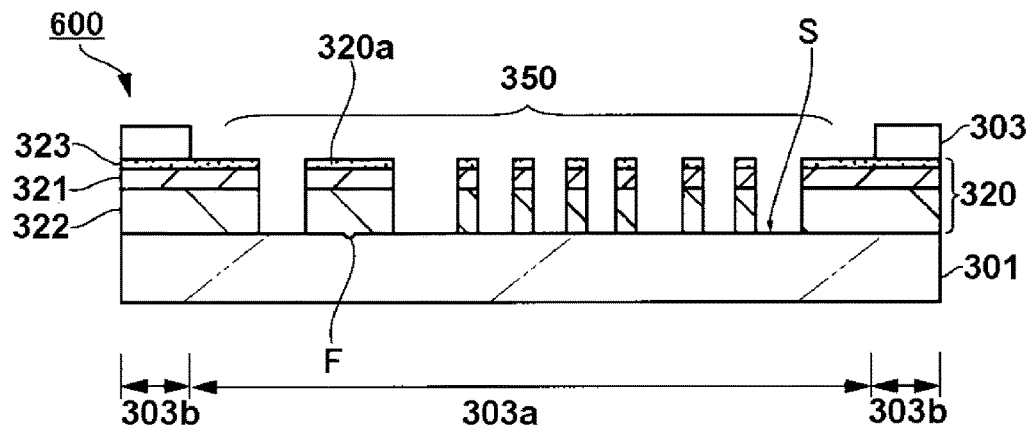
FIG. 10 is a cross-sectional view showing the configuration of a phase-shift mask in a third embodiment.

FIG. 10 is a cross-sectional view showing the configuration of a phase-shift mask according to the third embodiment. As shown in this drawing, a phase-shift mask 600 is characterized in that a transfer pattern 350 is formed on the phase-shift film 320 in the mask blank 300 according to the aforementioned third embodiment. Furthermore, although a configuration in which the transfer mask 350 is formed on the phase-shift film 320 of the mask blank 300 explained using FIG. 7 is explained using the example of FIG. 10, a transfer mask is similarly formed on a phase-shift film in the previously described variations of the mask blank as well.

Namely, the phase-shift mask 600 has the transfer pattern 350, obtained by patterning the phase-shift film 320, in a transfer pattern formation region 303a in the central portion of the transparent substrate 301. In addition, an outer peripheral region 303b of the transfer pattern formation region 303a is covered with the light shielding film 303 remaining on the upper portion of the phase-shift film 320. In particular, a configuration is employed so as not to arrange the concave defect F in the transparent substrate 301 in the region where a fine transfer pattern (utilizing phase shift) of the transfer pattern 350 is formed. Namely, a configuration is employed in which the concave defect F is covered by a transfer pattern 320a composed of a large-area phase-shift film.

Here, a low-density region (not shown), having a density lower than the surrounding region as previously described, is present in the high transmission layer 322 in the phase-shift film 320 of the upper portion of this concave defect F, the high transmission layer 322 being on the closest side to the transparent substrate 301. However, since the high transmission layer 322 inherently has high transmittance, even if this high transmission layer 322 is formed at low density, the degree of increase in overall transmittance in the direction of film thickness of the phase-shift film attributable thereto is low. Consequently, in the phase-shift mask 600 having this phase-shift film 320, the effect of the low-density region on pattern exposure and transfer can be held to a low level. In addition, even if the transfer pattern 320a on this concave defect F has amount of phase-shift that is out of the setting value due to the presence of this low-density region, there is no effect on the formation of a fine exposure pattern by pattern exposure using this phase-shift mask 600.

<<Method for Manufacturing Phase-Shift Mask>>

The method for producing the phase-shift mask 600 according to the third embodiment is characterized by having a step of forming the transfer pattern 350 on the phase-shift film 320 of the mask blank 300 manufactured using the aforementioned manufacturing method. This method for manufacturing the phase-shift mask 600 according to the third embodiment differs from the method for manufacturing a phase-shift mask according to the aforementioned first embodiment in that, when exposing and drawing a transfer pattern to be formed on the phase-shift film 320 (phase-shift pattern) in the form of a first pattern on a resist film, a pattern design is employed in which the concave defect F of the transparent substrate 301 is covered with a first resist pattern that does not utilize phase shift. Other matters are the same as those of the method for manufacturing a phase-shift mask according to the aforementioned first embodiment.

<<Method for Manufacturing a Semiconductor Device>>

The method for manufacturing a semiconductor device according to the third embodiment is characterized in that a transfer pattern of a phase-shift mask is exposed and transferred to a resist film on a substrate using the phase-shift mask according to the aforementioned third embodiment or a phase-shift mask manufactured using the mask blank according to the aforementioned third embodiment. Other matters are the same as those of the method for manufacturing a semiconductor device according to the aforementioned first embodiment.

EXAMPLES

The following provides a more detailed explanation of the first embodiment of the present invention according to Examples 1-1 and 1-2 and Comparative Example 1-1.

Example 1-1

<<Manufacturing of Mask Blank>>

The transparent substrate 1 composed of synthetic quartz glass was prepared in which dimensions of the main surface were about 152 mm×about 152 mm and thickness was about 6.25 mm. This transparent substrate 1 was polished to a predetermined surface roughness for the edge faces and main surface followed by subjecting to predetermined cleaning treatment and drying treatment.

Next, the transparent substrate 1 was placed in a single-wafer RF sputtering apparatus, and the low transmission layer 21, composed of silicon and nitrogen (Si:N=59 at %:41 at %), was formed at a thickness of 12 nm on the transparent substrate 1 by reactive sputtering (RF sputtering) using a silicon (Si) target by using a mixed gas of argon (Ar) and nitrogen ($N_2$) (flow rate ratio Ar:$N_2$=2:3, pressure=0.035 Pa) for the sputtering gas, and setting the electrical power of the RF power supply to 2.8 kW. When only the low transmission layer 21 was formed under the same conditions on a main surface of a different transparent substrate and optical characteristics of this low transmission layer 21 were measured using a spectroscopic ellipsometer (M-2000D, J. A. Woollam Co., Inc.), refractive index n at a wavelength of 193 nm was 1.85 and extinction coefficient k was 1.70. Furthermore, conditions used when depositing this low transmission layer 21 were such that deposition conditions such as flow rate ratio were selected that allowed stable deposition in the metal mode region by preliminarily verifying the relationship between deposition rate and flow rate ratio of $N_2$ gas in a mixed gas of Ar gas and $N_2$ gas in the sputtering gas with the single-wafer RF sputtering apparatus used. Furthermore, the composition of the low transmission layer 21 was obtained by measurement using X-ray photoemission spectroscopy (XPS). This applies similarly with respect to other films as well.

Next, the transparent substrate 1 laminated with the low transmission layer 21 was installed in the single-wafer RF sputtering apparatus, and the high transmission layer 22, composed of silicon and nitrogen (Si:Ni=46 at %:54 at %), was formed at a thickness of 55 nm on the low transmission layer 21 by reactive sputtering (RF sputtering) using a silicon (Si) target, using a mixed gas of argon (Ar) and nitrogen ($N_2$) (flow rate ratio Ar:$N_2$=1:3, pressure=0.09 Pa) for the sputtering gas, and setting the electrical power of the RF power supply to 2.8 kW. When only the high transmission layer 22 was formed on a main surface of a different transparent substrate and optical characteristics of this high transmission layer 22 were measured using a spectroscopic ellipsometer (M-2000D, J. A. Woollam Co., Inc.), refractive index n at a wavelength of 193 nm was 2.52 and extinction coefficient k was 0.39. Furthermore, conditions used when depositing this high transmission layer 22 were such that deposition conditions such as flow rate ratio were selected that allowed stable deposition in the reaction mode (poison mode) region by preliminarily verifying the relationship between deposition rate and flow rate ratio of $N_2$ gas in a mixed gas of Ar gas and $N_2$ gas in the sputtering gas with the single-wafer RF sputtering apparatus used.

Next, the transparent substrate 1 laminated with the low transmission layer 21 and the high transmission layer 22 was installed in the single-wafer RF sputtering apparatus, and the uppermost layer 23, composed of silicon and oxygen, was formed at a thickness of 4 nm on the high transmission layer 22 by reactive sputtering (RF sputtering) using a silicon dioxide ($SiO_2$) target, using argon (Ar) gas (pressure=0.03 Pa) for the sputtering gas, and setting the electrical power of the RF power supply to 1.5 kW. Furthermore, when only the uppermost layer 23 was formed on a main surface of a different transparent substrate and optical characteristics of this uppermost layer 23 were measured using a spectroscopic ellipsometer (M-2000D, J. A. Woollam Co., Inc.), refractive index n at a wavelength of 193 nm was 1.56 and extinction coefficient k was 0.00.

According to the aforementioned procedure, the phase-shift film 2, composed of the low transmission layer 21, the high transmission layer 22 and the uppermost layer 23, was formed on the transparent substrate 1. When transmittance and phase difference were measured for this phase-shift film 2 at the wavelength of light of an ArF excimer laser (about 193 nm) with a phase shift measuring apparatus, transmittance was 5.97% and phase difference was 177.7 degrees.

Next, the transparent substrate 1 having the phase-shift film 2 formed thereon was installed in a single-wafer DC sputtering apparatus, and the lowermost layer of the light shielding film 3 composed of CrOCN was formed at a thickness of 30 nm on the phase-shift film 2 by reactive sputtering (DC sputtering) using a chromium (Cr) target, using a mixed gas of argon (Ar), carbon dioxide ($CO_2$), nitrogen ($N_2$) and helium (He) (flow rate ratio Ar:$CO_2$:$N_2$:He=22:39:6:33, pressure: 0.2 Pa) for the sputtering gas, and setting the electrical power of the DC power supply to 1.9 kW.

Next, the lower layer of the light shielding film 3 composed of CrN was formed at a thickness of 4 nm on the phase-shift film 2 by reactive sputtering (DC sputtering) using the same chromium (Cr) target, using a mixed gas of argon (Ar) and nitrogen ($N_2$) (flow rate ratio Ar:$N_2$=83:17, pressure=0.1 Pa) for the sputtering gas, and setting the electrical power of the DC power supply to 1.4 kW.

Next, the upper layer of the light shielding film 3 composed of CrOCN was formed at a thickness of 14 nm on the phase-shift film 2 by reactive sputtering (DC sputtering) using the same chromium (Cr) target, using a mixed gas of argon (Ar), carbon dioxide ($CO_2$), nitrogen ($N_2$) and helium (He) (flow rate ratio Ar:$CO_2$:$N_2$:He=21:37:11:31, pressure=0.2 Pa) for the sputtering gas, and setting the electrical power of the DC power supply to 1.9 kW. According to the aforementioned procedure, the light shielding film 3 of a chromium-based material, composed of a three-layer structure consisting a lowermost layer composed of CrOCN, a lower layer composed of CrN and upper layer composed of CrOCN starting from the side of the phase-shift film 2, was formed at a total film thickness of 48 nm.

Moreover, the transparent substrate 1 laminated with the phase-shift film 2 and the light shielding film 3 was installed in a single-wafer RF sputtering apparatus, and the etching mask film 4, composed of silicon and oxygen, was formed at a thickness of 5 nm on the light shielding film 3 by RF sputtering using a silicon dioxide ($SiO_2$) target, using argon (Ar) gas (pressure: 0.03 Pa) for the sputtering gas, and setting the electrical power of the RF power supply to 1.5 kW. According to the aforementioned procedure, the mask blank 100 was manufactured provided with a structure obtained by laminating the phase-shift film 2 having a three-layer structure, the light shielding film 3 and the etching mask film 4 on the transparent substrate 1.

<<Manufacturing of Phase-Shift Mask>>

Next, the phase-shift mask 200 of Example 1-1 was fabricated according to the following procedure using the mask blank 100 of Example 1-1. First, HMDS treatment was carried out on the surface of the etching mask film 4. Continuing, a resist film composed of a chemically amplified resist for electron beam drawing was formed at a film thickness of 80 nm in contact with the surface of the etching mask film 4 by spin coating. Next, a phase-shift pattern to be formed on the phase-shift film in the form of a first pattern was drawn with an electron beam on this resist film followed by carrying out a predetermined cleaning treatment and drying treatment to form a first resist pattern 5a having the first pattern (see FIG. 3(a)).

Next, dry etching using $CF_4$ gas was carried out using the first resist pattern 5a as a mask to form the first pattern (etching mask pattern 4a) on the etching mask film 4 (see FIG. 3(b)).

Next, the first resist pattern 5a was removed. Continuing, dry etching using a mixed gas of chlorine and oxygen (gas flow rate ratio $Cl_2$:$O_2$=4:1) was carried out using the etching mask pattern 4a as a mask to form the first pattern (light shielding pattern 3a) on the light shielding film 3 (see FIG. 3(c)).

Next, dry etching using a fluorine-based gas ($SF_6$+He) was carried out using the light shielding pattern 3a as a mask to form the first pattern (phase-shift pattern 2a) on the phase-shift film 2 while simultaneously removing the etching mask pattern 4a (see FIG. 3(d)).

Next, a resist film composed of a chemically amplified resist for electron beam drawing was formed at a film thickness of 150 nm on the light shielding film pattern 3a by spin coating. Next, a pattern to be formed on the light shielding film (light shielding pattern) in the form of a second pattern was exposed and drawn on the resist film followed by further carrying out a predetermined treatment such as developing treatment to form the second resist pattern 6b having a light shielding pattern. Continuing, dry etching using a mixed gas of chlorine and oxygen (gas flow rate ratio $Cl_2:O_2=4:1$) was carried out using the second resist pattern 6b as a mask to form the second pattern (light shielding pattern 3b) on the light shielding film 3 (see FIG. 3(e)). Moreover, the second resist pattern 6b was removed following by going through predetermined treatment such as cleaning to obtain the phase-shift mask 200 (see FIG. 3(f)).

When a mask pattern inspection was carried out with a mask inspection apparatus on the halftone phase-shift mask 200 fabricated in Example 1-1, it was confirmed that a fine pattern was formed within the acceptable range of the design value. Next, treatment was carried out on the phase-shift pattern of this halftone phase-shift mask 200 of Example 1-1 by irradiating with ArF excimer laser light at a cumulative dose of 20 kJ/cm$^2$. The change in CD of the phase-shift pattern before and after this radiation treatment was about 2 nm, and this amount of change in CD was within a usable range as a phase-shift mask.

A simulation of a transferred image was carried out on the halftone phase-shift mask 200 of Example 1-1 after undergoing radiation treatment with ArF excimer laser light when exposed and transferred to a resist film on a semiconductor device with exposure light having a wavelength of 193 nm using the AIMS193 (Carl Zeiss AG). When this simulated exposed and transferred image was verified, it was determined to adequately satisfy design specifications. On the basis of this result, even if the phase-shift mask of Example 1-1 is placed on the mask stage of an exposure apparatus after being irradiated with an ArF excimer laser at a cumulative dose of 20 kJ/cm$^2$ and exposed and transferred to a resist film on a semiconductor device, it can be said that the circuit pattern ultimately formed on the semiconductor device can be formed with high precision.

Example 1-2

<<Manufacturing of Mask Blank>>

The transparent substrate 1 was prepared in the same manner as Example 1-1.

Next, the transparent substrate 1 was placed in a single-wafer RF sputtering apparatus and the high transmission layer 22 was formed under the same deposition conditions as those of the high transmission layer 22 of Example 1-1 with the exception of changing the thickness to 18 nm. The optical characteristics of this high transmission layer 22 were the same as those of the high transmission layer 22 of Example 1-1 in that the refractive index n at a wavelength of 193 nm was 2.52 and the extinction coefficient was 0.39.

Next, the transparent substrate 1 laminated with the high transmission layer 22 was installed in the single-wafer RF sputtering apparatus and the low transmission layer 21 was formed under the same deposition conditions as those of the low transmission layer 21 of Example 1-1 with the exception of changing the thickness to 7 nm. The optical characteristics of this low transmission layer 21 were the same as those of the low transmission layer 21 of Example 1-1 in that the refractive index n at a wavelength of 193 nm was 1.85 and the extinction coefficient was 1.70.

Next, the transparent substrate 1 laminated with the high transmission layer 22 and the low transmission layer 21 was installed in the single-wafer RF sputtering apparatus, and the high transmission layer 22 was formed under the same deposition conditions as those of the high transmission layer 22 of Example 1-1 with the exception of changing the thickness to 18 nm. The optical characteristics of this high transmission layer 22 were the same as those of the high transmission layer 22 of the first layer.

Next, the transparent substrate 1 laminated with the high transmission layer 22, the low transmission layer 21 and the high transmission layer 22 in that order was installed in the single-wafer RF sputtering apparatus and the low transmission layer 21 was formed under the same deposition conditions as those of the low transmission layer 21 of Example 1-1 with the exception of changing the thickness to 7 nm. The optical characteristics of this low transmission layer 21 were the same as those of the low transmission layer 21 of the second layer.

Next, the transparent substrate 1 laminated with the high transmission layer 22, the low transmission layer 21, the high transmission layer 22 and the low transmission layer 21 in that order was installed in the single-wafer RF sputtering apparatus and the uppermost layer 23 was formed under the same deposition conditions as those of the high transmission layer 22 of Example 1-1 with the exception of changing the thickness to 18 nm. At this point, the optical characteristics of the uppermost layer 23 were the same as those of the high transmission layer 22 of the first layer. Next, oxidizing treatment using ozone was carried out on the uppermost layer 23 on the transparent substrate to form an oxidized layer on the surface layer of the uppermost layer 23. As a result, a composition gradient film was obtained for the uppermost layer in which oxygen content tended to increase moving away from the side of the transparent substrate.

According to the aforementioned procedure, the phase-shift film 2 having a five-layer structure, composed of the high transmission layer 22, the low transmission layer 21, the high transmission layer 22, the low transmission layer 21 and the uppermost layer 23, was formed on the transparent substrate 1. When transmittance and phase difference were measured for this phase-shift film 2 at the wavelength of light of an ArF excimer laser (about 193 nm) with a phase shift measuring apparatus, transmittance was 5.91% and phase difference was 181.2 degrees.

Next, the light shielding film 3 of a chromium-based material composed of a three-layer structure was formed at a thickness of 48 nm on the phase-shift film 2 using the same procedure as that of Example 1-1. Continuing, the etching mask film composed of silicon and oxygen was formed at a thickness of 5 nm on the light shielding film 3 using the same procedure as that of Example 1-1. According to the aforementioned procedure, the mask blank 101 of Example 1-2 was manufactured provided with a structure obtained by laminating the phase-shift film 2 having a five-layer structure, the light shielding film 3 and the etching mask film 4 on the transparent substrate 1.

<<Manufacturing of Phase-Shift Mask>>

Next, the phase-shift mask 200 of Example 1-2 was fabricated according to the same procedure as Example 1-1 using this mask blank 101 of Example 1-2. When a mask pattern inspection was carried out with a mask inspection apparatus on the halftone phase-shift mask 200 fabricated in Example 1-2, it was confirmed that a fine pattern was formed within the acceptable range of the design value. Next, treatment was carried out on the phase-shift pattern of this halftone phase-shift mask 200 of Example 1-2 by irradiating with ArF excimer laser light at a cumulative dose of 20 kJ/cm². The change in CD of the phase-shift pattern before and after this radiation treatment was about 2 nm, and this amount of change in CD was within a usable range as a phase-shift mask.

A simulation of a transferred image was carried out on the halftone phase-shift mask 200 of Example 1-2 after undergoing radiation treatment with ArF excimer laser light when exposed and transferred to a resist film on a semiconductor device with exposure light having a wavelength of 193 nm using the AIMS193 (Carl Zeiss AG). When this simulated exposed and transferred image was verified, it was determined to adequately satisfy design specifications. On the basis of this result, even if the phase-shift mask of Example 1-2 is placed on the mask stage of an exposure apparatus after being irradiated with an ArF excimer laser at a cumulative dose of 20 kJ/cm² and then exposed and transferred to a resist film on a semiconductor device, it can be said that the circuit pattern ultimately formed on the semiconductor device can be formed with high precision.

Comparative Example 1-1

<<Manufacturing of Mask Blank>>

A transparent substrate composed of synthetic quartz glass, in which dimensions of the main surface were about 152 mm×about 152 mm and thickness was about 6.25 mm, was prepared using the same procedure as in the case of Example 1-1. Next, the transparent substrate was installed in a single-wafer DC sputtering apparatus, and a phase-shift film, composed of molybdenum, silicon and nitrogen, was formed at a thickness of 69 nm on the transparent substrate 1 by reactive sputtering (DC sputtering) using a mixed sintered target of molybdenum (Mo) and silicon (Si) (Mo: Si=12 at %:88 at %), and using a mixed gas of argon (Ar), nitrogen ($N_2$) and helium (He) (flow rate ratio Ar:$N_2$:He=8: 72:100, pressure=0.2 Pa) for the sputtering gas.

Next, heat treatment in air was carried out on the phase-shift film on the transparent substrate. This heat treatment was carried out for 1 hour at 450° C. When transmittance and phase difference were measured for this phase-shift film of Comparative Example 1-1, after heat treatment, at the wavelength of light of an ArF excimer laser (about 193 nm) with a phase shift measuring apparatus, transmittance was 6.02% and phase difference was 177.9 degrees.

Next, a light shielding film of a chromium-based material composed of a three-layer structure was formed at a total film thickness of 48 nm on the phase-shift film using the same procedure as Example 1-1. Continuing, an etching mask film composed of silicon and oxygen was formed at a thickness of 5 nm on the light shielding film using the same procedure as Example 1-1. According to the aforementioned procedure, the mask blank of Comparative Example 1-1 was manufactured provided with a structure obtained by laminating a phase-shift film composed of MoSiN, a light shielding film and an etching mask film on a transparent substrate.

<<Manufacturing of Phase-Shift Mask>>

Next, a phase-shift mask of Comparative Example 1-1 was fabricated according to the same procedure as Example 1-1 using this mask blank of Comparative Example 1-1. When a mask pattern inspection was carried out with a mask inspection apparatus on the halftone phase-shift mask fabricated in Comparative Example 1-1, it was confirmed that a fine pattern was formed within the acceptable range of the design value. Next, treatment was carried out on the phase-shift pattern of this halftone phase-shift mask of Comparative Example 1-1 by irradiating with ArF excimer laser light at a cumulative dose of 20 kJ/cm². The change in CD of the phase-shift pattern before and after this radiation treatment was not less than 20 nm, and this amount of change in CD exceeded the range that allows use as a phase-shift mask.

A simulation of a transferred image was carried out on the halftone phase-shift mask 200 of Comparative Example 1-1 after undergoing radiation treatment with ArF excimer laser light when exposed and transferred to a resist film on a semiconductor device with exposure light having a wavelength of 193 nm using the AIMS193 (Carl Zeiss AG). When this simulated exposed and transferred image was verified, it was unable to satisfy design specifications due to the effect of the change in CD of the phase-shift pattern. On the basis of this result, in the case the phase-shift mask of Comparative Example 1-1 is placed on the mask stage of an exposure apparatus after being irradiated with an ArF excimer laser at a cumulative dose of 20 kJ/cm² and exposed and transferred to a resist film on a semiconductor device, circuit pattern disconnections and short-circuits are expected to occur in a circuit pattern ultimately formed on the semiconductor device.

The following provides a more detailed explanation of the second embodiment of the present invention according to Examples 2-1 and 2-2 and Comparative Examples 2-1 and 2-2.

Example 2-1

<<Manufacturing of Mask Blank>>

Figure 5:
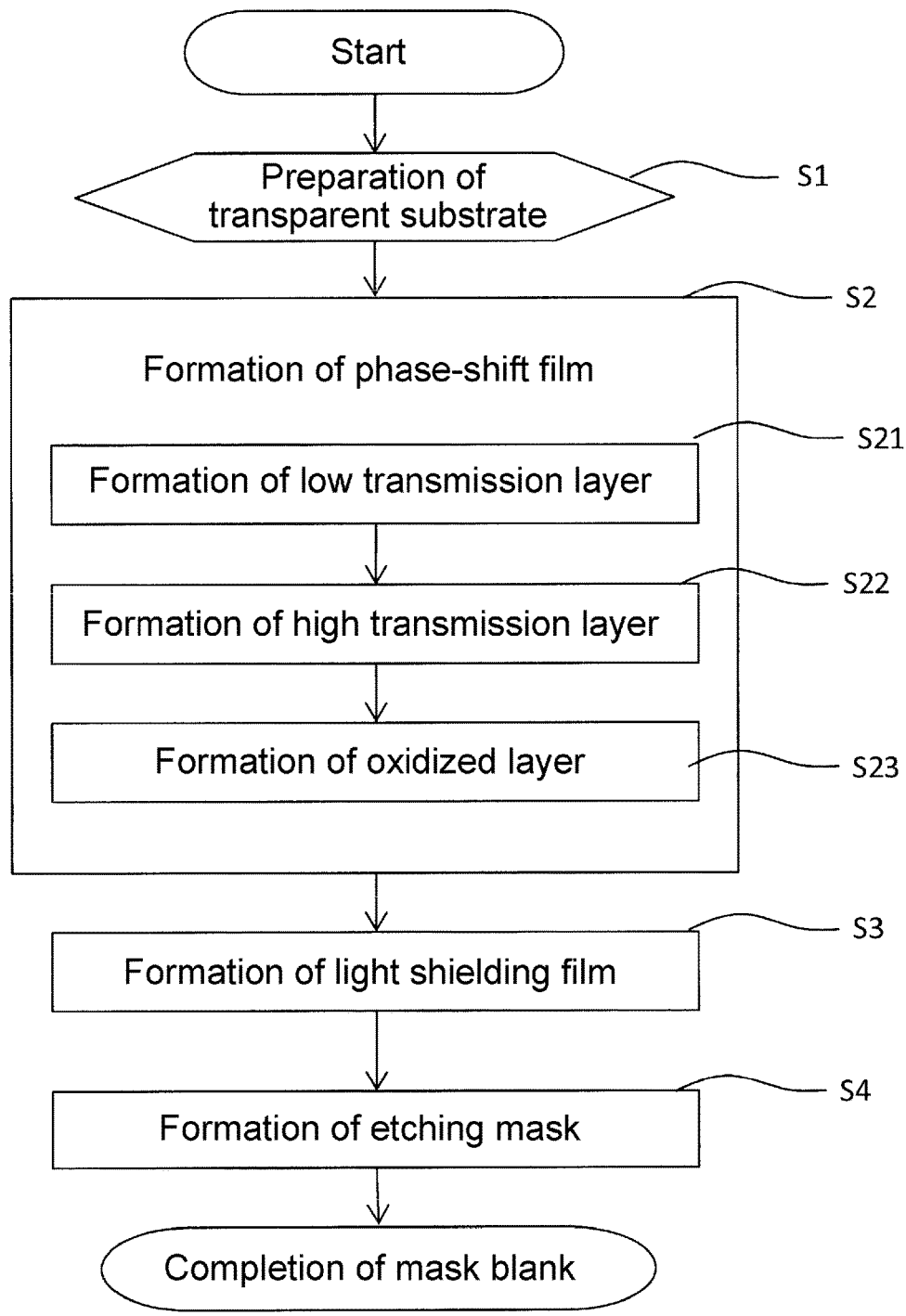
FIG. 5 is a flow chart showing a method for manufacturing a mask blank in a second embodiment.
Figure 6:
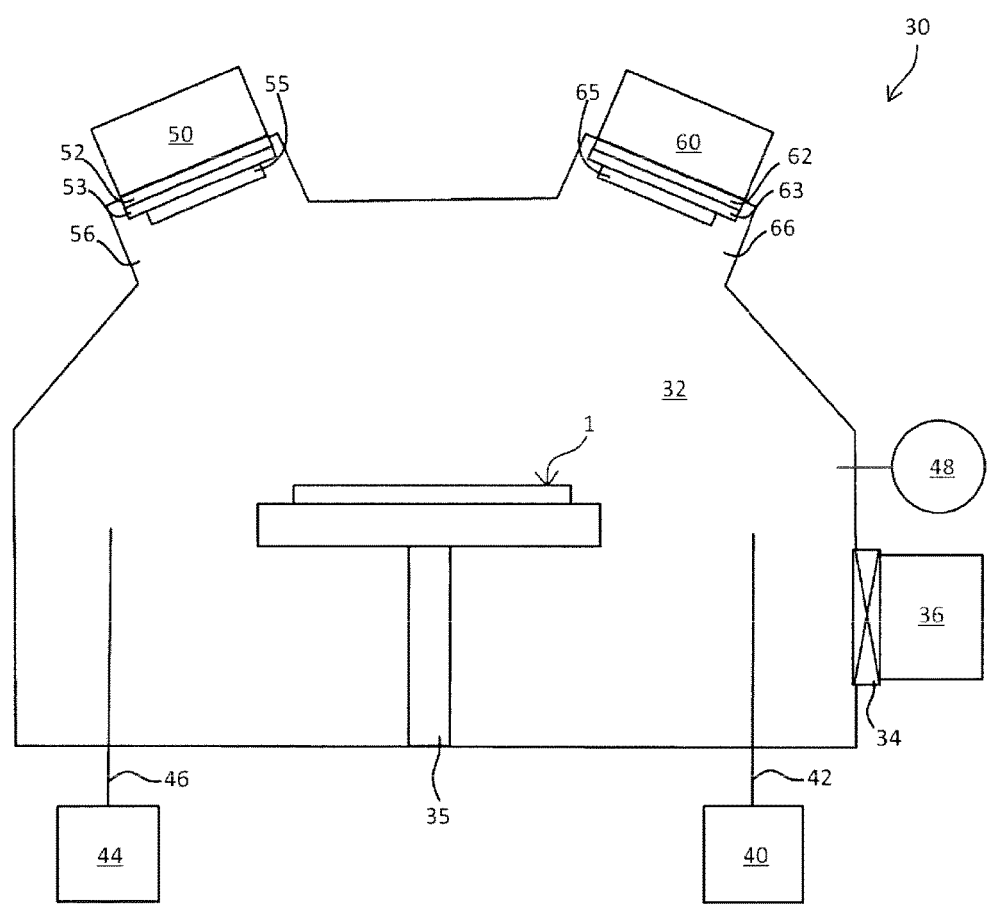
FIG. 6 is a schematic diagram showing one example of an RF sputtering apparatus used in a manufacturing method in a second embodiment.

The present invention is explained with reference to FIGS. 1, 5 and 6. FIG. 1 is a cross-sectional view showing the mask blank of the present Example. FIG. 5 is a flow chart showing the manufacturing process of the photomask blank of the present Example. FIG. 6 is a schematic diagram showing the configuration of an RF sputtering apparatus used to deposit a phase-shift film.

As shown in the flow chart of FIG. 5, the method for manufacturing the mask blank 100 of the present Example employs a procedure mainly consisting of preparation of a transparent substrate (S1), formation of a phase-shift film (S2), formation of a light shielding film (S3) and formation of an etching mask (S4). The step of forming a phase-shift film (S2) comprises steps for the formation of a low transmission layer (S21), formation of a high transmission layer (S22) and formation of an oxidized layer (S23). The following provides a detailed description of each step.

(Preparation of Transparent Substrate 1: Step S1)

First, the transparent substrate 1 used in the mask blank is prepared. A synthetic quartz glass substrate having surface dimensions of about 152 mm×about 152 mm and having a thickness of about 6.35 mm was prepared for use as the transparent substrate 1. This transparent substrate 1 was polished to a predetermined surface roughness for the edge faces and main surface followed by subjecting to predetermined cleaning treatment and drying treatment.

(Deposition of Phase-Shift Film: Step S2)

Next, deposition of the phase-shift film 2 was carried out (S2). The phase-shift film 2 was deposited using a single-wafer RF sputtering apparatus 30 shown in the schematic diagram of FIG. 6. An explanation is first provided of the single-wafer RF sputtering apparatus 30 with reference to FIG. 6.

The single-wafer RF sputtering apparatus 30 is provided with a vacuum chamber 32 where sputtering is carried out. The vacuum chamber 32 is connected to a vacuum pump 36 for evacuating the inside of the vacuum chamber 32 through a main valve 34.

The sputtering apparatus 30 is provided with an inert gas inlet line 42, which enables an inert gas to be introduced into the vacuum chamber 32, and a reactive gas inlet line 46, which enables a reactive gas to be introduced into the vacuum chamber 32. The inert gas inlet line 42 communicates with an inert gas supply source 40, and the reactive gas inlet line communicates with a reactive gas supply source 44. These inlet lines 42 and 46 are provided with mass flow controllers, various valves and the like (not shown) between these lines 42, 46 and the gas supply sources 40, 44. Furthermore, in the Example, the inert gas is argon and the reactive gas is nitrogen. In addition, pressure inside the vacuum chamber 32 is measured by a pressure gauge 48.

Inside the pressure chamber 32, two targets 55, 65, in which the surfaces of the target material are exposed, are held in target holders 52, 62 through backing plates 53, 63. In addition, a substrate holder 35 for holding a deposited surface of the transparent substrate 1 facing upward is provided at a predetermined position where sputtering particles emitted from the targets 55, 65 arrived at. The substrate holder 35 is connected to a rotating mechanism (not shown) and is configured so as to enable the deposited surface of the transparent substrate to rotate in the horizontal plane during sputtering.

The target 55 and the target 65 are provided above and on an angle with respect to the deposited surface of the transparent substrate 1. RF power supplies 52, 62, which apply electrical power for sputter discharge, are connected to the target holders 52, 62 through impedance matching transformers (not shown). Sputtering is carried out as a result of the formation of plasma when electrical power is applied to the targets 55, 65 from the power supplies 50 and 60. The target holders 52, 62 are insulated from the vacuum chamber 32 by insulators. The target holders 52, 62 are made of metal and serve as electrodes in the case electrical power is applied thereto.

The targets 55, 65 are composed of raw materials of a thin film formed on the substrate. In the present Example, the targets 55, 65 are both silicon targets. The target holders 52, 62 are placed in cylindrical chambers 56, 66 within the vacuum chamber 32. As a result of housing the target holders 52, 62 in these cylindrical chambers 56, 66, when sputtering is carried out using one of the targets 55, 65, sputtering particles are prevented from adhering to the other of the targets 55, 65.

Next, an explanation is provided of a specific method for manufacturing the phase-shift film 2.

(Formation of Low Transmission Layer 21: Step S21)

First, the transparent substrate 1 was installed on the substrate holder 35 in the single-wafer RF sputtering apparatus 30 with the surface facing upward, followed by deposition of the low transmission layer 21 (Step S21). The low transmission layer 21 was formed by RF sputtering using the silicon (Si) target 55. A mixed gas of an inert gas in the form of argon (Ar) gas and a reactive gas in the form of nitrogen ($N_2$) gas was used for the sputtering gas. The flow rate ratio and other deposition conditions that allowed stable deposition in the region of the metal mode were selected by preliminary verifying the relationship between deposition rate and flow rate ratio of $N_2$ gas in the mixed gas of Ar gas and $N_2$ gas in the sputtering gas in the RF sputtering apparatus 30. In the present Example, deposition was carried out at a flow rate ratio of the mixed gas of Ar:$N_2$=2:3 and a pressure within the vacuum chamber 32 of 0.035 Pa. The flow rate of the mixed gas was controlled with a mass flow controller provided in the inert gas inlet line 42 and a mass flow controller provided in the reactive gas inlet line 46. While in this state, discharge was initiated by applying electrical power of 2.8 kW from the RF power supply to the target 55 to form the low transmission layer 21 composed of silicon and nitrogen (Si:N=59 at %:41 at %) at a thickness of 12 nm on the transparent substrate 1.

When only the low transmission layer 21 was then formed on a main surface of a different transparent substrate under the same conditions and optical characteristics of the low transmission layer 21 were measured using a spectroscopic ellipsometer (M-2000D, J. A. Woollam Co., Inc.), refractive index n at a wavelength of 193 nm was 1.85 and extinction coefficient k was 1.70.

(Formation of High Transmission Layer 22: Step S22)

Next, the sputtering gas conditions in the vacuum chamber 32 were changed to the poison mode followed by formation of the high transmission layer 22 on the surface of the low transmission layer 21 (Step S22). Formation of the high transmission layer 22 was carried out continuously after formation of the low transmission layer 21. The high transmission layer 22 was formed by RF sputtering using the silicon (Si) target 65.

A mixed gas of an inert gas in the form of argon (Ar) gas and a reactive gas in the form of nitrogen ($N_2$) gas was used for the sputtering gas. The flow rate ratio and other deposition conditions that allowed stable deposition in the region of the poison mode were selected by preliminary verifying the relationship between deposition rate and flow rate ratio of $N_2$ gas in the mixed gas of Ar gas and $N_2$ gas in the sputtering gas in the RF sputtering apparatus 30. In the present Example, deposition was carried out at a flow rate ratio of the mixed gas of Ar:$N_2$=1:3 and a pressure within the vacuum chamber 32 of 0.090 Pa. The flow rate of the mixed gas was controlled with a mass flow controller provided in the inert gas inlet line 42 and a mass flow controller provided in the reactive gas inlet line 46. While in this state, discharge was initiated by applying electrical power of 2.8 kW from the RF power supply to the target 65 to form the high transmission layer 22 composed of silicon and nitrogen (Si:N=46 at %:54 at %) at a thickness of 55 nm on the transparent substrate 1.

When only the high transmission layer 22 was then formed on a main surface of a different transparent substrate under the same conditions and optical characteristics of the high transmission layer 22 were measured using a spectroscopic ellipsometer (M-2000D, J. A. Woollam Co., Inc.), refractive index n at a wavelength of 193 nm was 2.52 and extinction coefficient k was 0.39.

(Formation of Oxidized Layer 23: Step S23)

Next, the transparent substrate 1 laminated with the low transmission layer 21 and the high transmission layer 22 was installed in the vacuum chamber of a different RF sputtering apparatus from the single-wafer RF sputtering apparatus 30, and the oxidized layer (uppermost layer) 23, composed of silicon and oxygen, was formed at a thickness of 4 nm on the high transmission layer 22 by RF sputtering using a silicon dioxide ($SiO_2$) target, using argon (Ar) gas (pressure=0.03 Pa) for the sputtering gas, and setting the electrical power of the RF power supply to 1.5 kW. Furthermore, when only the oxidized layer 23 was then formed on a main surface of a different transparent substrate under the same conditions and optical characteristics of the oxidized layer 23 were measured using a spectroscopic ellipsometer (M-2000D, J. A.

Woollam Co., Inc.), refractive index n at a wavelength of 193 nm was 1.56 and extinction coefficient k was 0.00.

According to the aforementioned procedure, a phase-shift film 2, composed of the low transmission layer 21, the high transmission layer 22 and the oxidized layer 23, was formed on the transparent substrate 1. When transmittance and phase difference were measured for this phase-shift film 2 at the wavelength of light of an ArF excimer laser (about 193 nm) with a phase shift measuring apparatus, transmittance was 5.97% and phase difference was 177.7 degrees.

(Formation of Light Shielding Film: Step S3)

Next, the light shielding film 3, having a three-layer structure composed of a lowermost layer, lower layer and upper layer, was formed on the phase-shift film 2 according to the same procedure as that of Example 1-1.

(Formation of Etching Mask Film: Step S4)

Next, the etching mask film 4 was formed on the surface of the light shielding film 3 according to the same procedure as that of Example 1-1.

According to the aforementioned procedure, the mask blank 100 of Example 2-1 was manufactured provided with a structure obtained by laminating the phase-shift film 2, having a three-layer structure composed of the low transmission layer 21, the high transmission layer 22 and the oxidized layer 23, the light shielding film 3 and the etching mask film 4 on the transparent substrate 1.

<<Manufacturing of Phase-Shift Mask>>

The phase-shift mask 200 was fabricated according to the same procedure as that of Example 1-1 using this mask blank 100 of Example 2-1.

When a mask pattern inspection was carried out with a mask inspection apparatus on the halftone phase-shift mask 200 fabricated in Example 2-1, it was confirmed that a fine pattern corresponding to the DRAM hp32 nm generation was formed within the acceptable range of the design value. Next, treatment was carried out on the phase-shift pattern 2a of this halftone phase-shift mask 200 of Example 2-1 by irradiating with ArF excimer laser light at a cumulative dose of 20 kJ/cm². The change in CD of the phase-shift pattern 2a before and after this radiation treatment was about 2 nm, and this amount of change in CD was within a usable range as a phase-shift mask.

A simulation of a transferred image was carried out on the halftone phase-shift mask 200 of Example 2-1 after undergoing radiation treatment with ArF excimer laser light when exposed and transferred to a resist film on a semiconductor device with exposure light having a wavelength of 193 nm using the AIMS193 (Carl Zeiss AG). When this simulated exposed and transferred image was verified, it was determined to adequately satisfy design specifications. On the basis of this result, even if the phase-shift mask of Example 2-1 is placed on the mask stage of an exposure apparatus after being irradiated with an ArF excimer laser at a cumulative dose of 20 kJ/cm² and exposed and transferred to a resist film on a semiconductor device, it can be said that the circuit pattern ultimately formed on the semiconductor device can be formed with high precision.

Example 2-2

The following provides an explanation of the mask blank 101 of Example 2-2 with reference to FIG. 2. FIG. 2 is a schematic cross-sectional view showing the configuration of the mask blank 101 of the present Example. Furthermore, since Example 2-2 is the same as Example 2-1 with the exception of the configuration of the phase-shift film 2, duplicate explanations are omitted.

<<Manufacturing of Mask Blank>>

The same transparent substrate as Example 2-1 was prepared using the same procedure as that of Example 2-1. Next, the phase-shift film 2 was formed using the single-wafer RF sputtering apparatus 30. The single-wafer RF sputtering device 30 is the same as the apparatus used in Example 2-1 (see FIG. 6).

First, the transparent substrate 1 was installed in the RF sputtering apparatus 30 on the substrate holder 35 with the surface facing upward. Next, the high transmission layer 22 was formed at a film thickness of 18 nm under deposition conditions of the poison mode in the same manner as the high transmission layer 22 of Example 2-1. The optical characteristics of this high transmission layer 22 were the same as those of the high transmission layer 22 of Example 2-1 in that the refractive index n at a wavelength of 193 nm was 2.52 and the extinction coefficient was 0.39.

Next, the low transmission layer 21 was formed at a film thickness of 7 nm under deposition conditions of the metal mode in the same manner as the low transmission layer 21 of Example 2-1. The optical characteristics of this low transmission layer 21 were the same as those of the low transmission layer 21 of Example 2-1 in that the refractive index n at a wavelength of 193 nm was 1.85 and the extinction coefficient was 1.70.

Next, the high transmission layer 22 was formed at a film thickness of 18 nm under deposition conditions of the poison mode in the same manner as the high transmission layer 22 of Example 2-1. The optical characteristics of this high transmission layer 22 were the same as those of the high transmission layer 22 of the first layer.

Next, the low transmission layer 21 was formed at a film thickness of 7 nm under deposition conditions of the metal mode in the same manner as the low transmission layer 21 of Example 2-1. The optical characteristics of this low transmission layer 21 were the same as those of the low transmission layer 21 of the second layer.

Next, a silicon nitride layer was formed at a thickness of 18 nm under conditions of the poison mode in the same manner as the high transmission layer 22 of Example 2-1. Next, oxidation treatment using ozone was carried out on the uppermost side in the form of the silicon nitride layer to form the oxidized layer (uppermost layer) 23 on the surface layer.

According to the aforementioned procedure, a phase-shift film 2, having a five-layer structure composed of the high transmission layer 22, the low transmission layer 21, the high transmission layer 22, the low transmission layer 21 and the oxidized layer 23, was formed on the transparent substrate 1. When transmittance and phase difference were measured for this phase-shift film 2 at the wavelength of light of an ArF excimer laser (about 193 nm) with a phase shift measuring apparatus (capable of also measuring transmittance), transmittance was 5.91% and phase difference was 181.2 degrees.

Next, the light shielding film 3 of a chromium-based material composed of a three-layer structure was formed at a total film thickness of 48 nm on the phase-shift film 2 according to the same procedure as that of Example 1-1. Continuing, the etching mask film 4, composed of silicon and oxygen, was formed at a thickness of 5 nm on the light shielding film 3 according to the same procedure as that of Example 1-1. According to the aforementioned procedure, the mask blank 101 of Example 2-2 was manufactured provided with a structure obtained by laminating the phase-shift film 2 having a five-layer structure, the light shielding film 3 and the etching mask film 4 on the transparent substrate 1.

<<Manufacturing of Phase-Shift Mask>>

The phase-shift mask 200 of Example 2-2 was fabricated according to the same procedure as that of Example 1-1 using this mask blank 101 of Example 2-2. When a mask pattern inspection was carried out with a mask inspection apparatus on the halftone phase-shift mask 200 fabricated in Example 2-2, it was confirmed that a fine pattern was formed within the acceptable range of the design value. Next, treatment was carried out on the phase-shift pattern 2a of this halftone phase-shift mask 200 of Example 2-2 by irradiating with ArF excimer laser light at a cumulative dose of 20 kJ/cm$^2$. The change in CD of the phase-shift pattern 2a before and after this radiation treatment was about 2 nm, and this amount of change in CD was within a usable range as a phase-shift mask.

A simulation of a transferred image was carried out on the halftone phase-shift mask 200 of Example 2-2 after undergoing radiation treatment with ArF excimer laser light when exposed and transferred to a resist film on a semiconductor device with exposure light having a wavelength of 193 nm using the AIMS193 (Carl Zeiss AG). When this simulated exposed and transferred image was verified, it was determined to adequately satisfy design specifications. On the basis of this result, even if the phase-shift mask of Example 2-2 is placed on the mask stage of an exposure apparatus after being irradiated with an ArF excimer laser at a cumulative dose of 20 kJ/cm$^2$ and exposed and transferred to a resist film on a semiconductor device, it can be said that the circuit pattern ultimately formed on the semiconductor device can be formed with high precision.

Comparative Example 2-1

Next, in Comparative Example 2-1, a study was made of the case of depositing a halftone phase-shift film composed of a single layer of silicon nitride on a transparent substrate. The transparent substrate 1 and single-wafer RF sputtering apparatus 30 were the same as Example 2-1. The single-layer silicon nitride film was formed by RF sputtering using the silicon (Si) target 55. A mixed gas of an inert gas in the form of argon (Ar) gas and a reactive gas in the form of nitrogen (N$_2$) gas was used for the sputtering gas. Sputtering conditions were preliminarily examined for the relationship between deposition rate and the flow rate ratio of N$_2$ gas in the mixed gas of Ar gas and N$_2$ gas used for the sputtering gas with the RF sputtering apparatus. As a result, it was determined that, in order deposit a single-layer silicon nitride film having an extinction coefficient preferable for use as a single-layer halftone phase-shift film, the sputtering target is required to be deposited in the unstable "transition mode", thereby preventing stable deposition.

Comparative Example 2-2

Next, in Comparative Example 2-2, a study was made of the case of alternately depositing a film in the metal mode and poison mode using a single target. As a result, film defects were determined to increase due to the effects of particles generated when the target mode changed. More specifically, when poison mode deposition (state in which the target surface is bound to the reactive gas) and metal mode deposition (state in which the target surface is not bound to the reactive gas) are repeated using the same target, particles are generated when the target mode changes. As a specific example thereof, a target material bound to reactive gas during the poison mode is stripped when the mode changes to the metal modem, and this causes the generation of particles. In addition, when the same target is used, since it is necessary to re-condition the target when the reactive gas has been changed, particles may also be generated accompanying mechanical operation of a shielding plate and the like used during conditioning.

The following provides a more detailed explanation of the third embodiment of the present invention according to Example 3-1.

Example 3-1

<<Manufacturing of Mask Blank>>

The transparent substrate 301 composed of synthetic quartz glass was prepared in which dimensions of the main surface were about 152 mm×about 152 mm and thickness was about 6.35 mm. This transparent substrate 301 was polished to a predetermined surface roughness for the edge faces and main surface followed by subjecting to predetermined cleaning treatment and drying treatment, and had concave defects F at a plurality of locations and at a depth of not more than 40 nm.

Next, the transparent substrate 301 was placed on the rotating stage 531 in the deposition chamber 535 in the deposition apparatus 500 that uses oblique incidence rotary sputtering as explained using FIGS. 8 and 9. The sputtering target 533 in the form of a silicon (Si) target was attached to the backing plate 543. Furthermore, a deposition apparatus in which the target angle of inclination θ between the sputtered surface 533s of the sputtering target 533 and the main surface S of the transparent substrate 301 is 15 degrees, the offset distance Doff between the sputtering target 533 and the transparent substrate 301 is 340 mm, and the vertical distance (H) between the sputtering target 533 and the transparent substrate 301 is 280 mm, was used for the deposition apparatus 500.

Next, air inside the deposition chamber 533 was evacuated through the exhaust port 539 with a vacuum pump, and after the atmosphere inside the deposition chamber 533 had reached a degree of vacuum that does not affect the characteristics of the thin film formed, a mixed gas containing nitrogen was introduced from the gas inlet port 537 and deposition was carried out by sputtering by applying RF electrical power to the magnetron electrode 541 using an RF power supply (not shown). The RF power supply had an arc detection function and the discharge state was able to be monitored during sputtering. Pressure inside the deposition chamber 535 was measured with a pressure gauge (not shown).

The high transmission layer 322 (Si:N=46 at %:54 at %), composed of silicon and nitrogen, was then formed at a thickness of 55 nm on the main surface S of the transparent substrate 301 by reactive sputtering (RF sputtering) by using a mixed gas of argon (Ar) and nitrogen (N$_2$) (flow rate ratio Ar:N$_2$=1:3, pressure=0.09 Pa) for the sputtering gas and setting the electrical power of the RF power supply to 2.8 kW. When only the high transmission layer 322 was formed on a main surface of a different transparent substrate under the same conditions, and optical characteristics of this high transmission layer 322 were measured using a spectroscopic ellipsometer (M-2000D, J. A. Woollam Co., Inc.), refractive index n at a wavelength of 193 nm was 2.52 and extinction coefficient k was 0.39. Furthermore, conditions used when depositing this high transmission layer 322 were such that deposition conditions such as flow rate ratio were selected that allowed stable deposition in the reaction mode (poison mode) region by preliminarily verifying the relationship between deposition rate and flow rate ratio of $N_2$ gas in the mixed gas of Ar gas and $N_2$ gas used for the sputtering gas with the RF sputtering apparatus used. Furthermore, composition of the high transmission layer 322 was obtained by measuring by X-ray photoemission spectroscopy (XPS). The same applies to other films as well.

Next, the low transmission layer 321 (Si:N=59 at %:41 at %) was deposited at a thickness of 12 nm by reactive sputtering (RF sputtering) using a mixed gas of argon (Ar) and nitrogen ($N_2$) gas (flow rate ratio Ar:$N_2$=2:3, pressure=0.035 Pa) and setting the electrical power of the RF power supply to 2.8 kW in continuation from deposition of the high transmission layer 322. When only the low transmission layer 321 was formed under the same conditions on a main surface of a different transparent substrate and optical characteristics of this low transmission layer 321 were measured using a spectroscopic ellipsometer (M-2000D, J. A. Woollam Co., Inc.), refractive index n at a wavelength of 193 nm was 1.85 and extinction coefficient k was 1.70. Furthermore, conditions used when depositing this low transmission layer 321 were such that deposition conditions such as flow rate ratio were selected that allowed stable deposition in the metal mode region by preliminarily verifying the relationship between deposition rate and flow rate ratio of $N_2$ gas in a mixed gas of Ar gas and $N_2$ gas used for the sputtering gas with the RF sputtering apparatus used.

Next, the transparent substrate 301 laminated with the high transmission layer 322 and the low transmission layer 321 was placed on the rotating stage 531 in the deposition chamber 535 of the same deposition apparatus 500. The sputtering target 533 in the form of a silicon oxide ($SiO_2$) target was attached to the backing plate 543. The uppermost layer 323, composed of silicon and oxygen, was then formed at a thickness of 4 nm on the low transmission layer 321 by RF sputtering using argon (Ar) gas (pressure=0.03 Pa) for the sputtering gas and setting the electrical power of the RF power supply to 1.5 kW. Furthermore, when only the uppermost layer 323 was formed under the same conditions on a main surface of a different transparent substrate and optical characteristics of this uppermost layer 323 were measured using a spectroscopic ellipsometer (M-2000D, J. A. Woollam Co., Inc.), refractive index n at a wavelength of 193 nm was 1.56 and extinction coefficient k was 0.00.

According to the aforementioned procedure, the phase-shift film 320, composed of the high transmission layer 322, the low transmission layer 321 and the uppermost layer 323, was formed on the transparent substrate 301. When transmittance and phase difference were measured for this phase-shift film 320 at the wavelength of light of an ArF excimer laser (about 193 nm) with a phase shift measuring apparatus, transmittance was 5.97% and phase difference was 177.7 degrees.

Next, the light shielding film 303 of a chromium-based material composed of three layers was formed at a total film thickness of 48 nm on the phase-shift film 320 according to the same procedure as that of Example 1-1. Continuing, the etching mask film 304, composed of silicon and oxygen, was formed at a thickness of 5 nm on the light shielding film 303 according to the same procedure as that of Example 1-1. Next, the surface of the etching mask film 304 was subjected to HMDS treatment. Continuing, the resist film 305, composed of a chemically amplified resist for electron beam drawing, was formed at a film thickness of 80 nm in contact with the surface of the etching mask film 304 by spin coating. According to the aforementioned procedure, the mask blank 300 of Example 3-1 was manufactured provided with a structure obtained by laminating the phase-shift film 320 having a three-layer structure, the light shielding film 303, the etching mask film 304 and the resist film 305 on the transparent substrate 301.

<<Manufacturing of Phase-Shift Mask>>

The phase-shift mask 600 of Example 3-1 was fabricated according to the same procedure as that of Example 1-1 using the mask blank 300 fabricated in the Example 3-1. However, differing from the case of Example 1-1, a pattern design was employed in which, when drawing and exposing a phase-shift pattern to be formed on the phase-shift film 320 in the form of a first pattern on the resist film 305, a concave defect F of the transparent substrate 301 was covered with the first resist pattern that does not utilize phase shift.

When a mask pattern inspection was carried out with a mask inspection apparatus on the halftone phase-shift mask 600 fabricated in Example 3-1, it was confirmed that a fine pattern was formed within the acceptable range of the design value. Next, treatment was carried out on the phase-shift pattern of this halftone phase-shift mask 600 of Example 3-1 by irradiating with ArF excimer laser light at a cumulative dose of 20 kJ/$cm^2$. The change in CD of the phase-shift pattern before and after this radiation treatment was about 2 nm, and this amount of change in CD was within a usable range as a phase-shift mask.

A simulation of a transferred image was carried out on the halftone phase-shift mask 600 of Example 3-1 after undergoing radiation treatment with ArF excimer laser light when exposed and transferred to a resist film on a semiconductor device with exposure light having a wavelength of 193 nm using the AIMS193 (Carl Zeiss AG). When this simulated exposed and transferred image was verified, it was determined to adequately satisfy design specifications. On the basis of this result, even if exposed and transferred to a resist film on a substrate in the manufacturing process of a semiconductor device, it can be said that the circuit pattern ultimately formed on the semiconductor device can be formed with high precision even if the concave defect F is present on the main surface S of the transparent substrate 301 as a result of employing a configuration in which it is covered with the transfer pattern 320a composed of the large-area phase-shift film 320 that does not utilize phase shift.

Although the preceding description has provided a detailed explanation of specific examples of the present invention, these examples are merely intended to be exemplary and do not limit the scope of claim for patent. Various variations and modifications of the previously exemplified specific examples are included in the art described in the scope of claim for patent. One example thereof is an etching stopper film formed between a transparent substrate and a phase-shift film. An etching stopper film is a film composed of material that has etching selectivity for both the transparent substrate and the phase-shift film. In terms of the configurations of the aforementioned examples, a material containing chromium, such as Cr, CrN, CrC, CrO, CrON and CrC, is suitable for the etching mask film.

Technical elements explained in the present description or drawings demonstrate technical usefulness either alone or by combining various types thereof, and are not limited to the combinations described in the claims at the time of filing. In addition, the technology exemplified in the present description or drawings is able to achieve a plurality of objects simultaneously, and the achievement per se of one of those objects has technical usefulness.

BRIEF DESCRIPTION OF THE REFERENCE SYMBOLS 1, 301 Transparent substrate
2, 320 Phase-shift film
2a Phase-shift pattern
3, 303 Light shielding film
3a, 3b Light shielding pattern
4, 304 Etching mask film
4a Etching mask pattern
5a First resist pattern
6b Second resist pattern
21, 321 Low transmission layer
22, 322 High transmission layer
23, 323 Uppermost layer (oxidized layer)
30 Single-wafer RF sputtering apparatus
32 Vacuum chamber
34 Main valve
35 Substrate holder
36 Vacuum pump
40 Inert gas supply source
44 Reactive gas supply source
48 Pressure gauge
50, 60 RF power supply
52, 62 Target holder
53, 63 Backing plate
55, 65 Target
56, 66 Cylindrical chamber
100, 101, 300 Mask blank
200 Transfer mask
303a Pattern formation region
303b Outer peripheral region
320a Transfer pattern composed of large-area phase-shift film
350 Transfer pattern
500 Deposition apparatus
531 Rotating stage
533 Sputtering target
533s Sputtered surface
535 Deposition chamber
537 Gas inlet port
539 Exhaust port
541 Magnetron electrode
543 Backing plate
600 Phase-shift mask
D Low-density region
F Concave defect
S Main surface

The invention claimed is:

1. A mask blank in which a phase-shift film is provided on a transparent substrate; wherein,
the phase-shift film having a function to transmit ArF exposure light therethrough at a transmittance within the range of 1% to 30% and a function to generate an amount of phase shift within the range of 170 degrees to 190 degrees between the ArF exposure light that has transmitted through the phase-shift film and the ArF exposure light that has transmitted through air over the same distance as the thickness of the phase-shift film,
the phase-shift film is formed from a material consisting of silicon and nitrogen or a material consisting of silicon, nitrogen and one or more elements selected from semi-metallic elements, non-metallic elements and noble gas,
the phase-shift film comprises a structure in which a first silicon-containing layer and a second silicon-containing layer are laminated,
the first silicon-containing layer and the second silicon-containing layer have nitrogen, and
the first silicon-containing layer has a relatively low nitrogen content in comparison with the second silicon-containing layer.

2. The mask blank according to claim 1, wherein the first silicon-containing layer is formed from a material having a refractive index n of less than 2.5 and the extinction coefficient k of not less than 1.0 with respect to ArF exposure light, and the second silicon-containing layer is formed from a material having a refractive index n of not less than 2.5 and the extinction coefficient of less than 1.0 with respect to ArF exposure light.

3. The mask blank according to claim 1, wherein the thickness of the second silicon-containing layer is more than the thickness of the first silicon-containing layer.

4. The mask blank according to claim 1, wherein the first silicon-containing layer and the second silicon-containing layer are composed of the same constituent elements.

5. The mask blank according to claim 1, wherein the oxygen content of the first silicon-containing layer and the second silicon-containing layer is not more than 10 at %.

6. The mask blank according to claim 1, wherein the first silicon-containing layer and the second silicon-containing layer are formed from a material consisting of silicon and nitrogen.

7. The mask blank according to claim 1, wherein the phase-shift film has two or more sets of a laminated structure composed of one layer of the first silicon-containing layer and one layer of the second silicon-containing layer.

8. The mask blank according to claim 1, wherein the phase-shift film has a structure in which the first silicon-containing layer and the second silicon-containing layer are laminated in that order in contact with the transparent substrate.

9. The mask blank according to claim 1, wherein the thickness of a single layer of each of the first silicon-containing layer and the second silicon-containing layer is not more than 20 nm.

10. The mask blank according to claim 1, wherein the phase-shift film is provided with an uppermost layer formed at a position farthest away from the transparent substrate, and the uppermost layer is formed from a material consisting of silicon, nitrogen and oxygen, or a material consisting of silicon, nitrogen, oxygen and one or more elements selected from semi-metallic elements, non-metallic elements and noble gases.

11. The mask blank according to claim 10, wherein the uppermost layer is formed from a material consisting of silicon, nitrogen and oxygen.

12. A phase-shift mask in which a transfer pattern is provided as the transfer pattern of the phase-shift film of the mask blank according to claim 1.

13. A method for manufacturing a semiconductor device, the method comprising exposing and transferring the transfer pattern to a resist film on a semiconductor substrate using the phase-shift mask according to claim 12.

\* \* \* \* \*